US012087762B2

(12) United States Patent
Shibata et al.

(10) Patent No.: US 12,087,762 B2
(45) Date of Patent: Sep. 10, 2024

(54) NITRIDE SEMICONDUCTOR DEVICE

(71) Applicant: PANASONIC CORPORATION, Osaka (JP)

(72) Inventors: Daisuke Shibata, Kyoto (JP); Satoshi Tamura, Osaka (JP); Masahiro Ogawa, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 915 days.

(21) Appl. No.: 17/259,505

(22) PCT Filed: Jul. 11, 2019

(86) PCT No.: PCT/JP2019/027605
§ 371 (c)(1),
(2) Date: Jan. 11, 2021

(87) PCT Pub. No.: WO2020/017437
PCT Pub. Date: Jan. 23, 2020

(65) Prior Publication Data
US 2021/0167061 A1  Jun. 3, 2021

(30) Foreign Application Priority Data

Jul. 17, 2018  (JP) .................................. 2018-134461
Jul. 27, 2018  (JP) .................................. 2018-141737
Aug. 30, 2018 (JP) .................................. 2018-161232

(51) Int. Cl.
*H01L 29/778* (2006.01)
*H01L 21/265* (2006.01)
(Continued)

(52) U.S. Cl.
CPC .... *H01L 27/0605* (2013.01); *H01L 21/26546* (2013.01); *H01L 21/266* (2013.01);
(Continued)

(58) Field of Classification Search
CPC ............. H01L 29/7786; H01L 29/7787; H01L 29/7788
See application file for complete search history.

(56) References Cited

U.S. PATENT DOCUMENTS

2012/0181548 A1    7/2012  Okada et al.
2013/0168739 A1*   7/2013  Kiyama ............... H01L 29/778
                                                257/194
(Continued)

FOREIGN PATENT DOCUMENTS

JP   2011-082397 A   4/2011
JP      5569321 B2   8/2014
WO   2016/147541 A1  9/2016

OTHER PUBLICATIONS

International Search Report and Written Opinion issued on Oct. 15, 2019 in International Patent Application No. PCT/JP2019/027605; with partial English translation.

*Primary Examiner* — Grant S Withers
(74) *Attorney, Agent, or Firm* — Rimon P.C.

(57) ABSTRACT

Nitride semiconductor device includes: a substrate; a first nitride semiconductor layer of a first conductivity above the substrate; a second nitride semiconductor layer of a second conductivity different from the first conductivity, above the first nitride semiconductor layer; a first opening penetrating through the second nitride semiconductor layer; an electron transport layer and an electron supply layer disposed along inner surfaces of the first opening, in stated sequence from the substrate-side; a gate electrode above the electron supply layer, covering the first opening; a source electrode connected to the electron supply layer and the electron transport layer, at a position separated from the gate electrode; and a drain electrode on a surface of the substrate opposite to a surface on which the first nitride semiconductor layer is disposed. At least part of the second nitride semiconductor
(Continued)

layer is fixed to a potential different from a potential of the source electrode.

21 Claims, 29 Drawing Sheets

(51) Int. Cl.
| | |
|---|---|
| *H01L 21/266* | (2006.01) |
| *H01L 21/306* | (2006.01) |
| *H01L 21/308* | (2006.01) |
| *H01L 21/8252* | (2006.01) |
| *H01L 27/06* | (2006.01) |
| *H01L 29/20* | (2006.01) |
| *H01L 29/205* | (2006.01) |
| *H01L 29/66* | (2006.01) |
| *H01L 29/872* | (2006.01) |

(52) U.S. Cl.
CPC ...... *H01L 21/30621* (2013.01); *H01L 21/308* (2013.01); *H01L 21/8252* (2013.01); *H01L 27/0629* (2013.01); *H01L 29/2003* (2013.01); *H01L 29/205* (2013.01); *H01L 29/66212* (2013.01); *H01L 29/66462* (2013.01); *H01L 29/7788* (2013.01); *H01L 29/872* (2013.01)

(56) References Cited

U.S. PATENT DOCUMENTS

2017/0373200 A1    12/2017  Shibata et al.
2021/0005742 A1*    1/2021  Ujita ..................... H01L 29/205

* cited by examiner

NITRIDE SEMICONDUCTOR DEVICE

CROSS-REFERENCE OF RELATED APPLICATIONS

This application is the U.S. National Phase under 35 U.S.C. § 371 of International Patent Application No. PCT/JP2019/027605, filed on Jul. 11, 2019, which in turn claims the benefit of Japanese Application No. 2018-134461, filed on Jul. 17, 2018, Japanese Application No. 2018-141737, filed on Jul. 27, 2018, and Japanese Application No. 2018-161232, filed on Aug. 30, 2018, the entire disclosures of which Applications are incorporated by reference herein.

TECHNICAL FIELD

The present disclosure relates to a nitride semiconductor device.

BACKGROUND ART

Nitride semiconductors represented by gallium nitride (GaN) and aluminum nitride (AlN) are wide gap semiconductors with a large band gap, have a high dielectric breakdown electric field, and have a feature that the saturation drift velocity of electrons is higher compared to that of gallium arsenide (GaAs) semiconductors or silicon (Si) semiconductors. Therefore, research and development of power transistors using a nitride semiconductor which is advantageous in achieving a high output and a high breakdown voltage, is underway.

For example, PTL 1 discloses a vertical semiconductor device including a GaN-based laminate. The semiconductor device disclosed in PTL 1 is a vertical field effect transistor (FET) that has a re-growth layer including a channel located so as to cover a wall surface of an opening disposed in the GaN-based laminate. The channel is formed by a 2-dimensional electron gas (2DEG) generated in the re-growth layer. Accordingly, an FET with a high mobility and a low on-resistance is realized.

CITATION LIST

Patent Literature

PTL 1: Japanese Patent No. 5569321

SUMMARY OF THE INVENTION

Technical Problem

However, in the above-described conventional semiconductor devices, there is a problem of not being able to achieve both a high breakdown voltage and a high current operation.

Therefore, the present disclosure provides a nitride semiconductor device capable of achieving a high breakdown voltage and a high current operation.

Solution to Problem

In order to solve above-described problem, a nitride semiconductor device according to an aspect of the present disclosure includes: a substrate; a first nitride semiconductor layer of a first conductivity disposed above the substrate; a second nitride semiconductor layer of a second conductivity different from the first conductivity, disposed above the first nitride semiconductor layer; a first opening penetrating through the second nitride semiconductor layer; an electron transport layer and an electron supply layer disposed along inner surfaces of the first opening, in stated sequence from a substrate-side; a gate electrode disposed above the electron supply layer to cover the first opening; a source electrode connected to the electron supply layer and the electron transport layer, at a position separated from the gate electrode; and a drain electrode disposed on a surface of the substrate which is opposite to a surface on which the first nitride semiconductor layer is disposed, wherein at least part of the second nitride semiconductor layer is fixed to a potential that is different from a potential applied to the source electrode.

Advantageous Effect of Invention

According to the present disclosure, a nitride semiconductor device capable of achieving a high breakdown voltage and a high current operation can be provided.

Figure 1:
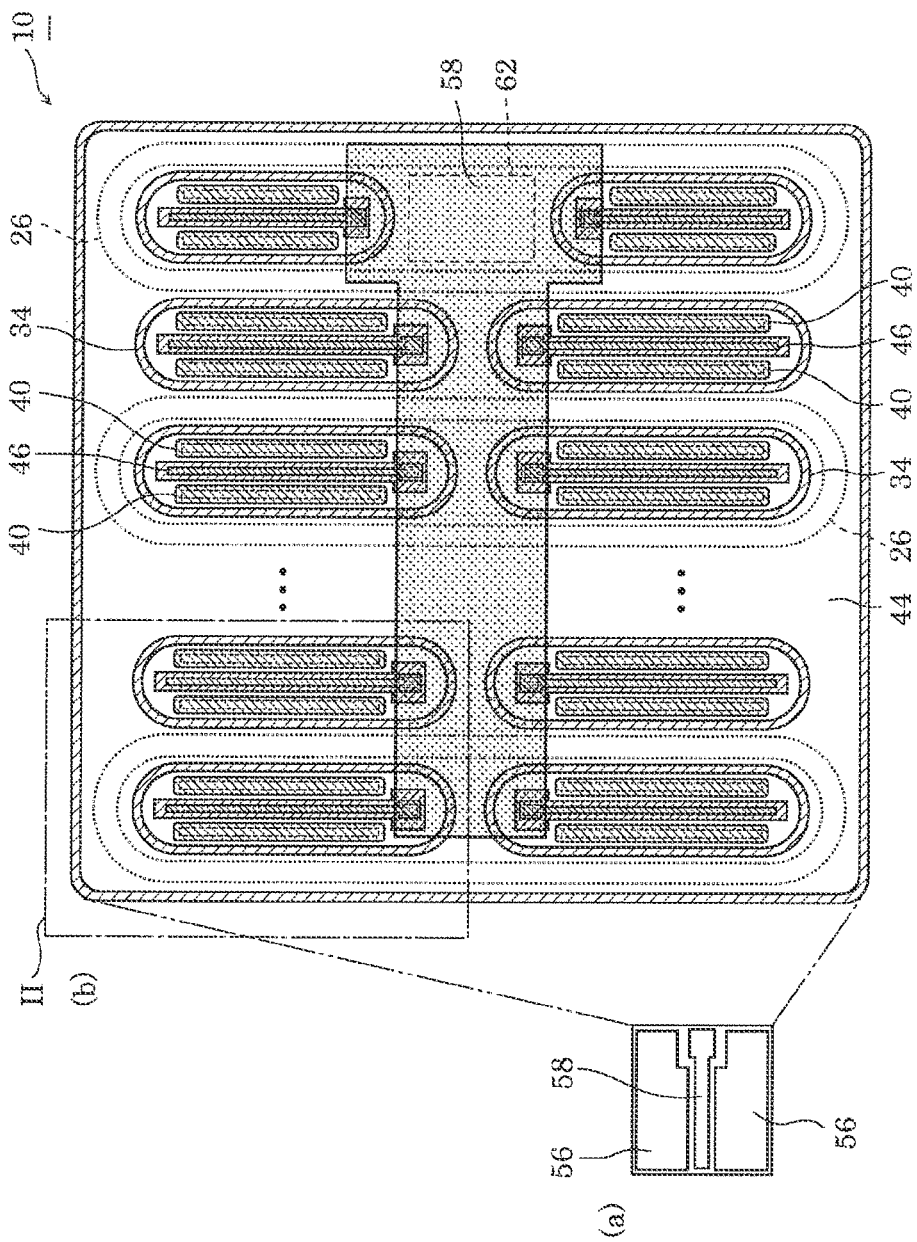
FIG. 1 is a diagram illustrating a plane layout of a nitride semiconductor device according to Embodiment 1.

DESCRIPTION OF EXEMPLARY EMBODIMENTS (Outline of the Present Disclosure)

In order to solve above-described problem, a nitride semiconductor device according to an aspect of the present disclosure includes: a substrate; a first nitride semiconductor layer of a first conductivity disposed above the substrate; a second nitride semiconductor layer of a second conductivity different from the first conductivity, disposed above the first nitride semiconductor layer; a first opening penetrating through the second nitride semiconductor layer; an electron transport layer and an electron supply layer disposed along inner surfaces of the first opening, in stated sequence from a substrate-side; a gate electrode disposed above the electron supply layer to cover the first opening; a source electrode connected to the electron supply layer and the electron transport layer, at a position separated from the gate electrode; and a drain electrode disposed on a surface of the substrate which is opposite to a surface on which the first nitride semiconductor layer is disposed, wherein at least part of the second nitride semiconductor layer is fixed to a potential that is different from a potential applied to the source electrode.

Accordingly, a nitride semiconductor device capable of achieving a high breakdown voltage and a high current operation can be realized.

Furthermore, for example, a nitride semiconductor device according to an aspect of the present disclosure includes: a substrate; a first nitride semiconductor layer disposed above the substrate; a second nitride semiconductor layer of a p-type, disposed above the first nitride semiconductor layer; a first high-resistance layer disposed above the second nitride semiconductor layer; a first opening penetrating through the first high-resistance layer and the second nitride semiconductor layer, and reaching up to the first nitride semiconductor layer; an electron transport layer and an electron supply layer disposed along inner surfaces of the first opening, in stated sequence from a substrate-side; a gate electrode disposed above the electron supply layer to cover the first opening; a source electrode connected to the electron supply layer and the electron transport layer, at a position separated from the gate electrode; and a drain electrode disposed on a surface of the substrate which is opposite to a surface on which the first nitride semiconductor layer is disposed, wherein the second nitride semiconductor layer is fixed to a same potential as the source electrode.

Accordingly, since the p-type second nitride semiconductor layer is fixed to the same potential as the potential of the gate electrode, when the nitride semiconductor device is in a turn-off state, a depletion layer spreads from the interface between the second nitride semiconductor layer and the first nitride semiconductor layer to the first nitride semiconductor side, and the breakdown voltage is increased. Additionally, since the channel in the electron transport layer is narrowed by the depletion layer that spreads into the electron transport layer from the second nitride semiconductor layer, a leakage current is suppressed. Further, when the nitride semiconductor device is in a turn-on state, the depletion layer that has spread from the second nitride semiconductor layer into the electron transport layer shrinks. Therefore, the narrowing of the channel is suppressed, and a high current can be passed. In this manner, according to the present aspect, a nitride semiconductor device capable of achieving a high breakdown voltage and a high current operation is realized.

Furthermore, for example, the nitride semiconductor device according to an aspect of the present disclosure may further include: a second opening penetrating through the electron supply layer, the electron transport layer, and the first high-resistance layer, and reaching up to the second nitride semiconductor layer; and a fixed-potential electrode provided in a bottom surface of the second opening and contacting the second nitride semiconductor layer, wherein the fixed-potential electrode may be electrically connected to the gate electrode.

Accordingly since the fixed-potential electrode electrically connected to the gate electrode is provided, the potential of the second nitride semiconductor layer can be strongly fixed to the gate potential.

Furthermore, for example, the nitride semiconductor device according to an aspect of the present disclosure may further include a third opening penetrating through the electron supply layer and reaching up to the electron transport layer, wherein the source electrode may be provided along part of inner surfaces of the third opening, and in a plan view of the substrate, the second opening may be disposed at a position separated from the source electrode, inside the third opening.

Accordingly, since the contact between the source electrode and the fixed-potential electrode can be suppressed, it is possible to suppress a leakage current from occurring between the gate and the source. Therefore, a highly efficient nitride semiconductor device is realized.

Furthermore, for example, the nitride semiconductor device according to an aspect of the present disclosure may further include a third nitride semiconductor layer of the p-type disposed between the gate electrode and the electron supply layer.

Accordingly, since the potential of the channel occurring in the vicinity of the interface between the electron transport layer and the electron supply layer can be increased, the nitride semiconductor device can be realized as a normally-off type FET.

Furthermore, for example, the nitride semiconductor device according to an aspect of the present disclosure may further include a second high-resistance layer disposed between the first nitride semiconductor layer and the second nitride semiconductor layer.

Accordingly, when the nitride semiconductor device is in the turn-on state, the current flowing from the second nitride semiconductor layer toward the drain electrode can be suppressed by the high-resistance layer. Therefore, since a leakage current can be suppressed, a highly efficient nitride semiconductor device is realized.

Furthermore, for example, the electron transport layer may include a flat portion disposed on a top surface of the first high-resistance layer; and a sloped portion disposed along a side surface of the first opening, wherein the sloped portion may have a length in a direction parallel to the substrate longer than a length of the flat portion in a normal direction of the substrate.

Accordingly, since the thickness of the sloped portion can be increased, the narrowing of the channel by the depletion layer can be suppressed, and a high current can be passed.

Note that, in a vertical FET, since it is possible to make the entire drift layer serve as a current path, the vertical FET is suitable for a high current operation. In the vertical FET, the breakdown voltage can be increased by connecting the block layer to the source electrode to fix the potential of the block layer to the source potential (generally 0 V). However, in this case, there is a problem in that, although stable turn-off characteristics can be obtained at the time of turn-off, at the time of turn-on, the current path becomes narrow due to the narrowing of the channel by the depletion layer extending from the block layer, and a drain current becomes low.

Furthermore, in order to solve the above-described problem, a nitride semiconductor device according to an aspect of the present disclosure includes: a substrate; a first nitride semiconductor layer disposed above the substrate; a second nitride semiconductor layer of a p-type, disposed above the first nitride semiconductor layer; a first opening penetrating through the second nitride semiconductor layer, and reaching up to the first nitride semiconductor layer; an electron transport layer and an electron supply layer disposed along inner surfaces of the first opening, in stated sequence from a substrate-side; a second opening at a position separated from the first opening, penetrating through the electron supply layer and the electron transport layer, and reaching up to the second nitride semiconductor layer; a high-resistance layer separating the second nitride semiconductor layer into a first portion near the first opening and a second portion near the second opening; a gate electrode disposed above the electron supply layer to cover the first opening; a source electrode disposed in the second opening and connected to the electron transport layer and the electron supply layer; and a drain electrode disposed on a surface of the substrate which is opposite to a surface on which the first nitride semiconductor layer is disposed, wherein the second portion is fixed to a potential that is the same as a potential applied to the source electrode, and the first portion is fixed to a potential that is different from the potential applied to the source electrode.

Accordingly, since the second nitride semiconductor layer is separated into the first portion near the first opening and the second portion near the second opening by the high-resistance layer, the both are electrically insulated. Therefore, the second portion is fixed to the potential (hereinafter, the source potential) that is the same as the potential applied to the source electrode, and the first portion can be fixed to the potential that is different from the source potential.

Since the potential of the second nitride semiconductor layer is fixed, when the nitride semiconductor device is in the turn-off state, the depletion layer spreads from the interface between the second nitride semiconductor layer and the first nitride semiconductor layer to the first nitride semiconductor side, and the breakdown voltage is increased. Additionally, when the nitride semiconductor device is in the turn-off state, since the channel in the electron transport layer is narrowed by the depletion layer that spreads into the electron transport layer from the first portion, a leakage current is suppressed.

Additionally, when the nitride semiconductor device is in the turn-on state, the depletion layer that has spread into the electron transport layer from the first portion shrinks. Therefore, the narrowing of the channel is suppressed, and a high current can be passed. In this manner, according to the present aspect, a nitride semiconductor device capable of achieving a high breakdown voltage and a high current operation is realized.

Furthermore, for example, the high-resistance layer may be a nitride semiconductor layer containing iron.

Accordingly, since the resistance of the high-resistance layer can be made high by including iron in the nitride semiconductor, the second nitride semiconductor layer can be electrically separated into the first portion and the second portion easily. Additionally, the high-resistance layer can be easily formed in a desired area in a desired shape by ion implantation, etc. For example, according to ion implantation, the crystal of a nitride semiconductor in an area where iron ions have been implanted can be destroyed, and the resistance of the area can be increased.

Furthermore, for example, the first portion may be fixed to a potential that is same as a potential applied to the gate electrode.

Accordingly, since the potential of the first portion is fixed to the potential (hereinafter, the gate potential) that is the same as the potential applied the gate electrode, it becomes possible to suppress the spreading of the depletion layer extending into the electron transport layer from the first portion. Therefore, a higher current can be easily achieved in the nitride semiconductor device.

Furthermore, for example, the nitride semiconductor device according to an aspect of the present disclosure may further include a third nitride semiconductor layer of the second conductivity disposed between the gate electrode and the electron supply layer.

Accordingly the carrier concentration directly under the gate electrode can be reduced by the third nitride semiconductor layer, and the threshold voltage of the nitride semiconductor device can be shifted to the positive side. Therefore, the nitride semiconductor device according to the present aspect can be realized as a normally-off type FET.

Furthermore, for example, the nitride semiconductor device according to an aspect of the present disclosure may further include a third opening provided in a bottom surface of the second opening, penetrating through the second nitride semiconductor layer, and reaching up to the first nitride semiconductor layer, wherein the source electrode is further disposed in the third opening and is connected to the first nitride semiconductor layer.

Accordingly an MPS (Merged PiN Schottky) diode is formed that includes a pn diode formed by the first nitride semiconductor layer and the second nitride semiconductor layer, and a Schottky barrier diode formed by the source electrode and the first nitride semiconductor layer at the bottom of the third opening. Therefore, the loss due to a reflux current that flows through the MPS diode when a reverse bias is applied can be made small.

Furthermore, for example, the third opening may comprise a plurality of third openings provided in the bottom surface of the second opening.

Accordingly, the MPS diode will have a configuration in which a plurality of pn diodes and Schottky barrier diodes are discretely arranged. Therefore, it is possible to increase the spreading of the depletion layer into the first nitride semiconductor layer from the second nitride semiconductor layer at the time when a reverse bias is applied to the MPS diode, and a further higher breakdown voltage can be achieved.

Furthermore, for example, a nitride semiconductor device according to an aspect of the present disclosure includes: a substrate; a first nitride semiconductor layer of a first conductivity disposed above the substrate; a fourth nitride semiconductor layer of a second conductivity different from the first conductivity disposed above the first nitride semiconductor layer, and including a fourth opening exposing part of the first nitride semiconductor layer; a fifth nitride semiconductor layer of the first conductivity disposed above the fourth nitride semiconductor layer and along inner surfaces of the fourth opening; a second nitride semiconductor layer disposed above the fifth nitride semiconductor layer and including a first opening exposing part of the fifth nitride semiconductor layer; a sixth nitride semiconductor layer disposed along inner surfaces of the first opening; a gate electrode disposed above the sixth nitride semiconductor layer to cover the first opening; a source electrode electrically connected to the sixth nitride semiconductor layer, at a position separated from the gate electrode; and a drain electrode disposed on a surface of the substrate which is opposite to a surface on which the first nitride semiconductor layer is disposed, wherein the fourth nitride semiconductor layer is fixed to a potential that is same as the potential applied t the source electrode, and the second nitride semiconductor layer is fixed to a potential that is same as a potential applied to the gate electrode.

Accordingly, since the potential of the second nitride semiconductor layer is fixed to the same potential as the potential applied to the gate electrode, when the nitride semiconductor device is in the turn-off state, the channel in the electron transport layer is narrowed by the depletion layer spreading into the electron transport layer from the second nitride semiconductor layer. Therefore, a leakage current is suppressed, and good turn-off characteristics can be obtained. Additionally, when the nitride semiconductor device is in the turn-on state, the depletion layer that has spread into the electron transport layer from the second nitride semiconductor layer shrinks. Therefore, the narrowing of the channel is suppressed, and a high current can be passed.

Additionally, since the potential of the fourth nitride semiconductor layer is fixed to the same potential as the potential applied to the source electrode, when the nitride semiconductor device is in the turn-off state, the depletion layer spreads from the interface between the fourth nitride semiconductor layer and the first nitride semiconductor layer to the first nitride semiconductor layer side, and the breakdown voltage is increased. In this manner, according to the present aspect, a nitride semiconductor device capable of achieving a high breakdown voltage and a high current operation is realized.

In addition, since the fourth nitride semiconductor layer fixed to the same potential as the potential applied to the source electrode functions as a shield layer, the capacity (feedback capacity) generated between the gate electrode and the drain electrode can be reduced. Therefore, the nitride semiconductor device is also effective for high-speed operation.

Furthermore, for example, the nitride semiconductor device according to an aspect of the present disclosure may further include a high-resistance layer disposed between the fifth nitride semiconductor layer and the second nitride semiconductor layer and having a resistance higher than a resistance of one of the fifth nitride semiconductor layer and the second nitride semiconductor layer.

Accordingly, when the nitride semiconductor device is in the turn-on state, the leakage current that flows from the gate electrode into the drain electrode via the fifth nitride semiconductor layer, the second nitride semiconductor layer, and the first nitride semiconductor layer can be suppressed by the high-resistance layer.

Furthermore, for example, the fifth nitride semiconductor layer may have an effective carrier concentration higher than an effective carrier concentration of the first nitride semiconductor layer.

Accordingly, when a reverse voltage is applied between the gate and the source, a punch-through current that flows from the fifth nitride semiconductor layer to the second nitride semiconductor layer via the fifth nitride semiconductor layer can be suppressed.

Furthermore, for example, the fourth opening may have an opening width shorter than an opening width of the first opening.

Accordingly since the opening width of the fourth opening is narrow, for example, when the nitride semiconductor device is in the turn-off state, the depletion layer extending from the fourth nitride semiconductor layer to the fifth nitride semiconductor layer can seal the fourth opening. Since the fourth opening is sealed by the depletion layer, the path of a current passing through the fourth opening is narrowed. Thus, the leakage current in the turn-off state can be suppressed. Additionally, when the nitride semiconductor device is in the turn-off state, the electric field applied in the vicinity of the gate electrode can be effectively mitigated, and the breakdown voltage of the nitride semiconductor device can be increased.

Furthermore, for example, the fourth nitride semiconductor layer may include a plurality of fourth openings each of which is the fourth opening.

Accordingly, since a plurality of fourth openings are provided, a plurality of current paths in the case where the nitride semiconductor device is in the turn-on state can be secured, while narrowing the opening width of each of the plurality of fourth openings. Therefore, it is possible to achieve both a high current in the turn-on state and the suppression of a leakage current in the turn-off state.

Furthermore, for example, the nitride semiconductor device according to an aspect of the present disclosure may further include: a Schottky barrier diode disposed at a position separated from the first opening in a plan view, wherein the Schottky barrier diode may include an anode electrode disposed on the fifth nitride semiconductor layer, the Schottky barrier diode may include a cathode electrode that is a part of the drain electrode, and the fourth nitride semiconductor layer may further include, between the anode electrode and the cathode electrode, a fifth opening exposing part of the first nitride semiconductor layer.

Accordingly, an FET and the Schottky barrier diode can be provided in the same element. By providing the FET and the Schottky barrier diode in the same element, the noise at the time of operation of the FET can be reduced.

In the Schottky barrier diode, since the anode electrode is electrically connected to the source electrode, and the cathode electrode is a part of the drain electrode, the Schottky barrier diode operates as a reflux diode. In other words, when a reverse bias is applied between the source and the drain of an FET, the Schottky barrier diode can pass a current from the source electrode to the drain electrode of the FET. Since the voltage at the time when a reverse bias is applied is suppressed from being concentrated in the FET, the destruction of the FET can be suppressed.

Furthermore, for example, the anode electrode may be electrically connected to the fourth nitride semiconductor layer.

Accordingly, since the electric field concentrated on the Schottky connecting portion can be mitigated, the breakdown voltage of the Schottky barrier diode can be increased.

Furthermore, for example, the fourth nitride semiconductor layer may include a plurality of fifth openings each of which is the fifth opening.

Accordingly, since a plurality of fifth openings are provided, a plurality of current paths at the time of reverse bias application to the FET can be secured, while narrowing the opening width of each of the plurality of fifth openings. Therefore, it is possible to achieve both a high current at the time of reverse bias application to the FET and the suppression of a leakage current in a positive bias state of the FET.

Hereinafter, embodiments will be described in detail with reference to the drawings.

It should be noted that each of the following embodiments shows a generic or specific example. The numerical values, shapes, materials, structural components, the arrangement and connection of the structural components, steps, the processing order of the steps, etc. shown in the following embodiments are mere examples, and thus are not intended to limit the present disclosure. Furthermore, among the structural components described in the following embodiments, structural components not recited in any one of the independent claims are described as optional structural components.

Furthermore, the respective figures are schematic diagrams and are not necessarily accurate illustrations. Therefore, for example, the scale, and so on, in the respective figures do not necessarily match. Furthermore, in the figures, elements which are substantially the same are given the same reference signs, and overlapping description is omitted or simplified.

Furthermore, in the Specification, terms indicating a relationship between elements such as "parallel" or "perpendicular", terms indicating the shape of an element such as "rectangle", as well as numerical ranges are not only expressions with strict meanings, but also expressions of a substantially equivalent range whose meanings include an error of several percent, for example.

Additionally, in the present specification, the terms "above" and "under" do not indicate the upward direction (vertically upward) and the downward direction (vertically downward) in absolute space recognition, and are used as the terms defined by the relative positional relationship based on the lamination order in a laminated configuration. In the present specification, based on a substrate, the side on which a gate electrode, a source electrode, etc., are provided is indicated as "above", and the side on which a drain electrode is provided is indicated as "under". In addition, the terms "above" and "under" are applied not only to the case where two components are arranged by being spaced apart from each other, and another component exists between the two components, but also to the case where two components are arranged close to each other, and the two components contact each other.

Additionally, in the present specification, AlGaN represents the ternary mixed crystal $Al_xGa_{1-x}N$ ($0 \leq x \leq 1$). Hereinafter, multiple mixed crystals are abbreviated by respective arrangements of constituent elements, such as AlInN and GaInN. For example, $Al_xGa_{1-x-y}In_yN$ ($0 \leq x \leq 1$, $0 \leq y \leq 1$, x+y=1), which is one of nitride semiconductors, is abbreviated as AlGaInN.

In addition, in the present specification and the drawings, the x-axis, the y-axis, and the z-axis represent the three axes of a three-dimensional Cartesian coordinate system. In each embodiment, the z-axis direction is the thickness direction of a substrate, i.e., the lamination direction of each layer. The y-axis is the direction in which a gate opening extends, i.e., the direction corresponding to a channel width.

Embodiment 1

[Configuration]

First, using FIG. 1 to FIG. 3, a description will be given of the configuration of a nitride semiconductor device according to Embodiment 1.

FIG. 1 is a diagram illustrating the plane layout of nitride semiconductor device 10 according to the present embodiment. Specifically, (a) in FIG. 1 illustrates the pad layout of nitride semiconductor device 10. (b) in FIG. 1 illustrates the plane layout in the case where source electrode pads 56 of nitride semiconductor device 10 are removed. In (b) in FIG. 1, the layout of the configuration of a lower layer is illustrated in the state where gate electrode pad 58 is transparent.

Figure 2:
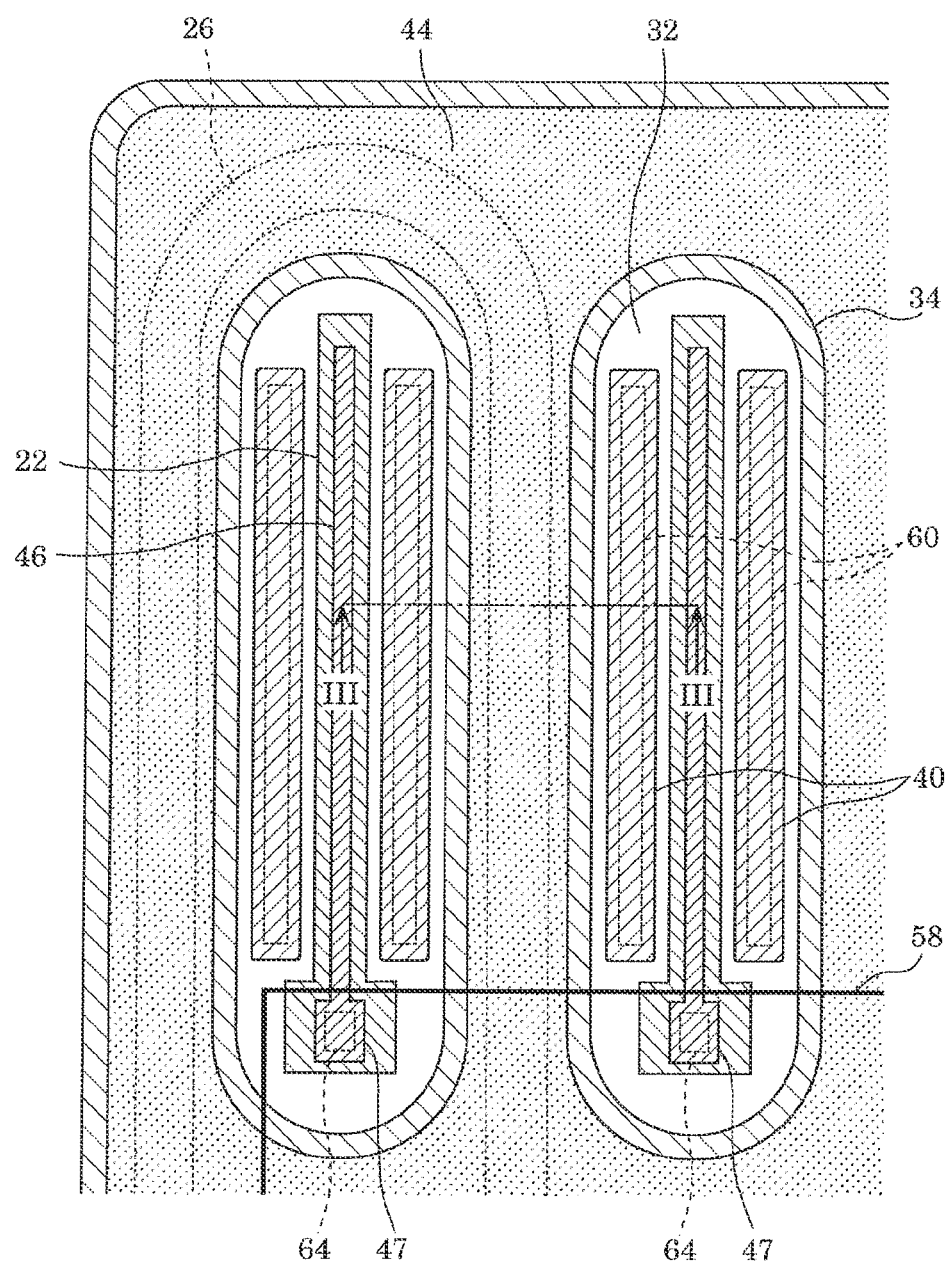
FIG. 2 is a diagram illustrating area II in FIG. 1 in an enlarged manner.

FIG. 2 is a diagram illustrating area II in FIG. 1 in an enlarged manner. In FIG. 1 and FIG. 2, in order to make the shapes comprehensible, diagonal hatching is given to the exposed portion of each of source electrodes 40, fixed-potential electrodes 46, block layers 22, and threshold adjustment layers 34. Additionally, in FIG. 1, dot hatching is given to gate electrode pad 58, and in FIG. 2, dot hatching is given to gate electrode 44.

As illustrated in FIG. 1, nitride semiconductor device 10 includes a plurality of source electrodes 40 aligned and disposed in a plane. Each of the plane view shapes of the plurality of source electrodes 40 is a long rectangle in a predetermined direction. The plurality of source electrodes 40 are aligned and disposed along each of a longitudinal direction and a lateral direction in plan view. In the example illustrated in FIG. 1, two source electrodes 40 are aligned and disposed in the longitudinal direction (the vertical direction of the paper), and ten or more source electrodes 40 are aligned in the lateral direction (the horizontal direction of the paper). Note that the number and shapes of source electrodes 40 are not limited to these.

The plurality of source electrodes 40 are each surrounded by gate electrode 44 as a set of two source electrodes 40 aligned in the lateral direction. Gate electrode 44 is a single plate-like electrode in which openings are provided at the positions corresponding to the respective plurality of sets of source electrodes 40. In plan view, gate electrode 44 and source electrodes 40 are disposed with distances between them, and do not overlap with each other.

Note that gate electrode 44 may be a comb-like electrode. Specifically, the direction in which the comb teeth of gate electrode 44 extend is parallel to the longitudinal direction of source electrodes 40. Additionally, nitride semiconductor device 10 may include a plurality of gate electrodes 44 provided between adjacent sets of source electrode 40.

In the present embodiment, nitride semiconductor device 10 further includes a plurality of fixed-potential electrodes 46. The plane view shape of the plurality of fixed-potential electrodes 46 is a long rectangle along the longitudinal direction of source electrodes 40. As illustrated in FIG. 1 and FIG. 2, the plurality of fixed-potential electrodes 46 correspond one-to-one to a set of source electrodes 40. In other words, the plurality of fixed-potential electrodes 46 correspond one-to-one to the opening provided in gate electrode 44. Specifically, one fixed-potential electrode 46 is provided between a set of source electrodes 40.

Note that the shapes of source electrode 40, gate electrode 44, and fixed-potential electrode 46 are not limited to the examples illustrated in FIG. 1. For example, the plane view shape of source electrode 40 may be a hexagon. A plurality of source electrodes 40 having a hexagon plane view shape may be arranged so that the center of each source electrode 40 is located at a vertex of a regular hexagon in a filling arrangement in plan view.

In the present embodiment, nitride semiconductor device 10 is a device having a laminated structure of semiconductor layers that include nitride semiconductors such as GaN and AlGaN as the main components. Specifically, nitride semiconductor device 10 includes a hetero structure of an AlGaN film and a GaN film.

In the hetero structure of an AlGaN film and a GaN film, a high-concentration two-dimensional electron gas (2DEG) is generated in a hetero interface by a spontaneous polarization or piezoelectric polarization on a (0001) surface. Therefore, the interface is characterized in that a sheet carrier concentration of $1 \times 10^{13}$ cm$^{-2}$ or more is obtained even in an undoped state.

Nitride semiconductor device 10 according to the present embodiment is a field-effect transistor (FET) utilizing a two-dimensional electron gas generated in the hetero interface of AlGaN/GaN as a channel. Specifically, nitride semiconductor device 10 is a so-called vertical FET.

In nitride semiconductor device 10, for example, source electrodes 40 are grounded (that is, the potential is 0 V), and a positive potential is provided to drain electrode 50. When nitride semiconductor device 10 is in the turn-off state, the potential of 0 V or a negative potential is applied to gate electrode 44. When nitride semiconductor device 10 is in the turn-on state, a positive potential (for example, +5 V) is applied to gate electrode 44.

Figure 3:
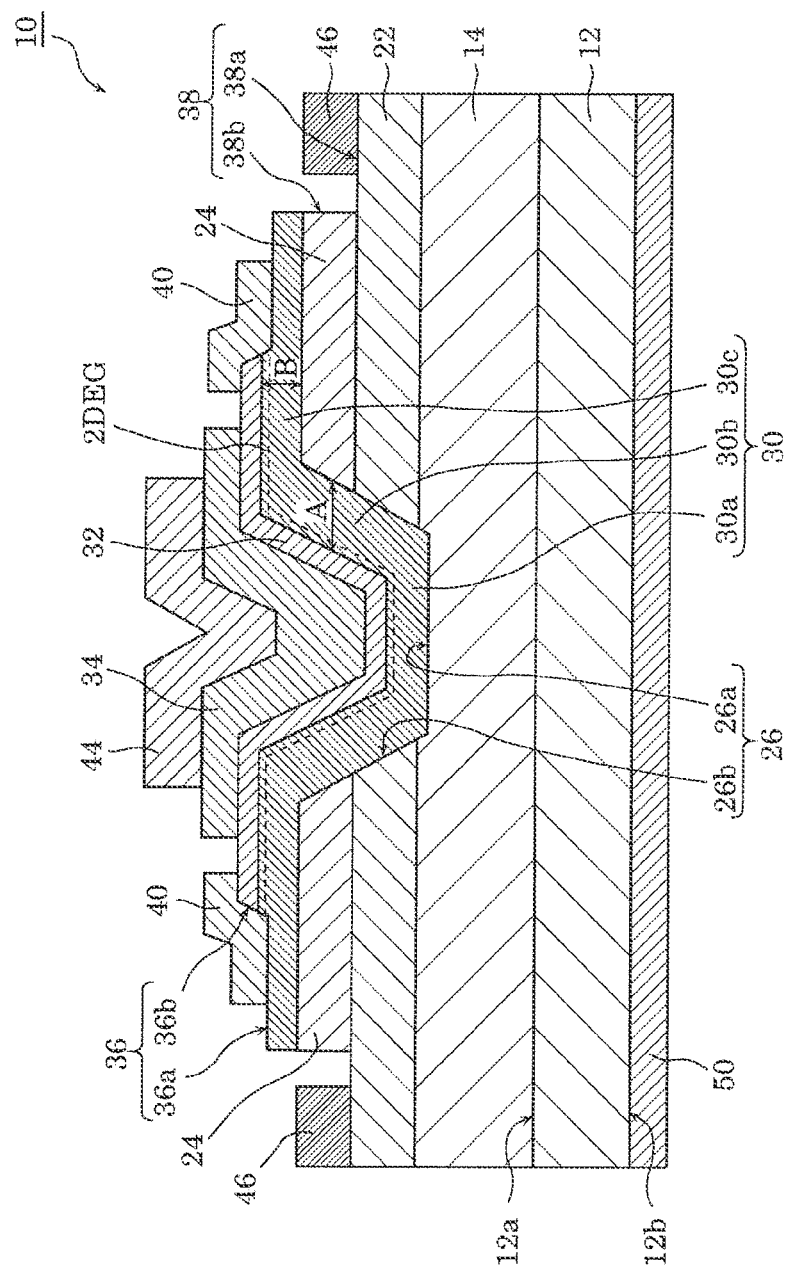
FIG. 3 is a cross-sectional view of the nitride semiconductor device according to Embodiment 1 at line III-III in FIG. 2.

FIG. 3 is a cross-sectional view of nitride semiconductor device 10 according to the present embodiment at line III-III in FIG. 2.

As illustrated in FIG. 3, nitride semiconductor device 10 includes substrate 12, drift layer 14, block layer 22, high-resistance layer 24, gate opening 26, electron transport layer 30, electron supply layer 32, threshold adjustment layer 34, source opening 36, opening 38, source electrodes 40, gate electrode 44, and fixed-potential electrodes 46. Further, as illustrated in (a) in FIG. 1, nitride semiconductor device 10 includes source electrode pads 56 and gate electrode pad 58.

Hereinafter, details of each of the components included in nitride semiconductor device 10 will be described Substrate 12 is a substrate formed from a nitride semiconductor, and includes first principal surface 12a and second principal surface 12b that face away from each other as illustrated in FIG. 3. First principal surface 12a is a principal surface on which drift layer 14 is formed. Specifically, first principal surface 12a substantially matches a c surface. Second principal surface 12b is a principal surface on which drain electrode 50 is formed. As illustrated in FIG. 1, the plane view shape of substrate 12 is, for example, but not limited to, a rectangle.

Substrate 12 is, for example, a substrate formed from $n^+$ type GaN, having a thickness of 300 µm, and having a carrier concentration of $1\times10^{18}$ cm$^{-3}$. Note that the n type and the p type indicate the conductivity of a semiconductor. In the present embodiment, the n type is an example of a first conductivity of a nitride semiconductor. The p type is an example of a second conductivity, which is different in polarity from the first conductivity. The $n^+$ type represents the state where an n-type dopant is excessively added to a semiconductor, the so-called heavy dope. Additionally, the $n^-$ type represents the state where an n-type dopant is added to a semiconductor too little, the so-called light dope. The same applies to the $p^+$ type and the $p^-$ type.

Note that substrate 12 may not be a nitride semiconductor substrate. For example, substrate 12 may be a silicon (Si) substrate, a silicon carbide (SiC) substrate, or a zinc oxide (ZnO) substrate.

Drift layer 14 is an example of an n-type first nitride semiconductor layer disposed above first principal surface 12a of substrate 12. Drift layer 14 is, for example, a film formed from $n^-$ type GaN having a thickness of 8 µm or µm. The donor concentration of drift layer 14 is, for example, in the range of $1\times10^{15}$ cm$^{-3}$ or more to $1\times10^{17}$ cm$^{-3}$ or less, and is $1\times10^{16}$ cm$^{-3}$ as an example. Additionally the carbon concentration (C concentration) of drift layer 14 is in the range of $1\times10^{15}$ cm$^{-3}$ or more to $2\times10^{17}$ cm$^{-3}$ or less.

Drift layer 14 is disposed, for example, to contact first principal surface 12a of substrate 12. Drift layer 14 is formed on first principal surface 12a of substrate 12 by crystal growth by the metal-organic vapor phase epitaxial (MOVPE) growth method, etc.

The block layer (or first base layer) 22 is an example of a p-type second nitride semiconductor layer disposed above drift layer 14. Block layer 22 is, for example, a film formed from p-type GaN, having a thickness of 400 nm, and having a carrier concentration of $1\times10^{17}$ cm$^{-3}$. Block layer 22 is disposed to contact the upper surface of drift layer 14. Block layer 22 is formed on drift layer 14 by crystal growth by, for example, the MOVPE method, etc. Note that block layer 22 may be formed by implanting magnesium (Mg) into a deposited i-type GaN film.

Block layer 22 suppresses a leakage current between source electrode and drain electrode 50. For example, when a reverse voltage is applied to a pn junction formed by block layer 22 and drift layer 14, specifically, when drain electrode 50 has a higher potential than source electrode 40, a depletion layer extends into drift layer 14. Accordingly, a high breakdown voltage can be achieved in nitride semiconductor device 10. As described above, in the present embodiment, drain electrode 50 has a higher potential than source electrode 40 in both the turn-off state and the turn-on state. Therefore, a high breakdown voltage is achieved in nitride semiconductor device 10.

Block layer 22 is fixed to the same potential as gate electrode 44. Fixing of potential will be described later.

High-resistance layer (or second base layer) 24 is an example of a first high-resistance layer disposed above block layer 22. High-resistance layer 24 has a higher resistance than block layer 22. High-resistance layer 24 is formed from an insulating or semi-insulating nitride semiconductor. High-resistance layer 24 is, for example, a film formed from undoped GaN having a thickness of 200 nm. High-resistance layer 24 is disposed to contact block layer 22. High-resistance layer 24 is formed on block layer 22 by crystal growth by, for example, the MOVPE method, etc. High-resistance layer 24 is disposed to contact block layer 22.

Note that, here, "undoped" means that doping with a dopant, such as Si or Mg, which changes the polarity of GaN to the n type or the p type, is not performed. In the present embodiment, high-resistance layer 24 is doped with carbon (C). Specifically, the carbon (C) concentration of high-resistance layer 24 is higher than the C concentration of block layer 22.

Additionally, silicon (Si) or oxygen (O) mixed at the time of deposition may be included in high-resistance layer 24. In this case, the C concentration of high-resistance layer 24 is higher than the silicon concentration (Si concentration) or oxygen concentration (O concentration). For example, the C concentration of high-resistance layer 24 is, for example, $3\times10^{17}$ cm$^{-3}$ or more, but may be $1\times10^{18}$ cm$^{-3}$ or more. The Si concentration or O concentration of high-resistance layer 24 is, for example, $5\times10^{16}$ cm$^{-3}$ or less, but may be $2\times10^{16}$ cm$^{-3}$ or less.

Note that high-resistance layer 24 may be formed by ion implantation of magnesium (Mg), iron (Fe), or boron (B), etc., in addition to carbon. Other ionic species may be used as long as the ionic species can realize a high resistance in GaN.

Here, if nitride semiconductor device 10 does not include high-resistance layer 24, a parasitic npn structure of electron transport layer 30, p-type block layer 22, and n-type drift layer 14, i.e., a parasitic bipolar transistor, will exist between source electrode 40 and drain electrode 50. Therefore, in the case where nitride semiconductor device 10 is in the turn-off state, when a current flows into p-type block layer 22, there is a possibility that the parasitic bipolar transistor is in the turn-on state, and reduces the breakdown voltage of nitride semiconductor device 10. In this case, malfunction of nitride semiconductor device 10 easily occurs. In the present embodiment, by disposing high-resistance layer 24, it is possible to suppress a parasitic npn structure from being formed, and to suppress malfunction of nitride semiconductor device 10.

A layer for suppressing a p-type impurity, such as Mg, from spreading from block layer 22 may be disposed on the upper surface of high-resistance layer 24. For example, an AlGaN layer having a thickness of 20 nm may be disposed on high-resistance layer 24.

Gate opening 26 is an example of a first opening that penetrates block layer 22, and reaches up to drift layer 14. Specifically, gate opening 26 penetrates high-resistance layer 24 and block layer 22 from the upper surface of high-resistance layer 24 in this order, and reaches up to drift layer 14. Bottom surface 26a of gate opening 26 is the upper surface of drift layer 14. As indicated in FIG. 3, bottom surface 26a is located below the interface between drift layer 14 and block layer 22. Bottom surface 26a is parallel to first principal surface 12a of substrate 12.

In the present embodiment, gate opening 26 is formed such that further away from substrate 12, the larger the opening area. Specifically, side surfaces 26b of gate opening 26 are inclined at an angle. The cross-sectional view shape of gate opening 26 is an inverted trapezoid, more specifically, an inverted isosceles trapezoid.

The tilt angle of side surface 26b with respect to bottom surface 26a is, for example, in the range of 20° or more to 80° or less. The tilt angle may be, for example, in the range of 30° or more to 45° or less. Since side surfaces 26b approach the c surface when the tilt angle is 45° or less, the film quality of electron transport layer 30 formed along side surfaces 26b by crystal re-growth, etc., can be increased.

When the tilt angle is 30° or more, gate opening 26 is suppressed from becoming too large, and the miniaturization of nitride semiconductor device 10 is realized.

The plane view shape of bottom surface 26a of gate opening 26 is illustrated by a broken line in FIG. 1 and FIG. 2. The shape of gate opening 26 is substantially equivalent to the shape of bottom surface 26a. As illustrated in FIG. 1, gate opening 26 is formed in an O shape (racetrack shape) that collectively surrounds 2 sets of source electrodes 40 arranged in the longitudinal direction of source electrodes 40. Gate opening 26 is disposed at every other set of source electrodes 40 in the lateral direction of source electrodes 40. Note that the shape of gate opening 26 is not limited to this, and may be a U shape in which one end of O-shape gate opening 26 in the longitudinal direction is opened, or may be two straight lines in which both ends are opened.

Gate opening 26 is formed by sequentially forming drift layer 14, block layer 22, and high-resistance layer 24 on first principal surface 12a of substrate 12, and thereafter removing high-resistance layer 24 and block layer 22 so as to partially expose drift layer 14. At this time, bottom surface 26a of gate opening 26 is formed below the interface between drift layer 14 and block layer 22 by also removing a surface portion of drift layer 14.

Removal of high-resistance layer 24 and block layer 22 is performed by application, patterning, and dry etching of a resist. Specifically, by patterning and then baking the resist, an end of the resist is inclined at an angle. By performing dry etching thereafter, gate opening 26 is formed in which side surfaces 26b are inclined such that the shape of the resist is transferred.

Electron transport layer 30 is an example of a first re-growth layer disposed along the internal surfaces of gate opening 26, and is an example of a sixth nitride semiconductor layer. Specifically electron transport layer 30 is disposed along bottom surfaces 26a and 26b of gate opening 26, and on the upper surface of block layer 22. Electron transport layer 30 is, for example, a film formed from undoped GaN having a thickness of 100 nm. Note that electron transport layer 30 is undoped, but may be formed into the n-type by Si doping, etc.

Electron transport layer 30 contacts drift layer 14 in bottom surface 26a of gate opening 26. Electron transport layer 30 contacts respective end surfaces of block layer 22 and high-resistance layer 24 in side surfaces 26b of gate opening 26. Further, electron transport layer 30 contacts the upper surface of high-resistance layer 24. Electron transport layer 30 is formed by crystal re-growth after forming gate opening 26.

Electron transport layer 30 includes a channel. Specifically a two-dimensional electron gas (2DEG) is generated in the vicinity of the interface between electron transport layer 30 and electron supply layer 32. The two-dimensional electron gas functions as the channel in electron transport layer 30. In FIG. 3, the two-dimensional electron gas is schematically illustrated by broken lines. The two-dimensional electron gas is bent along the interface between electron transport layer 30 and electron supply layer 32, i.e., along the internal surfaces of gate opening 26.

Additionally, although not illustrated in FIG. 3, an AlN film having a thickness of about 1 nm may be disposed as a second re-growth layer between electron transport layer 30 and electron supply layer 32. The AlN film can suppress alloy scattering, and improve the mobility of a channel.

Electron supply layer 32 is an example of a third re-growth layer disposed along the internal surfaces of gate opening 26, and is an example of the sixth nitride semiconductor layer. Electron transport layer 30 and electron supply layer 32 are disposed in this order from a substrate 12 side. Electron supply layer 32 is formed with a substantially uniform thickness with a shape along the upper surface of electron transport layer 30. Electron supply layer 32 is, for example, a film formed from undoped $Al_{0.2}Ga_{0.8}N$ and having a thickness of 50 nm. Electron supply layer 32 is formed by crystal re-growth following the formation process of electron transport layer 30.

Electron supply layer 32 forms a hetero interface of AlGaN/GaN between electron supply layer 32 and electron transport layer 30. Accordingly, a two-dimensional electron gas is generated within electron transport layer 30. Electron supply layer 32 supplies electrons to the channel (that is, the two-dimensional electron gas) formed in electron transport layer 30.

Threshold adjustment layer 34 is an example of a third nitride semiconductor layer of a second conductivity disposed between gate electrode 44 and electron supply layer 32. Threshold adjustment layer 34 is disposed on electron supply layer 32, and contacts electron supply layer 32 and gate electrode 44.

In the present embodiment, when substrate 12 is viewed in plan view, ends of threshold adjustment layer 34 are located at positions closer to source electrode 40 than ends of gate electrode 44. Threshold adjustment layer 34 and source electrode 40 are separated from each other and do not contact each other. Therefore, as illustrated in FIG. 1 and FIG. 2, in plan view, only annular portions of threshold adjustment layer 34 surrounding source electrodes 40 are exposed and appear from the ends of gate electrode 44. The plane view shape of the exposed portion of threshold adjustment layer 34 is, for example, an O shape (racetrack shape).

Threshold adjustment layer 34 is, for example, a nitride semiconductor layer formed from p-type GaN, having a thickness of 100 nm, and having a carrier concentration (effective carrier concentration) of $1\times10^{17}$ $cm^{-3}$. Threshold adjustment layer 34 is formed by being deposited by the MOVPE method and patterned, following the formation process of electron supply layer 32.

By disposing threshold adjustment layer 34, the potential of a conduction band edge of a channel portion is raised. Therefore, the threshold voltage of nitride semiconductor device 10 can be increased. Therefore, nitride semiconductor device 10 can be realized as a normally-off type FET.

Note that threshold adjustment layer 34 is not limited to the p-type GaN film, and may be a nitride semiconductor film including Al, In, or B. Alternatively, threshold adjustment layer 34 may be an insulating film, such as a silicon nitride film (SiN film) or a silicon oxide film (SiO film). Threshold adjustment layer 34 may be formed by using any kind of material, as long as the material can raise the potential of the channel. Additionally, when normally-off characteristics are not required, nitride semiconductor device 10 may not include threshold adjustment layer 34. In other words, gate electrode 44 may be directly disposed on electron supply layer 32.

Source opening 36 is an example of a third opening that penetrates electron supply layer 32 and reaches up to electron transport layer 30 at a position distant from gate electrode 44. As illustrated in FIG. 3, in a cross-section view, source openings 36 are disposed on both sides of gate electrode 44. Source opening 36 exposes a part of electron transport layer 30 at a position distant from gate opening 26. Bottom surface 36a of source opening 36 is the upper surface of electron transport layer 30. As illustrated in FIG. 3, bottom surface 36a is located below the interface between electron supply layer 32 and electron transport layer 30. Bottom surface 36a is parallel to first principal surface 12a of substrate 12.

Note that the two-dimensional electron gas is exposed at side surface 36b of source opening 36, and is connected to source electrode 40 in the exposed portion. Source opening 36 is arranged at a position distant from gate opening 26 in plan view.

As illustrated in FIG. 3, source opening 36 is formed such that further away from substrate 12, the larger the opening area. Specifically, side surface 36b of source opening 36 is inclined at an angle. For example, the cross-sectional shape of source opening 36 is an inverted trapezoid, more specifically, an inverted isosceles trapezoid. Note that the cross-sectional shape of source opening 36 may be a substantially rectangle.

The tilt angle of side surface 36b with respect to bottom surface 36a is, for example, in the range of 20° or more to 800 or less. The tilt angle may be, for example, in the range of 30° or more to 600 or less. For example, the tilt angle of side surface 36b of source opening 36 is greater than the tilt angle of side surface 26b of gate opening 26. Since side surface 36b is inclined at an angle, the contact area between source electrode 40 and electron transport layer 30 (the two-dimensional electron gas) is increased. Thus, ohmic connection is easily made.

Source opening 36 is formed by, for example, etching electron supply layer 32 so that electron transport layer 30 is exposed in an area different from gate opening 26, following the formation process of threshold adjustment layer 34. At this time, bottom surface 36a of source opening 36 is formed below the interface between electron transport layer 30 and electron supply layer 32 by also removing a surface portion of electron transport layer 30. Source opening 36 is formed into a predetermined shape by, for example, patterning by photolithography, and dry etching, etc.

Source electrode 40 is connected to electron transport layer 30 and electron supply layer 32 at a position distant from gate electrode 44. Specifically, source electrode 40 is connected to the respective end surfaces of electron supply layer 32 and electron transport layer 30, and to the upper surface of electron transport layer 30. Source electrode 40 is ohmically connected to electron transport layer 30 and electron supply layer 32. As illustrated in FIG. 3, source electrode 40 does not contact threshold adjustment layer 34.

Source electrode 40 is disposed along a part of the internal surfaces of source opening 36. Specifically, source electrode 40 is disposed so as to cover a part of bottom surface 36a and entire side surface 36b of source opening 36. Source electrode 40 directly contacts the two-dimensional electron gas in side surface 36b.

Source electrode 40 is formed by using a conductive material such as a metal. For example, a material that is ohmically connected to an n-type semiconductor layer, such as Ti/Al, may be used as a material of source electrode 40. Source electrode 40 is formed by, for example, patterning a conductive film deposited by sputtering or vapor deposition.

Opening 38 is an example of a second opening that penetrates electron supply layer 32, electron transport layer 30, and high-resistance layer 24, and reaches up to block layer 22. Opening 38 is located at a position distant from source electrode 40 in the inner side of source opening 36 in plan view. Specifically, opening 38 is disposed in a portion in which source electrode 40 is not disposed in bottom surface 36a of source opening 36.

Bottom surface 38a of opening 38 is the upper surface of block layer 22. As illustrated in FIG. 3, bottom surface 38a is flush with the interface between block layer 22 and high-resistance layer 24, but is not limited to this. Bottom surface 38a may be located below the interface between block layer 22 and high-resistance layer 24. Bottom surface 38a is parallel to first principal surface 12a of substrate 12.

As illustrated in FIG. 3, opening 38 is formed so that the opening area becomes substantially equal. Specifically, side surface 38b of opening 38 is substantially perpendicular to bottom surface 38a. The cross-sectional shape of opening 38 is a substantially rectangle. Accordingly, the area occupied by opening 38 in a plane layout can be made small.

As illustrated in FIG. 2, the plane view shape of opening 38 is equivalent to the exposed portion of block layer 22. The outline of the exposed portion of block layer 22 illustrated in FIG. 2 matches the outline of bottom surface 38a of opening 38. Although details will be described with a description of the configuration of an electrode pad, opening 38 is disposed to extend outwardly between source electrodes 40, in order to dispose contact portion 47 of fixed-potential electrode 46.

Note that side surface 38b may be inclined with respect to bottom surface 38a. For example, the cross-sectional shape of opening 38 may be an inverted trapezoid, specifically, an inverted isosceles trapezoid. The tilt angle of side surface 38b with respect to bottom surface 38a may be, for example, in the range of 80° or more. For example, the tilt angle of side surface 38b of opening 38 is greater than the tilt angle of side surface 36b of source opening 36.

Opening 38 is formed by, for example, etching electron transport layer and high-resistance layer 24, so that block layer 22 is exposed in an area different from source electrode 40, following the formation process of source opening 36, or the formation process of source electrode 40. At this time, bottom surface 38a of opening 38 may be formed below the interface between block layer 22 and high-resistance layer 24 by also removing a surface portion of block layer 22. Opening 38 is formed into a predetermined shape by, for example, patterning by photolithography, and dry etching, etc.

Gate electrode 44 is disposed above electron supply layer 32 so as to cover gate opening 26. In the present embodiment, gate electrode 44 is formed in a shape along the upper surface of threshold adjustment layer 34, and with a substantially uniform thickness while contacting the upper surface of threshold adjustment layer 34.

Gate electrode 44 is formed to be spaced part from source electrodes 40 in plan view, so that gate electrode 44 does not contact source electrode 40. Specifically, as illustrated in (b) in FIG. 1, gate electrode 44 is disposed to surround source electrodes 40 in plan view.

Gate electrode 44 is formed by using a conductive material such as a metal. For example, gate electrode 44 is formed by using palladium (Pd). Note that a material that is Schottky-connected to an n-type semiconductor can be used as a material of gate electrode 44, and for example, a nickel (Ni)-based material, tungsten silicide (WSi), gold (Au), etc., can be used. Gate electrode 44 is formed by patterning a conductive film deposited by sputtering, or vapor deposition, etc., after deposition or patterning of threshold adjustment layer 34 is performed, or after opening 38 is formed.

Fixed-potential electrode 46 is disposed in bottom surface 38a of opening 38, and contacts block layer 22. As illustrated in FIG. 3, fixed-potential electrode 46 is disposed distant from side surface 38b, so as not to contact side surface 38b of opening 38.

Fixed-potential electrode 46 is formed by using a conductive material such as a metal. Fixed-potential electrode 46 is formed by using, for example, the same material as gate electrode 44. Fixed-potential electrode 46 is formed by the same process as gate electrode 44. Note that fixed-potential electrode 46 may be formed by a process different from that of gate electrode 44. Additionally, fixed-potential electrode 46 may be formed by using a material different from that of gate electrode 44.

Since fixed-potential electrode 46 is electrically connected to block layer 22, the potential of block layer 22 can be fixed. Accordingly, the operation of nitride semiconductor device 10 can be stabilized. Details will be described later.

Drain electrode 50 is disposed on the opposite side of substrate 12 from drift layer 14. Specifically, drain electrode 50 is disposed to contact second principal surface 12b of substrate 12. Drain electrode 50 is formed by using a conductive material such as a metal. Similar to the material of source electrode 40, for example, a material that is ohmically connected to an n-type semiconductor layer, such as Ti/Al, may be used as a material of drain electrode 50. Drain electrode 50 is formed by, for example, patterning a conductive film deposited by sputtering or vapor deposition, etc.

[Electrode Pad]

Subsequently, the configuration of an electrode pad included in nitride semiconductor device 10 will be described.

As illustrated in (a) in FIG. 1, nitride semiconductor device 10 includes two source electrode pads 56 and gate electrode pad 58. Two source electrode pads 56 and gate electrode pad 58 are formed by using a conductive material such as a metal. The metal used for the electrode pads is, for example, but not limited to, copper (Cu) or aluminum (Al).

Two source electrode pads 56 and gate electrode pad 58 are disposed above an interlayer insulating film (not illustrated) that covers the upper surfaces of gate electrode 44, source electrodes 40, and fixed-potential electrodes 46. Each of two source electrode pads 56 and gate electrode pad 58 is thickened, and has a thickness of, for example, 5 μm or more.

Each of two source electrode pads 56 is located in the direction directly above the plurality of source electrodes 40, i.e., at the position that overlaps with the plurality of source electrodes 40 in plan view. Each of the plurality of source electrodes 40 is connected to overlapping source electrode pad 56 in plan view via source-contact plug 60. The plane view shape of source-contact plug 60 is represented by a broken line in FIG. 2. The plane view shape of source-contact plug 60 is, for example, but not limited to, a long rectangle along the shape of source electrode 40.

Source-contact plug 60 is a conductive member that physically and electrically connects source electrode pad 56 to source electrode 40. Source-contact plug 60 is disposed so as to fill a contact hole that penetrates the interlayer insulating film in the thickness direction. Source-contact plug 60 is formed by using a metal material, such as Cu or Al.

Gate electrode pad 58 is located in the direction directly above gate electrode 44. As illustrated in (a) in FIG. 1, gate electrode pad 58 is sandwiched by two source electrode pads 56 in plan view.

Gate electrode 44 is connected to gate electrode pad 58 via gate contact plug 62. The plane view shape of gate contact plug 62 is represented by a broken line in FIG. 1. The plane view shape of gate contact plug 62 is, for example, but not limited to, a rectangle.

Gate contact plug 62 is a conductive member that physically and electrically connects gate electrode pad 58 to gate electrode 44. Note that electrical connection means that two parts (here, gate electrode pad 58 and gate electrode 44) to be connected have substantially the same potential. Gate contact plug 62 is disposed so as to fill a contact hole that penetrates the interlayer insulating film in the thickness direction. Gate contact plug 62 is formed by using a metal material, such as Cu or Al.

As illustrated in FIG. 2, further, gate electrode pad 58 is located in the direction directly above contact portions 47 extending from fixed-potential electrodes 46. Note that, in FIG. 2, only a part of the outer shape of gate electrode pad 58 is represented by a thick solid line.

Contact portion 47 is disposed on one end of fixed-potential electrode 46 in plan view. Specifically, fixed-potential electrode 46 is disposed to be longer than two source electrodes 40, and extends outwardly of a portion sandwiched by two source electrodes 40. Contact portion 47 is disposed in a portion extending outwardly of the portion sandwiched by two source electrodes 40. Contact portion 47 is a part of fixed-potential electrode 46, and is formed by using the same material as fixed-potential electrode 46.

Contact portion 47 is connected to gate electrode pad 58 via contact plug 64. The plane view shape of contact plug 64 is represented by a broken line in FIG. 2.

Contact plug 64 is a conductive member that physically and electrically connects gate electrode pad 58 to fixed-potential electrode 46. Contact plug 64 is disposed so as to fill a contact hole that penetrates the interlayer insulating film in the thickness direction. Contact plug 64 is formed by using a metal material, such as Cu or Al.

As described above, gate electrode 44 and fixed-potential electrode 46 are electrically connected to each other via gate electrode pad 58. Specifically, gate electrode 44 and fixed-potential electrode 46 are electrically connected to each other via gate contact plug 62, gate electrode pad 58, contact plug 64, and contact portion 47. Assuming that the wiring resistances of these members can be substantially ignored, gate electrode 44 and fixed-potential electrode 46 are fixed to the same potential.

Note that the shapes, positions, and numbers of each electrode pad and each contact plug are merely examples, and are not particularly limited. As long as gate electrode 44 and fixed-potential electrode 46 can be electrically connected to each other, gate electrode 44 and fixed-potential electrode 46 may be in any forms.

[Film Thickness of Electron Transport Layer]

As illustrated in FIG. 3, electron transport layer 30 includes bottom portion 30a disposed on bottom surface 26a, sloped portions 30b disposed along side surfaces 26b, and flat portions 30c disposed on the upper surface of high-resistance layer 24. In the present embodiment, length A of sloped portion 30b along a direction parallel to substrate 12 is longer than length B of flat portion 30c along the thickness direction of substrate 12.

Generally, in a vertical FET formed by using a nitride semiconductor material, the crystal growth of GaN is performed so that the c surface of GaN crystal becomes parallel to first principal surface 12a of substrate 12. At this time, the carrier concentration of the two-dimensional electron gas is decreased in a portion inclined with respect to the c surface, compared with a portion parallel to the c surface, since polarization becomes small. In other words, the carrier concentration of the two-dimensional electron gas is lower in a portion in sloped portion 30b, compared with a portion in flat portion 30c. Therefore, the portion of two-dimensional electron gas in sloped portion 30b is susceptible to the narrowing effect due to the depletion layer extending from block layer 22.

In the present embodiment, as illustrated in FIG. 3, length A of sloped portion 30b is longer than length B of flat portion 30c. Therefore, the two-dimensional electron gas is distant from block layer 22 in the portion in sloped portion 30b than in the portion in flat portion 30c. Therefore, since the narrowing effect of the channel due to the depletion layer can be suppressed, the decrease in on-resistance is suppressed.

On the other hand, when the length along the thickness direction of electron transport layer 30 (that is, the thickness of electron transport layer 30) is short, the depth of opening 38 for forming fixed-potential electrode 46 also becomes shallow. Therefore, the shallower opening 38 is, the shorter the process time required for removal of a film by etching can be made. Additionally, since opening 38 is shallow, the coverage of a metal electrode formed in the subsequent process also becomes good. Thus, the on-resistance becomes small.

In this manner, since length A of sloped portion 30b is longer than length B of flat portion 30c, not only a high current operation is enabled, but also the process can be made easy, and the on-resistance can be reduced.

[Gate End]

In the present embodiment, the threshold voltage can be adjusted according to whether gate electrode 44 completely covers gate opening 26, or gate electrode 44 covers only a part of gate opening 26. In other words, the threshold voltage can be adjusted according to the positions of ends of gate electrode 44.

Note that threshold adjustment layer 34 substantially functions as a part of gate electrodes 44. Therefore, when nitride semiconductor device 10 includes threshold adjustment layer 34, the threshold voltage is adjusted according to the end of threshold adjustment layer 34.

Threshold adjustment layer 34 covers, for example, bottom surface 26a and at least a part of side surfaces 26b of gate opening 26 in plan view. Specifically, threshold adjustment layer 34 covers all of bottom surface 26a and side surfaces 26b in plan view. In other words, gate opening 26 is disposed inside threshold adjustment layer 34 in plan view. When seen in the cross-section illustrated in FIG. 3, an end of threshold adjustment layer 34 is located at a position closer to source electrode 40 than an upper end of side surface 26b of gate opening 26 in the direction parallel to substrate 12 (that is, the horizontal direction of the paper).

In this case, the threshold voltage of nitride semiconductor device 10 is determined by the higher one of the threshold voltage of a portion along side surfaces 26b of gate opening 26 (specifically, the inclined portion of the two-dimensional electron gas), and the threshold voltage of a flat portion outside of gate opening 26 (specifically, the flat portion of the two-dimensional electron gas). For example, when the threshold voltage is determined by the flat portion of the two-dimensional electron gas, the distance from block layer 22 to the two-dimensional electron gas is made longer in the flat portion than in the inclined portion. Specifically, length A of sloped portion 30b is made longer than length B of flat portion 30c. Accordingly, the influence of depletion from block layer 22 can be suppressed, and the threshold voltage in sloped portion 30b can be made lower than the threshold voltage in flat portion 30c.

Note that threshold adjustment layer 34 may be disposed inside gate opening 26 in plan view. For example, when seen in the cross-section illustrated in FIG. 3, the end of threshold adjustment layer 34 may be located at a position more distant from source electrode 40 than the upper end of side surface 26b of gate opening 26 in the direction parallel to substrate 12. Specifically, the ends of threshold adjustment layer 34 may be located in the direction directly above side surfaces 26b, i.e., at the positions that overlap with side surfaces 26b in plan view.

In this case, the threshold voltage of nitride semiconductor device 10 is determined only by the configuration of the portion along side surfaces 26b of gate opening 26. Therefore, since the carrier concentration of flat portion 30c can be increased, the on-resistance can be reduced.

Note that, when nitride semiconductor device 10 does not include threshold adjustment layer 34, instead of the ends of threshold adjustment layer 34, the threshold voltage is determined by the positional relationship between the ends of gate electrode 44 and gate opening 26.

In the present embodiment, gate electrode 44 covers, for example, bottom surface 26a and at least a part of side surfaces 26b of gate opening 26 in plan view. Specifically, gate electrode 44 is disposed inside gate opening 26 in plan view. For example, when seen in the cross-section illustrated in FIG. 3, the ends of gate electrode 44 are located at positions more distant from source electrodes 40 than the upper ends of side surfaces 26b of gate opening 26 in the direction parallel to substrate 12. Specifically, the ends of gate electrode 44 are located in the direction directly above side surfaces 26b, i.e., the positions that overlap with side surfaces 26b in plan view.

Alternatively, gate electrode 44 may cover all of bottom surface 26a and side surfaces 26b in plan view. In other words, gate opening 26 may be disposed inside gate electrode 44 in plan view. For example, when seen in the cross-section illustrated in FIG. 3, the ends of gate electrode 44 may be located at positions closer to source electrode 40 than the upper ends of side surfaces 26b of gate opening 26 in the direction parallel to substrate 12.

[Effects, Etc.]

Subsequently, using FIG. 4 and FIG. 5, a description will be given of the effects of nitride semiconductor device 10 according to the present embodiment.

Figure 4:
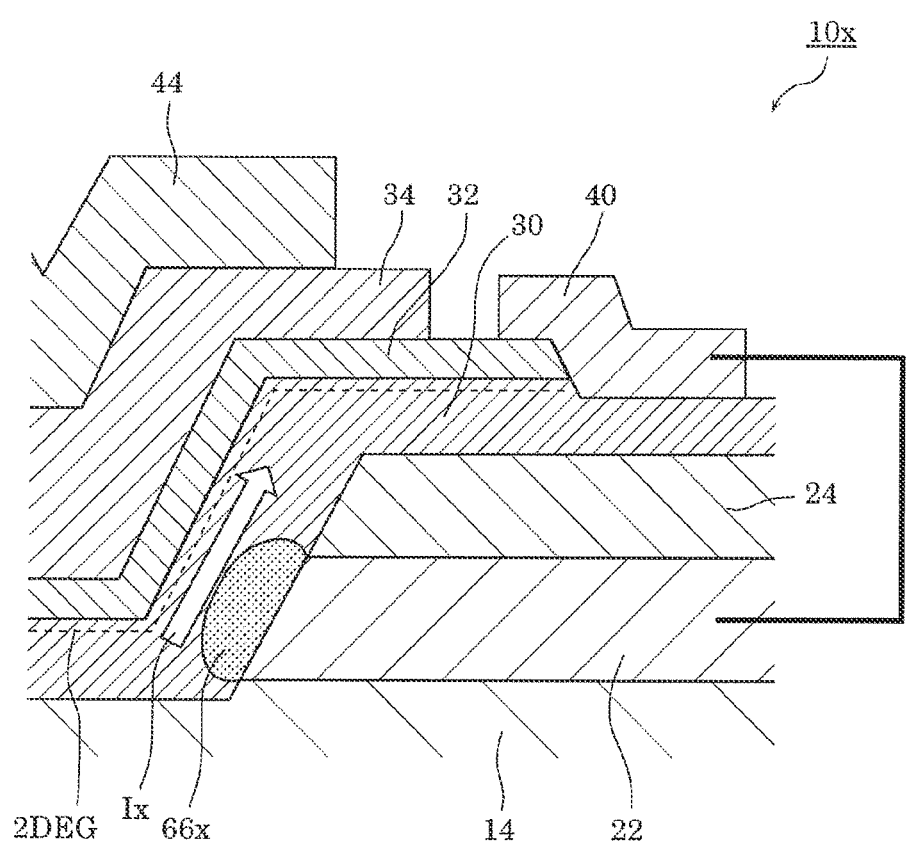
FIG. 4 is a diagram representing a current flowing through a channel of a nitride semiconductor device according to Comparison Example.

FIG. 4 is a diagram representing current Ix that flows through a channel of nitride semiconductor device 10x according to Comparison Example. Current Ix is illustrated by a white arrow in FIG. 4. In nitride semiconductor device 10x according to Comparison Example, block layer 22 is fixed to the same potential as source electrode 40. Note that, in FIG. 4, the fact that block layer 22 and source electrode 40 have the same potential is represented by connecting these with a thick solid line.

A pn structure by p-type block layer 22 and n-type drift layer 14 is formed between source electrode 40 and drain electrode 50. By fixing the potential of block layer 22, when nitride semiconductor device 10x is in a turn-off state, a higher potential is given to drain electrode 50 than to source electrode 40. Thus, a reverse bias voltage is applied to the pn structure. Therefore, since a depletion layer extends toward n-type drift layer 14 from the interface between p-type block layer 22 and n-type drift layer 14, the source-drain breakdown voltage can be increased.

Additionally, when nitride semiconductor device 10x is in a turn-off state, the potential difference between p-type block layer 22 and gate electrode 44 becomes 0, or the potential of gate electrode 44 becomes lower than the potential of p-type block layer 22. Thus, depletion layer 66x is formed in electron transport layer 30. Since depletion layer 66x can narrow the two-dimensional electron gas, and can narrow a current path, the current flow is suppressed, and stable turn-off characteristics are realized.

On the other hand, when nitride semiconductor device 10x is in the turn-on state, a higher potential is given to gate electrode 44 than to source electrode 40. Thus, the state is achieved where a reverse bias voltage is applied between electron transport layer 30 and p-type block layer 22. Therefore, depletion layer 66x does not shrink in electron transport layer 30, and remains narrowing the two-dimensional electron gas. Therefore, current Ix flowing through the two-dimensional electron gas is suppressed. Therefore, in nitride semiconductor device 10x according to Comparison Example, a high current operation cannot be realized.

Note that, when the electric connection between block layer 22 and source electrode 40 is disconnected, in the turn-on state of nitride semiconductor device 10x, depletion layer 66x extending in electron transport layer 30 is suppressed. Thus, a high current operation is enabled. However, since the potential of block layer 22 will be in a floating state, when nitride semiconductor device 10 is in the turn-off state, the depletion layer extending from block layer 22 to drift layer 14 is not stably formed, and the breakdown voltage is significantly decreased.

On the other hand, in nitride semiconductor device 10 according to the present embodiment, as described by using FIG. 1 to FIG. 3, block layer 22 is fixed to the same potential as the potential given to gate electrode 44. In other words, block layer 22 is fixed to the same potential as gate electrode 44.

Figure 5:
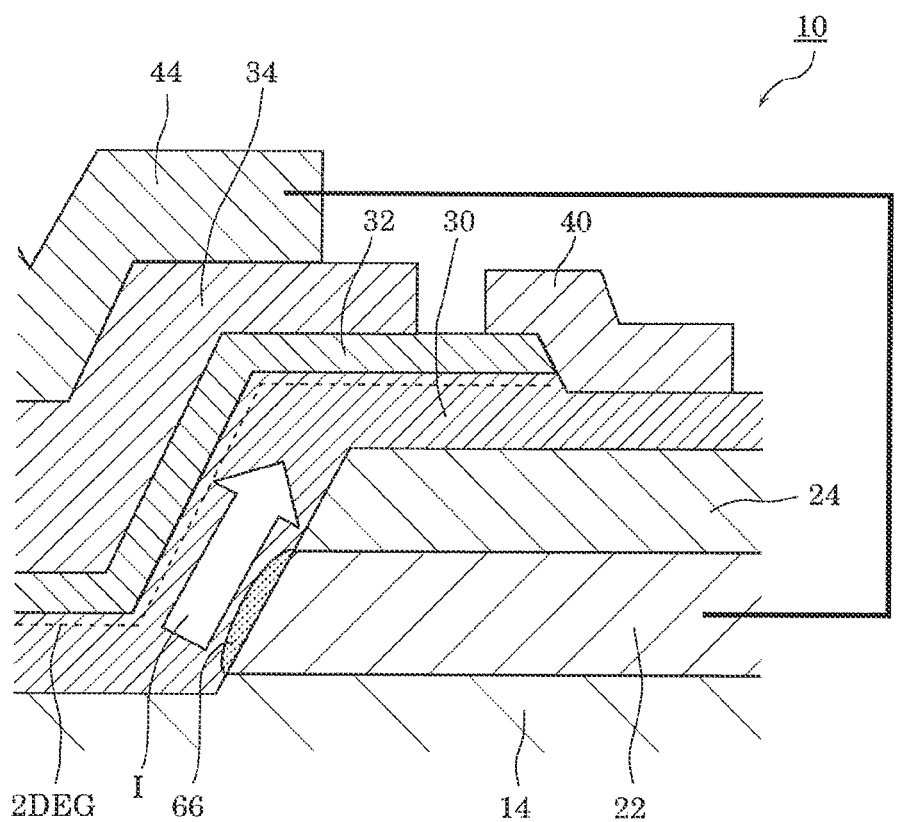
FIG. 5 is a diagram representing a current flowing through a channel of the nitride semiconductor device according to Embodiment 1.

FIG. 5 is a diagram representing current I that flows through the channel of nitride semiconductor device 10 according to the present embodiment. Current I is illustrated by a white arrow in FIG. 5. In FIG. 5, the fact that block layer 22 and gate electrode 44 have the same potential is represented by connecting these by a thick solid line.

When nitride semiconductor device 10 is in the turn-off state, since a higher potential is given to drain electrode 50 than to gate electrode 44, a reverse bias voltage is applied to the pn structure. Therefore, since the depletion layer extends toward n-type drift layer 14 from the interface between p-type block layer 22 and n-type drift layer 14, the source-drain breakdown voltage can be increased.

Additionally, when nitride semiconductor device 10 is in the turn-off state, since the potential difference between p-type block layer 22 and gate electrode 44 becomes 0, depletion layer 66 is formed in electron transport layer 30. Since depletion layer 66 can narrow the two-dimensional electron gas, and can narrow the current path, the current flow is suppressed, and stable turn-off characteristics are realized.

In addition, when nitride semiconductor device 10 is in the turn-on state, since p-type block layer 22 is given the same potential as gate electrode 44, depletion layer 66 shrinks, and the current path can be secured. Therefore, current I flowing through the two-dimensional electron gas can be increased and passed.

As described above, according to nitride semiconductor device 10 according to the present embodiment, it is possible to achieve a high breakdown voltage and a high current operation.

Embodiment 2

Subsequently, Embodiment 2 will be described. In the following description, a description will be mainly given of differences from Embodiment 1, and a description of common features will be omitted or simplified.

Figure 6:
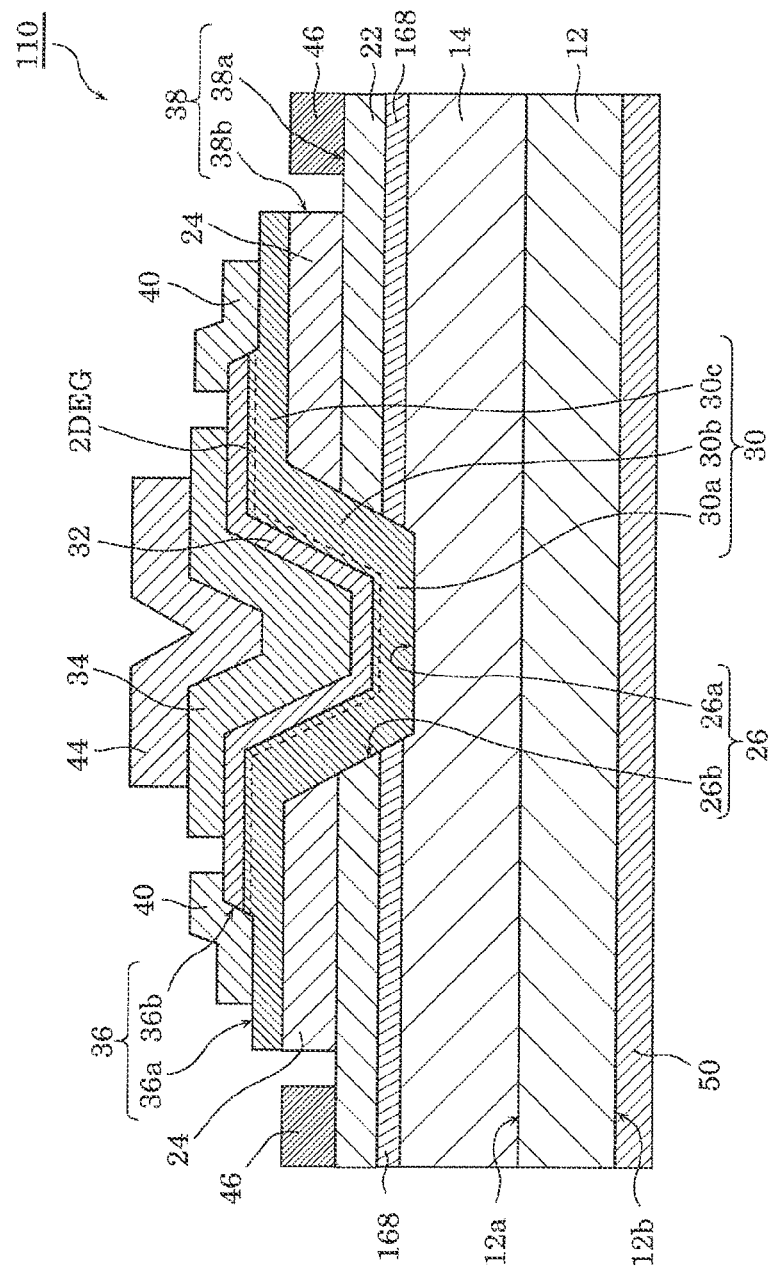
FIG. 6 is a cross-sectional view of a nitride semiconductor device according to Embodiment 2.

FIG. 6 is a cross-sectional view of nitride semiconductor device 110 according to the present embodiment. Specifically, similar to FIG. 3, FIG. 6 illustrates the cross-section corresponding to line III-III illustrated in FIG. 2. Note that the plane layout of nitride semiconductor device 110 is the same as, for example, the plane layout of nitride semiconductor device 10 according to Embodiment 1.

As illustrated in FIG. 6, compared with nitride semiconductor device 10, nitride semiconductor device 110 further includes high-resistance layer 168.

High-resistance layer 168 is an example of a second high-resistance layer disposed between drift layer 14 and block layer 22. High-resistance layer 168 has a higher resistance than either drift layer 14 or block layer 22. High-resistance layer 168 is formed from an insulating or semi-insulating nitride semiconductor. High-resistance layer 168 is, for example, a film formed from an undoped GaN having a thickness of 10 nm to tens of nm. High-resistance layer 168 is disposed to contact both drift layer 14 and block layer 22. High-resistance layer 168 is formed on drift layer 14 by crystal growth by, for example, the MOVPE method, etc.

In the present embodiment, high-resistance layer 168 is doped with carbon. Specifically, the C concentration of high-resistance layer 168 is higher than the C concentration of block layer 22 and the C concentration of drift layer 14. For example, the C concentration of high-resistance layer 168 is comparable to the C concentration of high-resistance layer 24.

Additionally, similar to high-resistance layer 24, Si or O mixed at the time of deposition may be included in high-resistance layer 168. In this case, the C concentration of high-resistance layer 168 is higher than the Si concentration or the O concentration. The C concentration of high-resistance layer 168 is, for example, $3 \times 10^{17}$ cm$^{-3}$ or more, but may be $1 \times 10^{18}$ cm$^{-3}$ or more. The Si concentration or O concentration of high-resistance layer 168 is, for example, $5 \times 10^{16}$ cm$^{-3}$ or less, but may be $2 \times 10^{16}$ cm$^{-3}$ or less.

Note that high-resistance layer 168 may be formed by ion implantation of magnesium (Mg), iron (Fe), or boron (B), etc., in addition to carbon. Other ionic species may be used as long as the ionic species can realize a high resistance in GaN.

According to the present embodiment, when nitride semiconductor device 110 is in a turn-on state, specifically when a positive bias (a potential higher than source electrode 40) is applied to gate electrode 44 and block layer 22, the current that flows from block layer 22 toward drain electrode 50 can be suppressed. This current causes the generation of an offset in the I-V curve representing the drain current-drain voltage characteristics, and causes power loss. According to the present embodiment, since this current can be suppressed, energy saving is realized.

Embodiment 3

Subsequently, Embodiment 3 will be described. In the following description, a description will be mainly given of differences from Embodiment 1 or Embodiment 2, and a description of common features will be omitted or simplified.

[Configuration]

First, using FIG. 7 to FIG. 10, a description will be given of the configuration of a nitride semiconductor device according to Embodiment 3.

Figure 7:
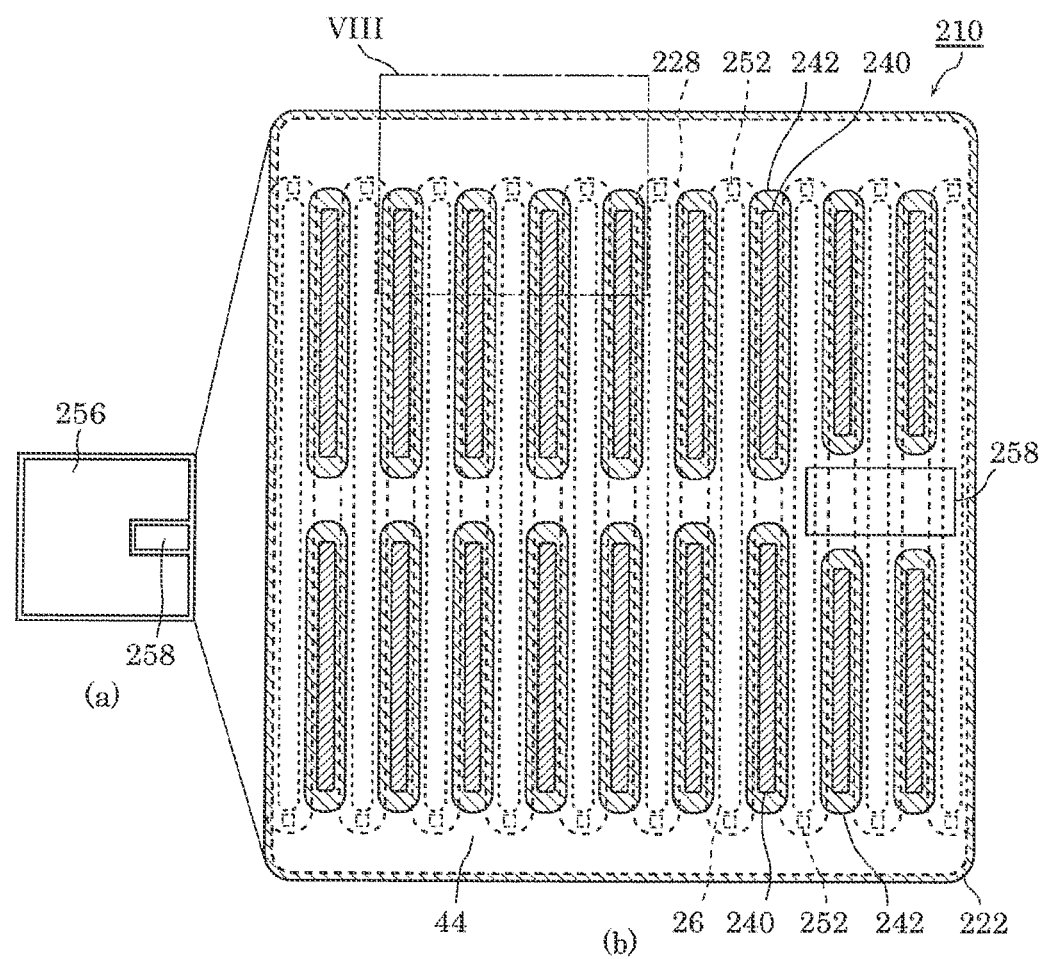
FIG. 7 is a plan view illustrating a plane layout of a nitride semiconductor device according to Embodiment 3.

FIG. 7 is a plan view illustrating the plane layout of nitride semiconductor device 210 according to the present embodiment as seen from the upper surface. (a) in FIG. 7 illustrates the pad layout of nitride semiconductor device 210. (b) in FIG. 7 illustrates the plane layout in the case where source electrode pad 256 of nitride semiconductor device 210 has been removed. In (b) in FIG. 7, the layout of the lower layer configuration is illustrated in the state where gate electrode pad 258 is transparent.

Figure 8:
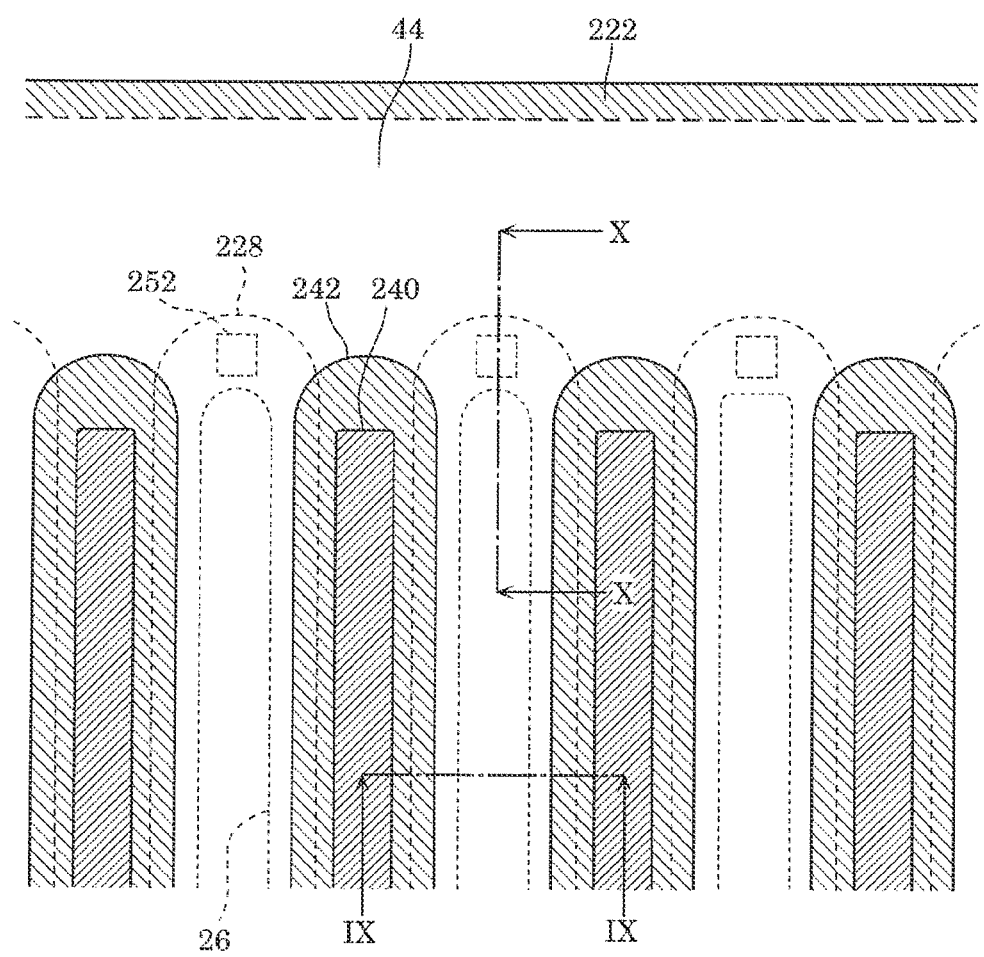
FIG. 8 is a diagram illustrating area VIII in FIG. 7 in an enlarged manner.

FIG. 8 is a diagram illustrating area VIII in FIG. 7 in an enlarged manner. In FIG. 7 and FIG. 8, in order to make the shapes comprehensible, diagonal hatching is given to source electrode 240 and insulating film 242. Additionally, diagonal hatching is also given to first base layer 222 exposed to the outermost circumference of nitride semiconductor device 210.

As illustrated in FIG. 7, nitride semiconductor device 210 includes a plurality of source electrodes 240 aligned and disposed in a plane. Each of the plane view shapes of the plurality of source electrodes 240 is a long rectangle in a predetermined direction. The plurality of source electrodes 240 are aligned and disposed along each of the longitudinal direction and the lateral direction in plan view. In the example illustrated in FIG. 7, two source electrodes 240 are aligned and disposed along the longitudinal direction (the vertical direction of the paper), and nine source electrodes 240 are aligned in the lateral direction (the horizontal direction of the paper). Note that the number and shape of source electrodes 240 are not limited to these.

As illustrated in FIG. 7, each of the plurality of source electrodes 240 are surrounded by gate electrode 44. Gate electrode 44 is a single plate-like electrode in which openings are provided at the positions corresponding to the plurality of source electrodes 240 in order to expose source electrodes 240. In plan view, gate electrode 44 and source electrodes 240 are disposed with distances between them, and do not overlap with each other.

In plan view, insulating film 242 is disposed between source electrode 240 and gate electrode 44. Insulating film 242 has an O shape (racetrack shape) that is long in the longitudinal direction of source electrode 240 in plan view.

In the present embodiment, gate opening 26 is disposed between source electrodes 240 aligned along the lateral direction in plan view. Gate opening 26 is located in the direction directly below gate electrode 44. The plane view shape of gate opening 26 is the shape that is long in the same direction as the longitudinal direction of source electrode 240, with both ends in the longitudinal direction being roundish. Gate opening 26 is located in the center between two adjacent source electrodes 240.

As illustrated in FIG. 7, high-resistance layer 228 is disposed so as to surround the outside of gate opening 26. Specifically, as represented by a broken line in FIG. 7, high-resistance layer 228 has an O shape that is long in the direction parallel to the longitudinal direction of source electrode 240. Note that, although high-resistance layer 228 has a predetermined width (the length in the direction parallel to substrate 12), in FIG. 7 and FIG. 8, this width of high-resistance layer 228 is not illustrated.

Note that the shapes of source electrode 240 and gate electrode 44 are not limited to the examples illustrated in FIG. 7. For example, the plane view shape of source electrode 240 may be a hexagon. The plurality of source electrodes 240 having a hexagon plane view shape may be arranged so that the center of each source electrode 240 is located at a vertex of a regular hexagon in a filling arrangement in plan view.

Figure 9:
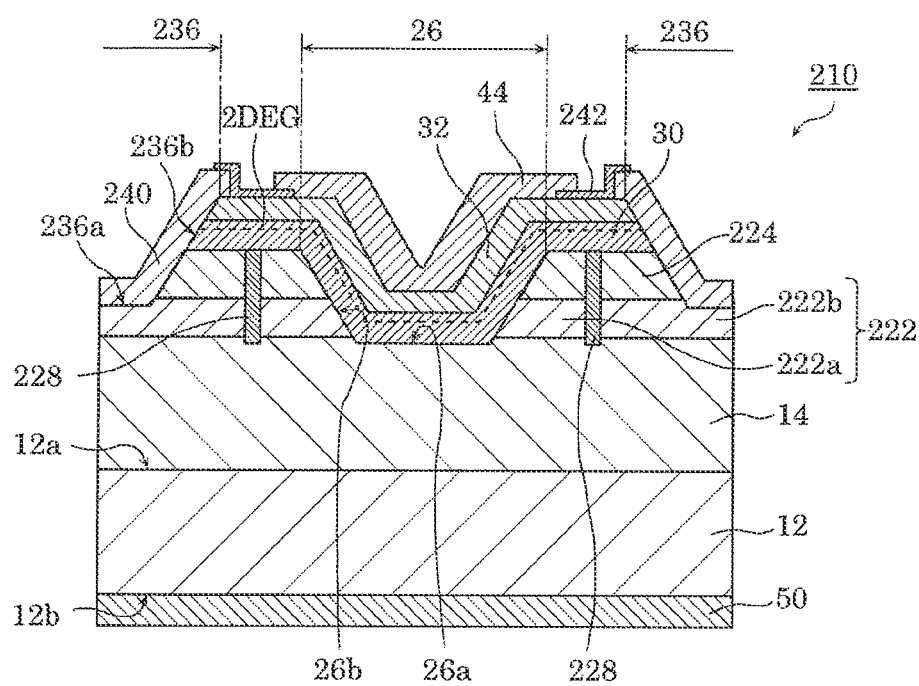
FIG. 9 is a cross-sectional view of the nitride semiconductor device according to Embodiment 3 at line IX-IX in FIG. 8.
Figure 10:
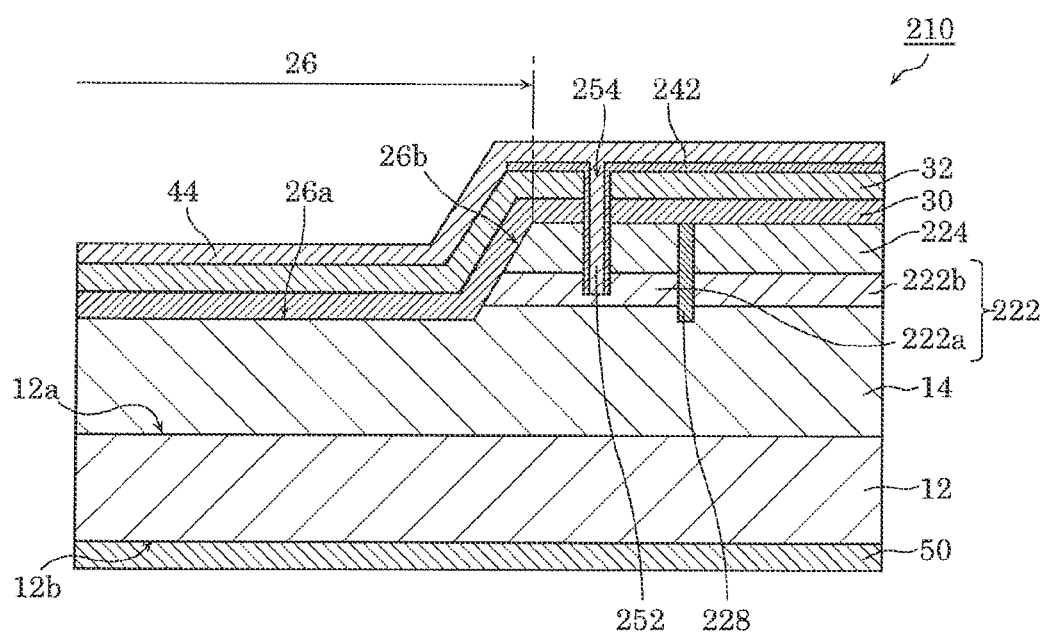
FIG. 10 is a cross-sectional view of the nitride semiconductor device according to Embodiment 3 at line X-X in FIG. 8.

FIG. 9 illustrates the cross-section of nitride semiconductor device 210 according to the present embodiment in line IX-IX in FIG. 8. FIG. 10 illustrates the cross-section of nitride semiconductor device 210 according to the present embodiment in line X-X in FIG. 8.

As illustrated in FIG. 9, nitride semiconductor device 210 includes substrate 12, drift layer 14, first base layer 222, second base layer 224, gate openings 26, high-resistance layers 228, electron transport layer 30, electron supply layer 32, source openings 236, source electrodes 240, insulating film 242, gate electrode 44, and drain electrode 50. Additionally, as illustrated in FIG. 10, nitride semiconductor device 210 includes contact plugs 252.

Hereinafter, details of each of the components includes in nitride semiconductor device 210 will be described. Note that, for configurations substantially the same as those in Embodiment 1, such as substrate 12, drift layer 14, gate opening 26, electron transport layer 30, electron supply layer 32, gate electrode 44, and drain electrode 50, a description thereof will be omitted or simplified.

First base layer 222 includes gate connection 222a and source connection 222b. Gate connection 222a is an example of a first portion of first base layer 222 that is closer to gate opening 26 than high-resistance layer 228 in plan view. Source connection 222b is an example of a second portion of first base layer 222 that is closer to source electrode 240 than high-resistance layer 228 in plan view. Gate connection 222a and source connection 222b are electrically insulated by high-resistance layer 228.

Gate connection 222a is fixed to a potential different from the potential (hereinafter described as the source potential) given to source electrode 240. Specifically, gate connection 222a is fixed to the potential given to gate electrode 44. As illustrated in FIG. 10, contact plug 252 extending from gate electrode 44 is connected to gate connection 222a. A gate potential is given to gate connection 222a via contact plug 252.

Source connection 222b is fixed to the source potential. Specifically, as illustrated in FIG. 9, source connection 222b is exposed in source opening 236, and the exposed portion contacts source electrode 240. Accordingly, the source potential is given to source connection 222b.

High-resistance layer 228 separates first base layer 222 into gate connection 222a near gate opening 26, and source connection 222b near source opening 236. In the present embodiment, as illustrated in FIG. 9 and FIG. 10, high-resistance layer 228 further separates second base layer 224 into a portion near gate opening 26, and a portion near source opening 236.

Specifically, high-resistance layer 228 penetrates first base layer 222 from second base layer 224, and reaches up to drift layer 14. The upper surface of high-resistance layer 228 is flush with the upper surface of second base layer 224. Additionally, the bottom surface of high-resistance layer 228 is located below the interface between first base layer 222 and drift layer 14. Note that high-resistance layer 228 may separate only first base layer 222. For example, the upper surface of high-resistance layer 228 may be flush with the interface between first base layer 222 and second base layer 224, and may be located above the interface and within second base layer 224.

In the present embodiment, high-resistance layer 228 is located in the direction directly below the interval between gate electrode 44 and source electrode 240, specifically, the direction directly below insulating film 242. For example, when seen in the cross-section illustrated in FIG. 9, in the direction parallel to substrate 12, high-resistance layer 228 is located in the center between the ends of bottom surface 26a of gate opening 26 and bottom surface 236a of source opening 236. Note that the end of bottom surface 26a is the intersection portion of bottom surface 26a and side surface 26b. The end of bottom surface 236a is the intersection portion of bottom surface 236a and side surface 236b.

High-resistance layer 228 may be disposed at a position closer to gate opening 26 than the center between the ends of bottom surface 26a and bottom surface 236a. For example, the upper surface of high-resistance layer 228 may be exposed in side surface 26b of gate opening 26. Alternatively, high-resistance layer 228 may be disposed at a position closer to source opening 236 than the center between the ends of bottom surface 26a and bottom surface 236a. For example, the upper surface of high-resistance layer 228 may be exposed in side surface 236b of source opening 236.

High-resistance layer 228 has a higher resistance value than first base layer 222. In the present embodiment, high-resistance layer 228 has a higher resistance value than second base layer 224. High-resistance layer 228 is formed from, for example, an insulating or semi-insulating nitride semiconductor. In the present embodiment, high-resistance layer 228 includes iron (Fe). High-resistance layer 228 is doped with, for example, iron, and formed from a high-resistance GaN. Note that high-resistance layer 228 may not be formed by using a nitride semiconductor, and may be formed by using other materials with insulating properties.

Source opening 236 is an example of a second opening that penetrates electron supply layer 32 and electron transport layer 30, and reaches up to first base layer 222 at a position distant from gate opening 26. Specifically, source opening 236 penetrates electron supply layer 32, electron transport layer 30, and second base layer 224 in this order, and reaches up to first base layer 222. In the present embodiment, as illustrated in FIG. 9, bottom surface 236a of source opening 236 is the upper surface of first base layer 222. Bottom surface 236a is located below the interface between first base layer 222 and second base layer 224.

As illustrated in FIG. 9, source opening 236 is formed such that further away from substrate 12, the larger the opening area. Specifically, side surfaces 236b of source opening 236 are inclined at an angle. For example, the cross-sectional shape of source opening 236 is an inverted trapezoid, more specifically, an inverted isosceles trapezoid. Note that the cross-sectional shape of source opening 236 may be a substantially rectangle. In other words, source opening 236 may have a substantially uniform opening area irrespective of the distance from substrate 12.

The tilt angle of side surface 236b with respect to bottom surface 236a is, for example, in the range of 20° or more to 80° or less. The tilt angle may be in the range of 30° or more to 60° or less. For example, the tilt angle of side surface 236b of source opening 236 is greater than the tilt angle of side surface 26b of gate opening 26. Since side surface 236b is inclined at an angle, the contact area between source electrode 240 and electron transport layer 30 (the two-dimensional electron gas) is increased. Thus, ohmic connection is easily made.

Source electrode 240 is disposed in source opening 236, and is connected to electron transport layer 30 and electron supply layer 32. Specifically, source electrode 240 is disposed so as to cover side surfaces 236b of source opening 236.

Source electrode 240 is connected to first base layer 222. Specifically, source electrode 240 is connected to respective end surfaces of electron supply layer 32, electron transport layer 30, and second base layer 224, and to source connection 222b. Source electrode 240 is ohmically connected to electron transport layer 30 and electron supply layer 32. Source electrode 240 is connected to the two-dimensional electron gas in electron transport layer 30 in side surface 236b of source opening 236.

Source electrode 240 is formed by using a conductive material such as a metal. For example, a material that is ohmically connected to an n-type semiconductor layer, such as Ti/Al, may be used as a material of source electrode 240.

Additionally, Al is Schottky-connected to first base layer 222 that is formed from a p-type nitride semiconductor. Therefore, a metal material having a large work function such as Pd or Ni, which serves as a low contact resistance for the p-type nitride semiconductor, may be disposed in a lower layer portion of source electrode 240. Accordingly, the potential of first base layer 222 can be more stabilized.

Insulating film 242 is disposed on and contacts electron supply layer 32. As illustrated in FIG. 9, insulating film 242 covers an end surface of a portion of source electrode 240 that is outside of source opening 236. Insulating film 242 is disposed for preventing source electrode 240 and gate electrode 44 from being physically and electrically connected to each other.

In the present embodiment, as illustrated in FIG. 9 and FIG. 10, insulating film 242 is located between gate electrode 44 and electron supply layer 32. Insulating film 242 covers side surfaces of contact plug 252. This suppresses contact plug 252, electron transport layer 30, and electron supply layer 32 from being electrically connected to each other.

Insulating film 242 is formed by using a material with insulating properties. Insulating film 242 is a film formed from, for example, silicon oxide or silicon nitride having a thickness of 100 nm.

Source electrode pad 256 is electrically connected to each of the plurality of source electrodes 240. Source electrode pad 256 is disposed above each of the plurality of source electrodes 240. A plurality of conductive contact plugs (not illustrated) are disposed at the positions corresponding to the plurality of source electrodes 240, respectively, in the direction directly below source electrode pad 256. Source electrode pad 256 is electrically connected to each of the plurality of source electrodes 240 via the contact plug.

Source electrode pad 256 is, for example, grounded. In other words, 0 V is applied to source electrode pad 256. The potential applied to source electrode pad 256 is given to source connection 222b of first base layer 222 via source electrode 240.

Gate electrode pad 258 is electrically connected to gate electrode 44. Gate electrode pad 258 is, for example, disposed above gate electrode 44. A contact plug (not illustrated) is disposed in the direction directly below gate electrode pad 258. Gate electrode pad 258 is electrically connected to gate electrode 44 via the contact plug.

In the present embodiment, gate electrode 44 is disposed in a flat plate shape in a plane. Therefore, gate electrode pad 258 may not be disposed in the entire surface of nitride semiconductor device 210, and may be disposed only in apart of nitride semiconductor device 210. For example, as illustrated in FIG. 7, gate electrode pad 258 is disposed along one side of nitride semiconductor device 210, and in a center portion of the one side. Source electrode pad 256 is disposed so as to surround gate electrode pad 258.

Note that the number and position of gate electrode pad 258 are not particularly limited. For example, one gate electrode pad 258 may be disposed in the center of nitride semiconductor device 210, or two gate electrode pads 258 may be disposed along two opposing sides of nitride semiconductor device 210.

A power supply for controlling gate electrode 44 is connected to gate electrode pad 258. When turning nitride semiconductor device 210 into a turn-on state, a positive potential (for example, +5 V) is applied to gate electrode pad 258. When turning nitride semiconductor device 210 into a turn-off state, an ground potential (0 V) or a negative potential is applied to gate electrode pad 258. The potential applied to gate electrode pad 258 is given to gate connection 222a of first base layer 222 via gate electrode 44 and contact plug 252.

As described above, in nitride semiconductor device 210 according to the present embodiment, the interface between electron transport layer 30 and electron supply layer 32 serves as a hetero interface of AlGaN/GaN. Accordingly, the two-dimensional electron gas is generated in electron transport layer 30, and a channel is formed. Since the carrier concentration of the two-dimensional electron gas is high, the mobility of the channel becomes high, and the on-resistance is reduced.

Additionally, in the present embodiment, first base layer 222 is separated into gate connection 222a and source connection 222b by high-resistance layer 228. Since gate connection 222a is electrically connected to gate electrode 44, gate connection 222a is fixed to the gate potential.

Therefore, when nitride semiconductor device 210 is in the turn-off state, since the gate potential is 0 V or a negative potential, a depletion layer extends from gate connection 222a to electron transport layer 30. Therefore, the leakage current flowing through the channel is suppressed, and stable turn-off characteristics can be obtained.

On the other hand, when nitride semiconductor device 210 is in the turn-on state, the gate potential is a positive potential, and gate connection 222a is positively biased. Therefore, the depletion layer that has extended to electron transport layer 30 side shrinks, and it becomes possible to pass a drain current without narrowing the current path. As a result, it becomes possible to realize a field-effect transistor that can achieve both stable turn-off characteristics and a high current.

Additionally, source connection 222b is fixed to the source potential, irrespective of the operational state of nitride semiconductor device 210. The source potential is lower than the potential given to drain electrode 50, and is, for example, 0 V. Therefore, since a reverse bias is given to p-type source connection 222b and n-type drift layer 14 by source connection 222b and drain electrode 50, the depletion layer extends to the drift layer 14 side. Accordingly, the source-drain breakdown voltage can be increased.

[Manufacturing Method]

Subsequently, using FIG. 11A to FIG. 11I, a description will be given of the manufacturing method of nitride semiconductor device 210 according to the present embodiment. FIG. 11A to FIG. 11I are cross-sectional views illustrating each process of the manufacturing method of nitride semiconductor device 210 according to the present embodiment.

Hereinafter, a case will be described where each nitride semiconductor layer constituting nitride semiconductor device 210 is deposited by the metal organic vapor phase epitaxy (MOVPE) method. Note that the deposition method of the nitride semiconductor layer is not limited to this, and the nitride semiconductor layer may be deposited by, for example, the molecular beam epitaxy (MBE) method.

Additionally, an n-type nitride semiconductor is formed by, for example, adding silicon (Si). A p-type nitride semiconductor is formed by adding magnesium (Mg). Note that an n-type impurity and a p-type impurity are not limited to these.

Figure 11A:
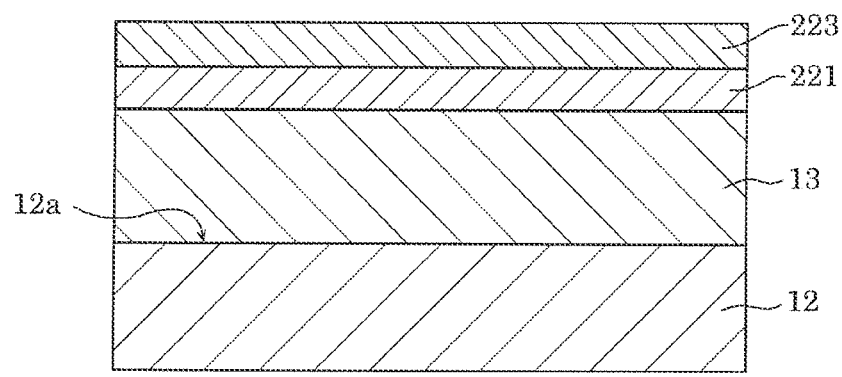
FIG. 11A is a cross-sectional view illustrating a laminating process of a nitride semiconductor in a manufacturing method of the nitride semiconductor device according to Embodiment 3.

First, substrate 12 formed from an n-type GaN whose first principal surface 12a is (0001) surface, i.e., the c surface, is prepared. As illustrated in FIG. 11A n-type GaN film 13 to which Si is added as an n-type impurity, p-type GaN film 221 to which Mg is added as a p-type impurity and undoped GaN film 223 are deposited on first principal surface 12a of substrate 12 in this order. Note that n-type GaN film 13, p-type GaN film 221, and undoped GaN film 223 are patterned into predetermined shapes to be drift layer 14, first base layer 222, and second base layer 224, respectively, illustrated in FIG. 9 and FIG. 10.

The thickness and carrier concentration of each layer are, for example, as follows. N-type GaN film 13 has a thickness of 8 μm, and the carrier concentration of $1\times10^{16}$ cm$^{-3}$. P-type GaN film 221 has a thickness of 400 nm, and the carrier concentration of $1\times10^{17}$ cm$^{-3}$. Undoped GaN film 223 has a thickness of 200 nm. Note that these numerical value are merely examples.

Figure 11B:
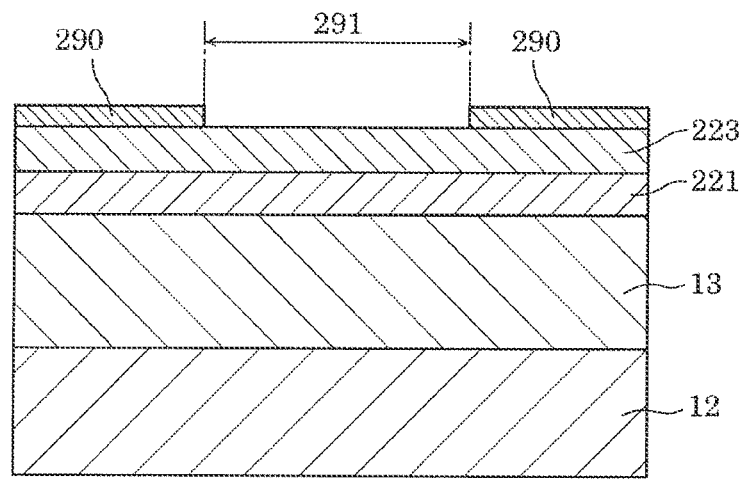
FIG. 11B is a cross-sectional view illustrating a patterning process of a resist in the manufacturing method of the nitride semiconductor device according to Embodiment 3.

As illustrated in FIG. 11B, resist mask 290 is formed by applying a resist on undoped GaN film 223, and patterning the applied resist by photolithography. Resist mask 290 is a mask for forming gate opening 26, and has opening 291 corresponding to the plane view shape of gate opening 26.

Figure 11C:
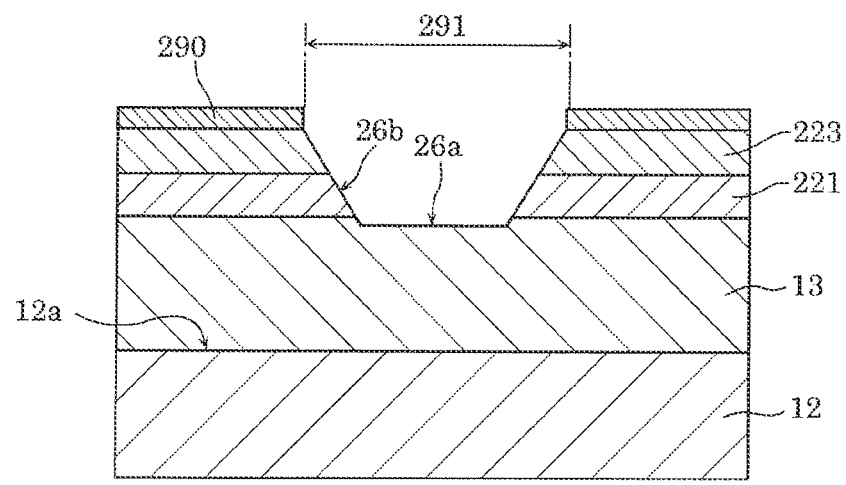
FIG. 11C is a cross-sectional view illustrating a formation process of a gate opening in the manufacturing method of the nitride semiconductor device according to Embodiment 3.

Next, as illustrated in FIG. 11C, gate opening 26 is formed by dry etching. Gate opening 26 penetrates undoped GaN film 223 and p-type GaN film 221, and n-type GaN film 13 is exposed. At this time, bottom surface 26a of gate opening 26 is parallel to first principal surface 12a of substrate 12. Side surfaces 26b of gate opening 26 are inclined with respect to bottom surface 26a at a predetermined tilt angle. Accordingly, since a re-growth layer can be formed on side surfaces 26b with a uniform thickness, the narrowing of a channel is suppressed, and both the decrease in the carrier concentration and the increase in the on-resistance can be suppressed.

Figure 11D:
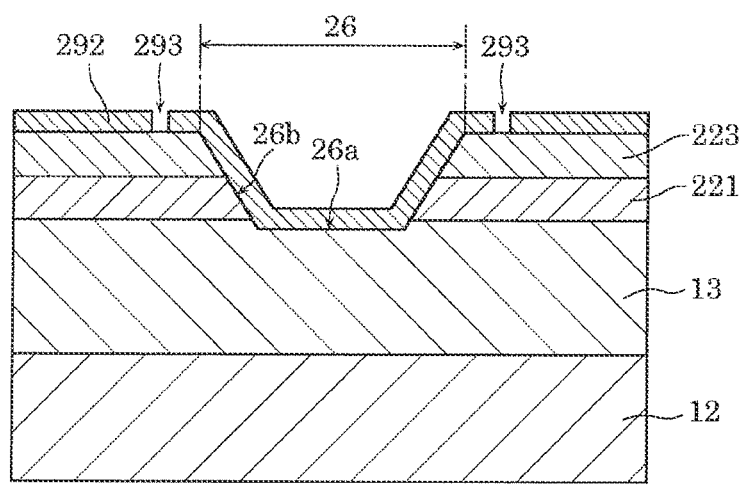
FIG. 11D is a cross-sectional view illustrating a patterning process of a resist for masking at the time of ion implantation in the manufacturing method of the nitride semiconductor device according to Embodiment 3.

Next, after removing resist mask 290, the resist is applied again on undoped GaN film 223 and in gate opening 26. As illustrated in FIG. 11D, resist mask 292 is formed by patterning the applied resist by photolithography.

Resist mask 292 is a mask for forming high-resistance layer 228. Resist mask 292 is disposed on a part of undoped GaN film 223, and bottom surface 26a and side surfaces 26b of gate opening 26. Resist mask 292 includes openings 293 corresponding to the plane view shape of high-resistance layer 228. Openings 293 expose a part of the upper surface of undoped GaN film 223.

Figure 11E:
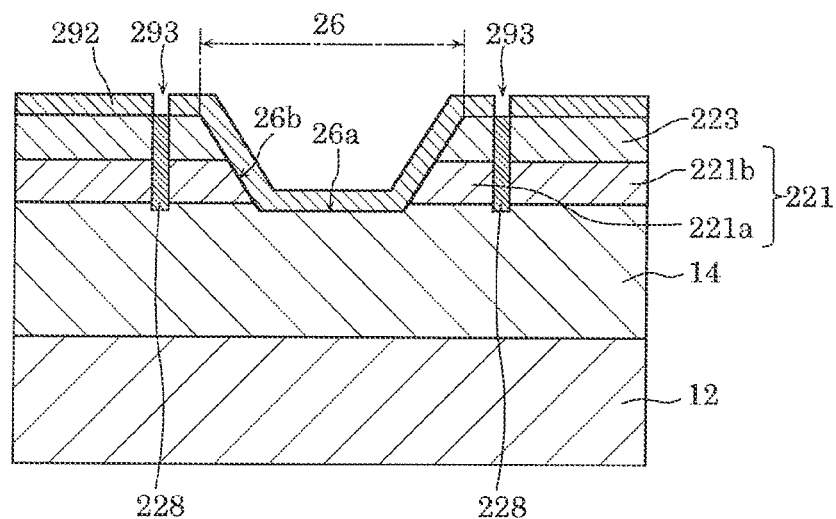
FIG. 11E is a cross-sectional view illustrating an ion implantation process in the manufacturing method of the nitride semiconductor device according to Embodiment 3.

Next, by performing the ion implantation of iron ions into the portions exposed in openings 293 of resist mask 292, high-resistance layer 228 is formed as illustrated in FIG. 11E. High-resistance layer 228 is a layer in which iron has been doped to portions of each of undoped GaN film 223, p-type GaN film 221, and n-type GaN film 13 that are exposed in openings 293.

By formation of high-resistance layer 228, p-type GaN film 221 is separated into first p-type GaN film 221a near gate opening 26, and second p-type GaN film 221b near source opening 236. First p-type GaN film 221a and second p-type GaN film 221b become gate connection 222a and source connection 222b by being patterned into predetermined shapes, respectively.

The injection conditions of ion implantation are, for example, accelerating energy of 40 keV, and the dose amount of $1\times10^{14}$ cm$^{-2}$. Accordingly, high-resistance layer 228 having a thickness of about 50 nm is formed. The resistance of the area where iron ions have been injected, i.e., high-resistance layer 228, is increased, since the crystal structure is destroyed.

At this time, instead of iron ions, ions of a metal having a high atomic number, such as titanium ions, chromium ions, copper ions, or nickel ions, may be utilized. Accordingly recrystallization of high-resistance layer 228 by heating processing in the subsequent process can be suppressed, and the resistance value of high-resistance layer 228 becomes small.

Figure 11F:
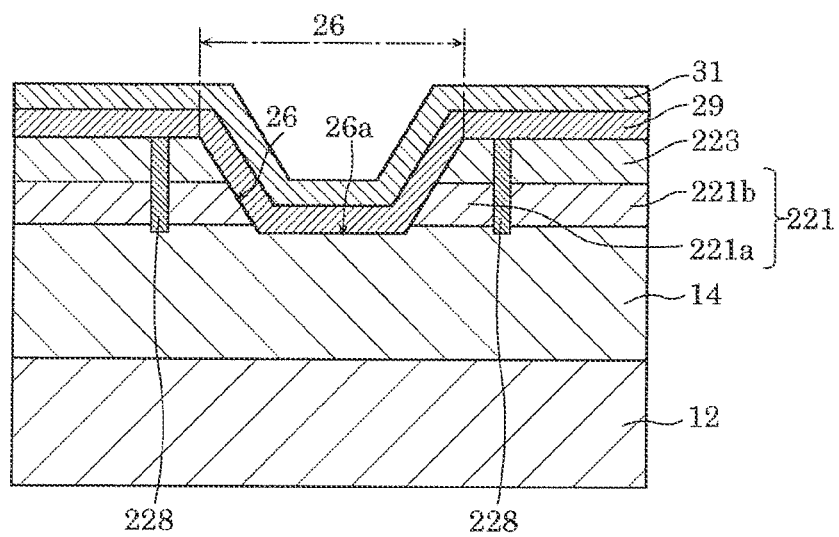
FIG. 11F is a cross-sectional view illustrating a re-growing process of the nitride semiconductor in the manufacturing method of the nitride semiconductor device according to Embodiment 3.

Next, after removing resist mask 292, as illustrated in FIG. 11F, undoped GaN film 29, undoped AlN film (not illustrated), and undoped AlGaN film 31 are deposited in this order on the entire surface of gate opening 26 along the shape of gate opening 26 by the MOVPE method. Undoped GaN film 29 and undoped AlGaN film 31 become electron transport layer 30 and electron supply layer 32 by being patterned into predetermined shapes, respectively.

The thickness of each layer is substantially uniform, and is, for example, as follows. Undoped GaN film 29 has a thickness of 100 nm. Undoped AlN film has a thickness of 1 nm. Undoped AlGaN film 31 has a thickness of 50 nm. Note that these numerical values are merely examples.

Figure 11G:
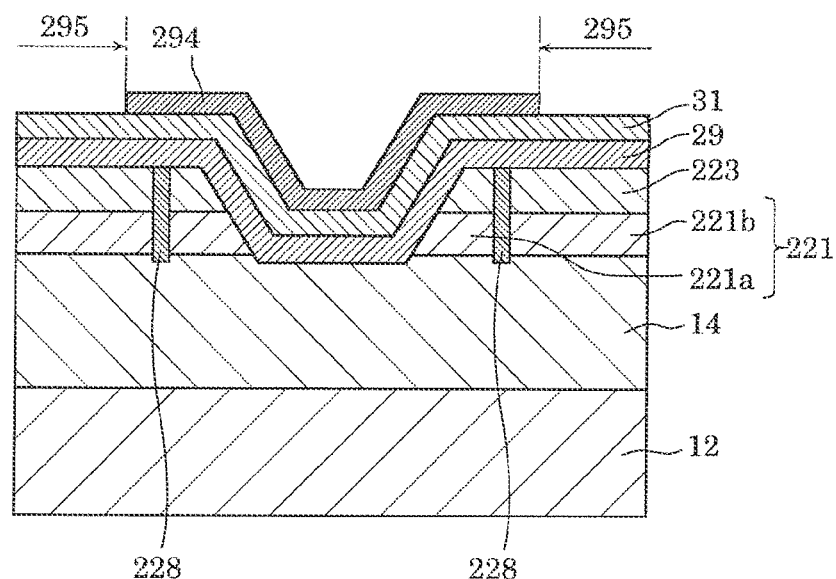
FIG. 11G is a cross-sectional view illustrating a patterning process of a resist for a source opening in the manufacturing method of the nitride semiconductor device according to Embodiment 3.

Next, the resist is applied again on undoped AlGaN film 31, and in gate opening 26. As illustrated in FIG. 11G, resist mask 294 is formed by patterning the applied resist by photolithography. Resist mask 294 is a mask for forming source opening 236, and includes opening 295 corresponding to the plane view shape of source opening 236.

Figure 11H:
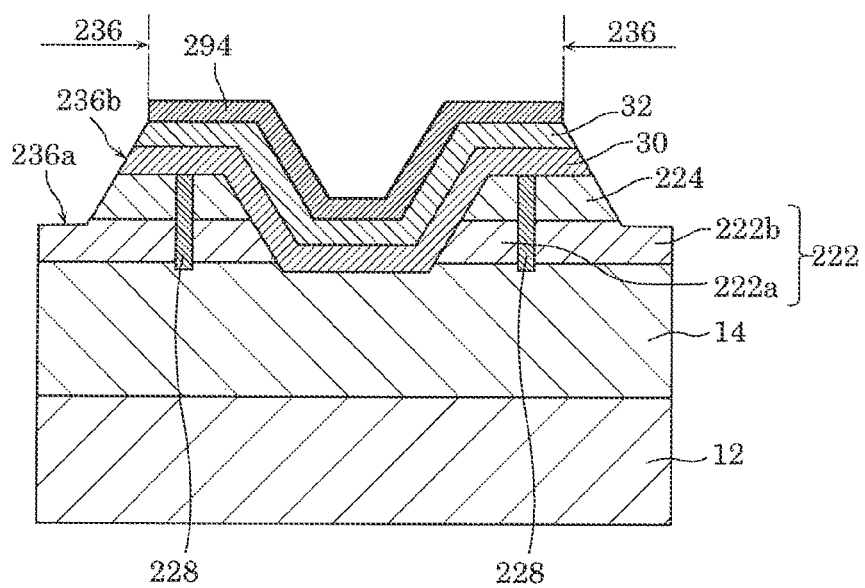
FIG. 11H is a cross-sectional view illustrating a formation process of the source opening in the manufacturing method of the nitride semiconductor device according to Embodiment 3.

Next, as illustrated in FIG. 11H, source opening 236 is formed by dry etching. Additionally, simultaneously with the formation of source opening 236, as illustrated in FIG. 10, opening 254 for forming contact plug 252 is formed. Each of source openings 236 and openings 254 penetrates undoped AlGaN film 31, undoped AlN film (not illustrated), undoped GaN film 29, and undoped GaN film 223, and p-type GaN film 221 is exposed. At this time, bottom surface 236a of source opening 236 is parallel to first principal surface 12a of substrate 12. Side surfaces 236b of source opening 236 are inclined with respect to bottom surface 236a at a predetermined tilt angle. Note that opening 254 may be formed at a timing different from the timing of source opening 236.

Electron supply layer 32, electron transport layer 30, second base layer 224, and first base layer 222 are formed by patterning undoped AlGaN film 31, undoped GaN film 29, undoped GaN film 223, and p-type GaN film 221, respectively.

Next, source electrode 240 is formed by depositing a source metal film formed from Ti and Au on a part of the upper surface of electron supply layer 32, and on side surfaces 236b and bottom surface 236a of source opening 236 by the vapor-deposition method or the spattering method, and by patterning the source metal film.

Subsequently, insulating film 242 is formed by depositing an insulating film formed from $SiO_2$ on the upper surface of electron supply layer 32 by the CVD method, etc., and patterning the insulating film. Note that insulating film 242 may cover source electrode 240.

Additionally, as illustrated in FIG. 10, insulating film 242 is disposed so as to cover the internal surfaces of opening 254. At this time, insulating film 242 adhering to the bottom surface of opening 254 is removed by patterning, so that the bottom surface of opening 254 is exposed.

Figure 11I:
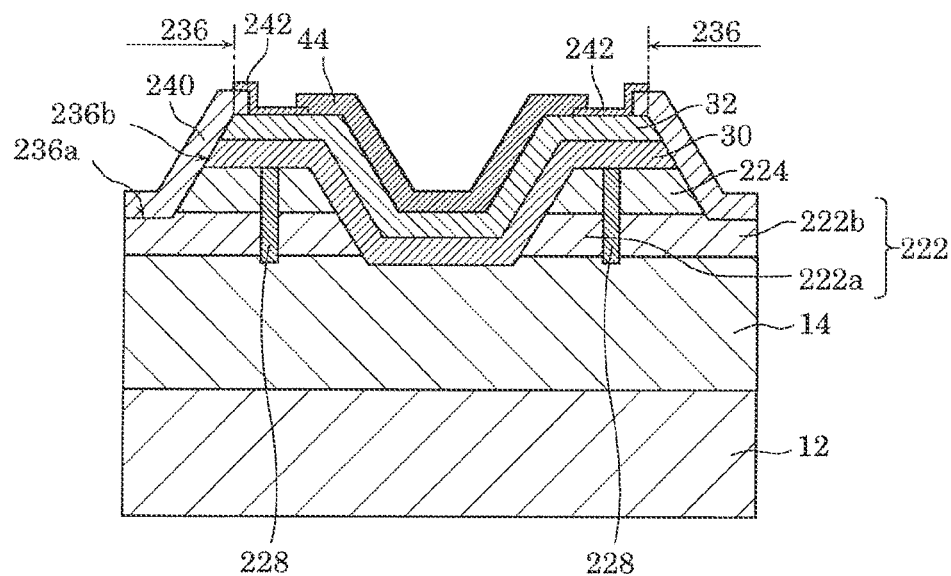
FIG. 11I is a cross-sectional view illustrating a formation process of a gate electrode and a source electrode in the manufacturing method of the nitride semiconductor device according to Embodiment 3.

Next, a gate metal film formed from Pd is deposited by the vapor-deposition method or the spattering method, so as to cover gate opening 26. As illustrated in FIG. 11I, gate electrode 44 is formed by patterning the deposited gate metal film. Note that gate electrode 44 may cover insulating film 242. Additionally, as illustrated in FIG. 10, contact plug 252 is formed by filling the inside of opening 254 with the deposited metal film. Contact plug 252 physically and electrically connects gate electrode 44 to gate connection 222a of first base layer 222.

Further, drain electrode 50 is formed by depositing a drain metal film formed from Ti and Al on second principal surface 12b of substrate 12 by the vapor-deposition method or the spattering method, and patterning the drain metal film as necessary.

Through the above processes, nitride semiconductor device 210 illustrated in FIG. 9 and FIG. 10 is formed.

Note that an insulating film is deposited after forming gate electrode 44 and source electrode 240. Contact holes from which a part of each of the plurality of source electrodes 240 and a part of gate electrode 44 are exposed are formed in the deposited insulating film. Thereafter, source electrode pad 256 and gate electrode pad 258 are formed by depositing and patterning a metal film.

[Modification 1]

Here, using FIG. 12, a description will be given of Modification 1 of nitride semiconductor device 210 according to Embodiment 3.

Figure 12:
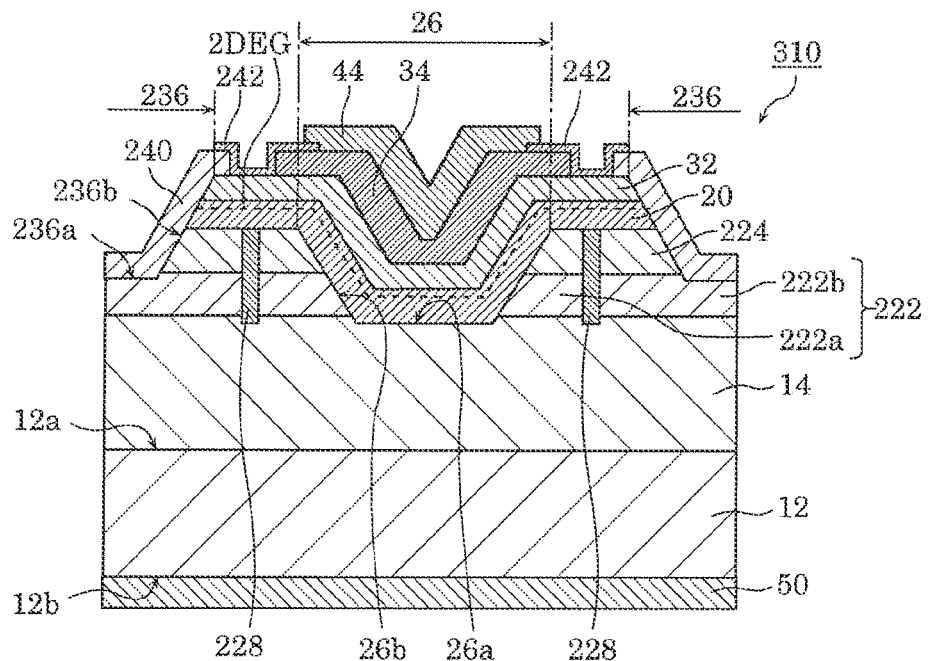
FIG. 12 is a cross-sectional view of a nitride semiconductor device according to Modification 1 of Embodiment 3.

FIG. 12 is a cross-sectional view of nitride semiconductor device 310 according to the present modification. As illustrated in FIG. 12, compared with nitride semiconductor device 210 illustrated in FIG. 9, nitride semiconductor device 310 is different in that threshold adjustment layer 34 is included. Hereinafter, a description will be mainly given of differences from Embodiments 1 to 3, and a description of common features will be omitted or simplified.

Threshold adjustment layer 34 is the same as threshold adjustment layer 34 according to Embodiment 1. In the present modification, when substrate 12 is viewed in plan view, the ends of threshold adjustment layer 34 are located at positions closer to source electrode 240 than the ends of gate electrode 44. Threshold adjustment layer 34 and source electrode 240 are separated from each other, and do not contact each other.

As illustrated in FIG. 12, insulating film 242 is formed so as to cover source electrode 240, electron supply layer 32, and threshold adjustment layer 34. Insulating film 242 covers an end of threshold adjustment layer 34, and the portion covering the end is covered by gate electrode 44. In other words, a part of insulating film 242 is located between threshold adjustment layer 34 and gate electrode 44. Note that insulating film 242 may be disposed so as to cover an end of gate electrode 44.

According to the present modification, the potential of a conduction band edge of a channel portion is raised by threshold adjustment layer 34. Therefore, the threshold voltage of nitride semiconductor device 310 can be increased. Accordingly, nitride semiconductor device 310 can be realized as a normally-off type FET.

[Modification 2]

Subsequently, using FIG. 13, a description will be given of Modification 2 of nitride semiconductor device 210 according to Embodiment 3.

Figure 13:
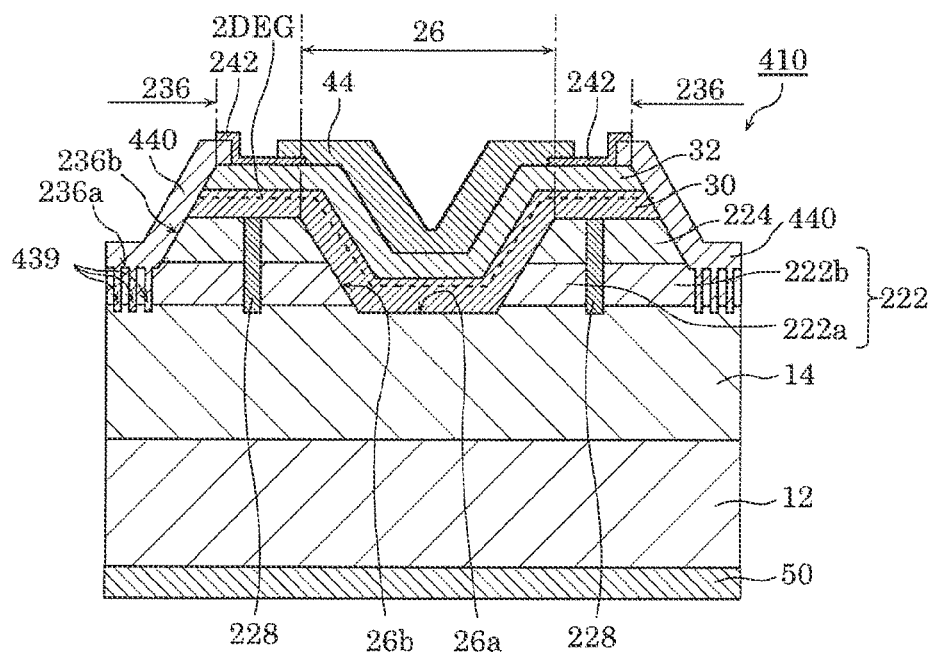
FIG. 13 is a cross-sectional view of a nitride semiconductor device according to Modification 2 of Embodiment 3.

FIG. 13 is a cross-sectional view of nitride semiconductor device 410 according to the present modification. As illustrated in FIG. 13, in the present modification, compared with nitride semiconductor device 210 illustrated in FIG. 9, the configuration of source electrode 240 is different. Hereinafter, a description will be mainly given of differences from Embodiment 3, and a description of common features will be omitted or simplified.

Nitride semiconductor device 410 includes source electrode 440 instead of source electrode 240. Further, nitride semiconductor device 410 includes a plurality of openings 439.

The plurality of openings 439 are disposed in bottom surface 236a of source opening 236. The plurality of openings 439 are examples of third openings that penetrate first base layer 222, and reaches up to drift layer 14. The bottom surfaces of openings 439 are below the interface between drift layer 14 and first base layer 222. In the present modification, six openings (three on each of the left and right sides) 439 are disposed in one bottom surface 236a.

The plurality of openings 439 have the same configuration as each other. For example, the cross-sectional shape of opening 439 is a substantially rectangle. In other words, opening 439 may have a substantially uniform opening area irrespective of the distance from substrate 12. Alternatively, the cross-sectional shape of opening 439 may be an inverted trapezoid.

The plurality of openings 439 are formed by removing a part of source connection 222b of first base layer 222 after forming source opening 236, and before forming source electrode 440. For example, the plurality of openings 439 are formed by patterning by photolithography, and dry etching, etc.

When seen in the cross-section illustrated in FIG. 13, the widths (that is, the lengths in the direction horizontal to substrate 12) of the plurality of openings 439 are, for example, equal to the distance between adjacent openings 439. Additionally, the width of each of the plurality of openings 439 is equal to each other. Note that the sizes and positions of openings 439 are not particularly limited.

Similar to source electrode 240, source electrode 440 is disposed so as to contact bottom surface 236a of source opening 236, and to cover side surface 236b. Further, source electrode 440 is disposed in each of the plurality of openings 439 formed in first base layer 222, and is connected to drift layer 14. Specifically, a part of source electrode 440 is disposed so as to fill each of the plurality of openings 439.

Specifically, source electrode 440 is connected to the respective end surfaces of electron supply layer 32, electron transport layer 30, and second base layer 224. Source electrode 440 is ohmically connected to electron transport layer 30 and electron supply layer 32.

According to this configuration, in the direction directly below source opening 236, an MPS diode is formed that includes a pn diode formed by drift layer 14 formed from an n-type GaN, and first base layer 222 formed from a p-type GaN, and a Schottky barrier diode formed by source electrode 440 and first base layer 222 formed from a p-type GaN on the bottom surface of opening 439. The MPS diode has the advantages of both the pn diode and the Schottky barrier diode, is excellent in high breakdown voltage characteristics, and can realize a low operating voltage.

The MPS diode is formed in parallel with a field-effect transistor. In other words, the MPS diode functions as a reflux diode for protecting the field-effect transistor. Accordingly, since the rising voltage can be lowered while maintaining a high breakdown voltage at the time of a reverse bias, the loss due to the reflux current that flows through the MPS diode can be made small.

Note that the present modification illustrates the example in which the plurality of openings 439 are disposed in bottom surface 236a of one source opening 236, but is not limited to this. Only one opening 439 may be disposed in bottom surface 236a.

Embodiment 4

Subsequently, using FIG. 14 to FIG. 18, a description will be given of the configuration of a nitride semiconductor device according to Embodiment 4. In the following description, a description will be mainly given of differences from Embodiments 1 to 3, and a description of common features will be omitted or simplified.

Figure 14:
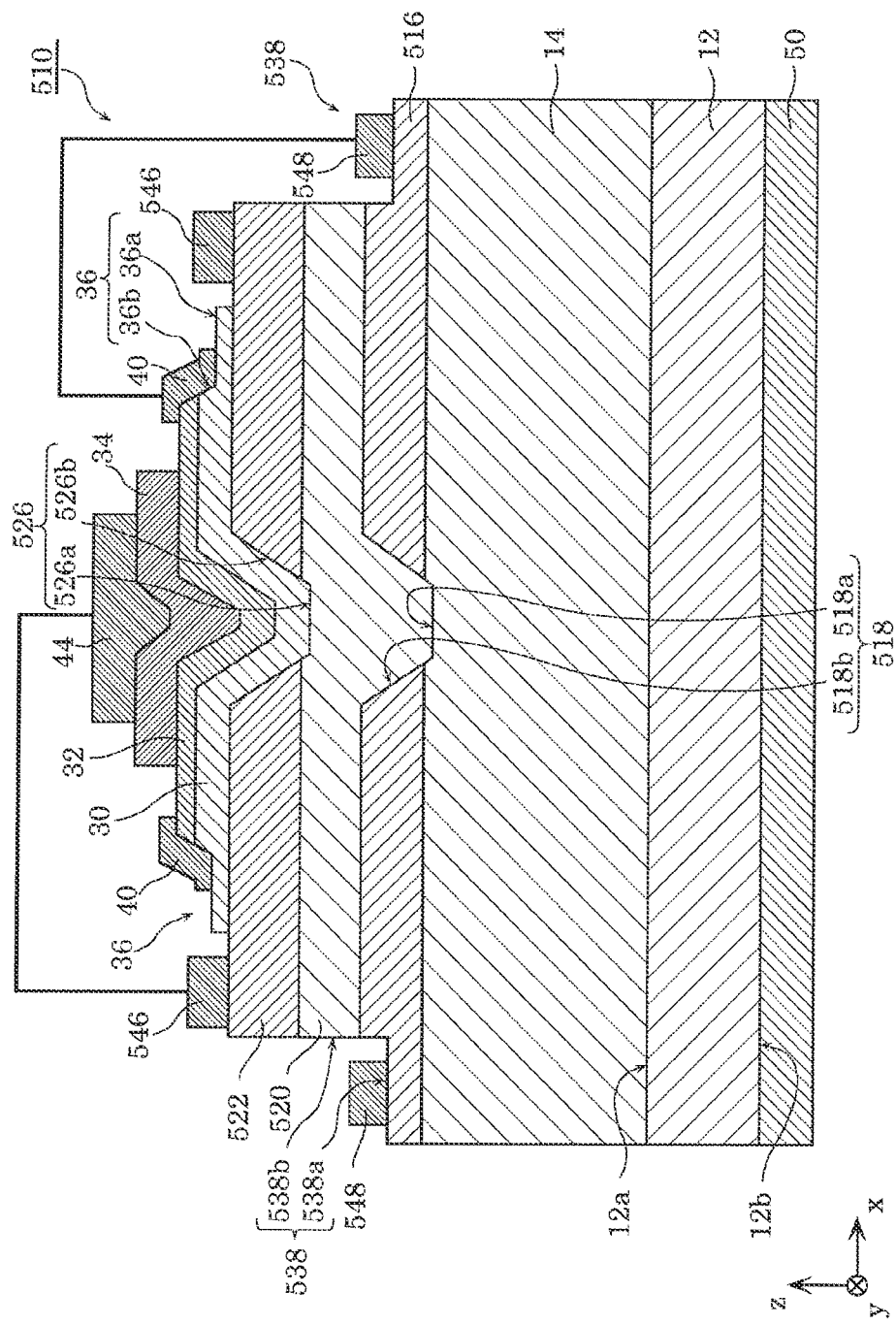
FIG. 14 is a cross-sectional view of a nitride semiconductor device according to Embodiment 4.
Figure 15:
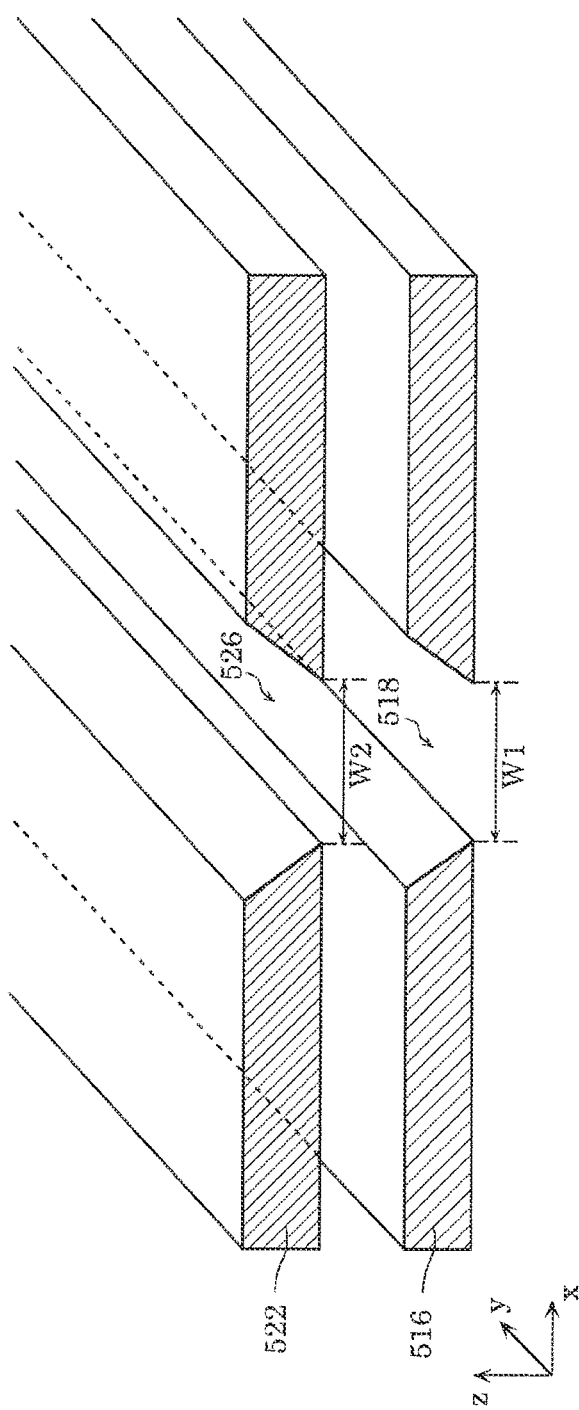
FIG. 15 is a cross-sectional perspective view illustrating a layout of two openings of the nitride semiconductor device according to Embodiment 4.
Figure 16:
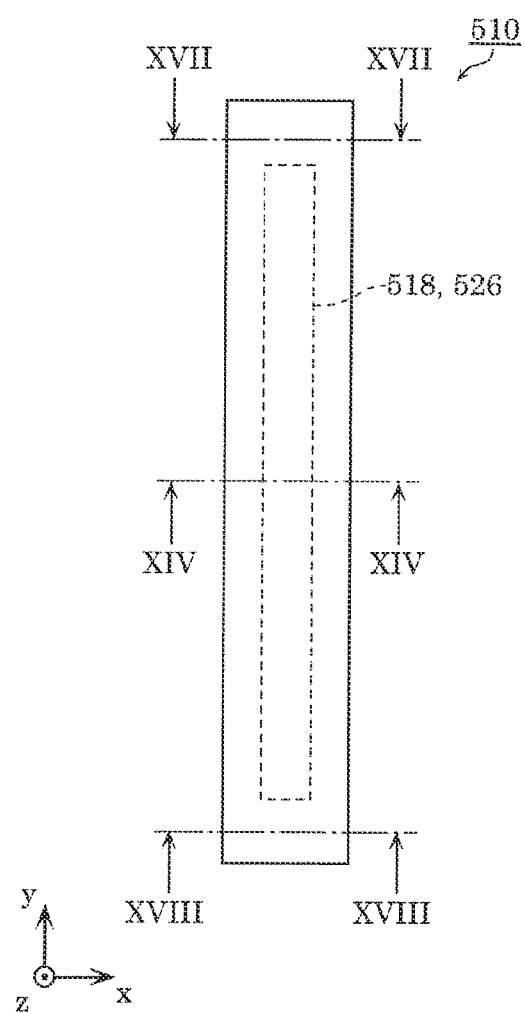
FIG. 16 is a plan view illustrating the layout of the two openings of the nitride semiconductor device according to Embodiment 4.

FIG. 14 is a cross-sectional view of nitride semiconductor device 510 according to the present embodiment. Specifically, FIG. 14 illustrates the cross-section in line XIV-XIV in FIG. 16. FIG. 15 and FIG. 16 are a cross-sectional perspective view and a plan view illustrating the layout of opening 518 and opening 526 of nitride semiconductor device 510 according to the present embodiment, respectively. In FIG. 15, shield layer 516 in which opening 518 is disposed, and current block layer 522 in which opening 526 is disposed are illustrated, and the illustration of the other configurations is omitted. The same applies to FIG. 16.

Figure 17:
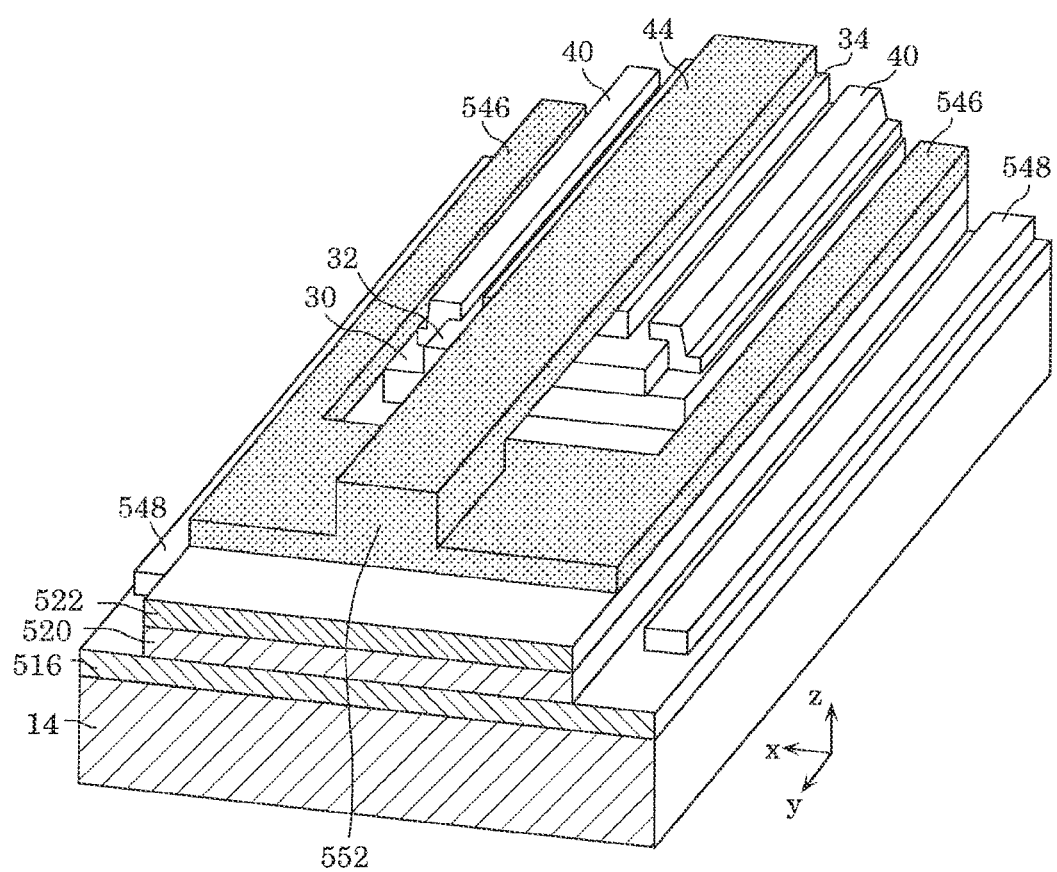
FIG. 17 is a cross-sectional perspective view illustrating a connecting portion between a gate electrode and a current block layer of the nitride semiconductor device according to Embodiment 4.

FIG. 17 is a cross-sectional perspective view illustrating the connecting portion between gate electrode 44 and current block layer 522 of nitride semiconductor device 510 according to the present embodiment. Specifically, FIG. 17 schematically illustrates nitride semiconductor device 510 when seen from an oblique angle in the cross-section cut along line XVII-XVII in FIG. 16. In other words, FIG. 17 illustrates an end of nitride semiconductor device 510, the end being one end in the direction in which each of opening 518 and opening 526 extends.

Figure 18:
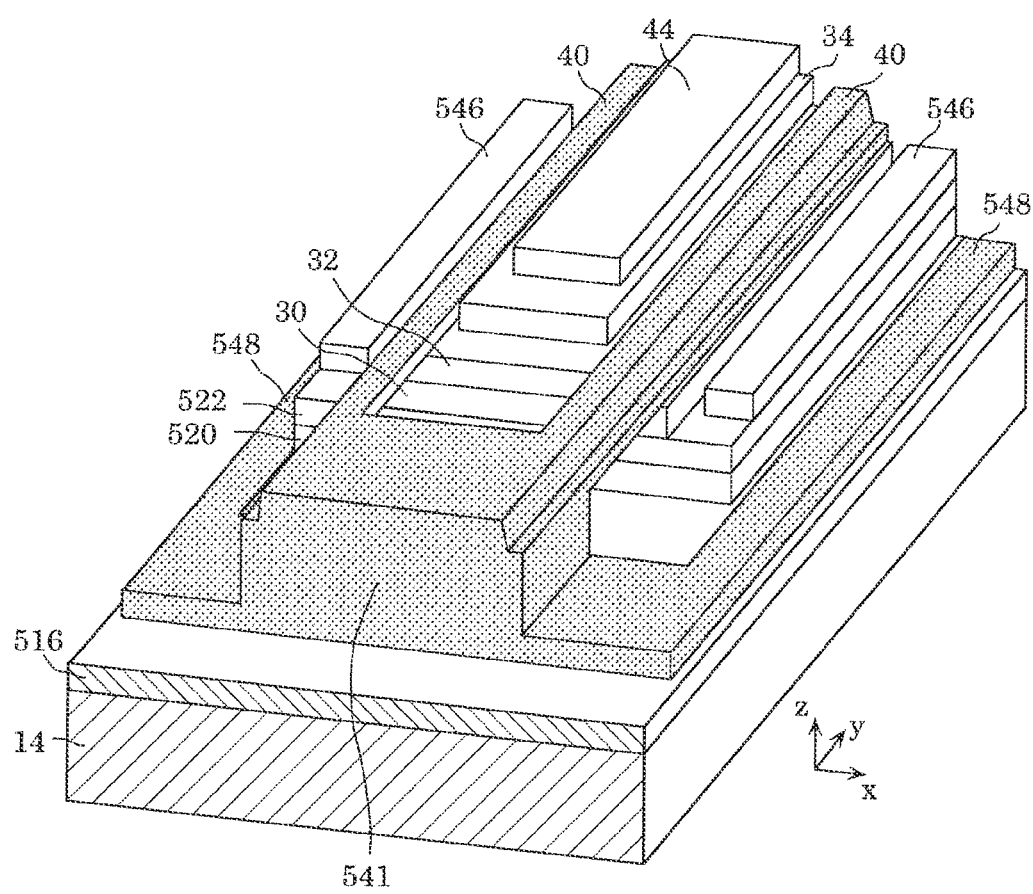
FIG. 18 is a cross-sectional perspective view illustrating a connecting portion between a source electrode and a shield layer of the nitride semiconductor device according to Embodiment 4.

FIG. 18 is a cross-sectional perspective view illustrating the connecting portion between source electrode 40 and shield layer 516 of nitride semiconductor device 510 according to the present embodiment. Specifically, FIG. 18 schematically illustrates nitride semiconductor device 510 when seen from an oblique angle in the cross-section cut along line XVIII-XVIII in FIG. 16. In other words, FIG. 18 illustrates an end of nitride semiconductor device 510, the end being one end opposite to FIG. 17 in the direction in which each of opening 518 and opening 526 extends.

As illustrated in FIG. 14, nitride semiconductor device 510 includes substrate 12, drift layer 14, shield layer 516, opening 518, base layer 520, current block layer 522, opening 526, electron transport layer 30, electron supply layer 32, threshold adjustment layer 34, source openings 36, openings 538, source electrodes 40, gate electrode 44, first fixed-potential electrodes 546, second fixed-potential electrodes 548, and drain electrode 50. Note that, for configurations substantially the same as those in Embodiment 1, such as substrate 12, drift layer 14, electron transport layer 30, electron supply layer 32, threshold adjustment layer 34, source openings 36, source electrodes 40, gate electrode 44, and drain electrode 50, a description thereof will be omitted or simplified.

Nitride semiconductor device 510 according to the present embodiment is a field-effect transistor (FET) utilizing a two-dimensional electron gas generated in the hetero interface of AlGaN/GaN as a channel. Specifically, nitride semiconductor device 510 is a so-called vertical FET. For example, when nitride semiconductor device 510 is in a turn-on state, a current flows from drain electrode 50 to source electrode 40 via substrate 12, drift layer 14, base layer 520, and electron transport layer 30 (the two-dimensional electron gas). The current flows from drift layer 14 to base layer 520 through opening 518, and flows from base layer 520 to electron transport layer 30 through opening 526.

In nitride semiconductor device 510, for example, source electrode 40 is grounded (that is, the potential is 0 V), and a positive potential is given to drain electrode 50. The potential given to drain electrode 50 is, for example, several hundred V, but is not limited to this. Turning on and off of nitride semiconductor device 510 is controlled by the potential applied to gate electrode 44.

When the potential of 0 V or a negative potential is applied to gate electrode 44, the channel in electron transport layer 30 is narrowed, and nitride semiconductor device 510 is in a turn-off state. In other words, in this case, a current does not flow from drain electrode 50 to source electrode 40. When a positive potential (for example, +5 V) is applied to gate electrode 44, nitride semiconductor device 510 is in the turn-on state. In other words, in this case, a current flows from drain electrode 50 to source electrode 40.

Hereinafter, details of each of the components included in nitride semiconductor device 510 will be described In the present embodiment, the effective carrier concentration of drift layer 14 is determined by the rated voltage of the device. For example, when the rated voltage is in the range of 0.6 kV or more to 1.2 kV or less, the effective carrier concentration of drift layer 14 is in the range of $5\times10^{15}$ cm$^{-3}$ or more to $2\times10^{16}$ cm$^{-3}$ or less. As an example, the effective carrier concentration of drift layer 14 is $1\times10^{16}$ cm$^{-3}$.

Shield layer 516 is an example of a fourth nitride semiconductor layer of a second conductivity disposed above drift layer 14. Shield layer 516 is, for example, a film formed from p-type GaN having a thickness of 400 nm, and having an effective carrier concentration of $1\times10^{17}$ cm$^{-3}$. Shield layer 516 is disposed to contact the upper surface of drift layer 14.

Shield layer 516 is fixed to the same potential as the potential (hereinafter described as the source potential) given to source electrode 40. In other words, shield layer 516 is electrically connected to source electrode 40. The specific connection configuration will be described later by using FIG. 18.

In the present embodiment, shield layer 516 includes opening 518, which is an example of a fourth opening from which a part of drift layer 14 is exposed. Opening 518 penetrates shield layer 516, and reaches up to drift layer 14. As illustrated in FIG. 14, bottom surface 518a of opening 518 is the upper surface of drift layer 14. Bottom surface 518a is, for example, parallel to first principal surface 12a of substrate 12, and is located below the interface between drift layer 14 and shield layer 516. In the present embodiment, opening 518 is formed such that further away from substrate 12, the larger the opening area. Specifically, side surfaces 518b of opening 518 are inclined at an angle. For example, the cross-sectional shape of opening 518 is an inverted trapezoid, more specifically, an inverted isosceles trapezoid.

The tilt angle of side surface 518b with respect to bottom surface 518a is, for example, in the range of 20° or more to 80° or less. The tilt angle may be in the range of 30° or more to 45° or less. Since the tilt angle is 45° or less, side surfaces 518b approach the c surface. Thus, the film quality of base layer 520 formed along side surfaces 518b by crystal re-growth can be increased.

Base layer 520 is an example of a fifth nitride semiconductor layer of the first conductivity disposed along the internal surfaces of opening 518 and above shield layer 516. Base layer 520 is, for example, a film formed from n-type GaN having a thickness of 300 nm. Base layer 520 is disposed to contact bottom surface 518a and side surfaces 518b of opening 518, and the upper surface of shield layer 516.

Current block layer 522 is an example of a second nitride semiconductor layer disposed above base layer 520. Current block layer 522 is, for example, a film formed from p-type GaN having a thickness of 400 nm. Current block layer 522 is disposed to contact the upper surface of base layer 520. The effective carrier concentration of current block layer 522 is, for example, the same as the effective carrier concentration of shield layer 516.

Current block layer 522 is fixed to the same potential as the potential (hereinafter described as the gate potential) given to gate electrode 44. In other words, current block layer 522 is electrically connected to gate electrode 44. The specific connection configuration will be described later by using FIG. 17.

In the present embodiment, current block layer 522 includes opening 526 from which a part of base layer 520 is exposed. Opening 526 is an example of a first opening that penetrates current block layer 522. Opening 526 penetrates current block layer 522, and reaches up to base layer 520. Opening 526 is the gate opening that forms the recess structure of gate electrode 44.

In the present embodiment, as illustrated in FIG. 14, bottom surface 526a of opening 526 is the upper surface of base layer 520. Bottom surface 526a is, for example, parallel to first principal surface 12a of substrate 12, and is located below the interface between base layer 520 and current block layer 522.

In the present embodiment, gate opening 526 is formed such that further away from substrate 12, the larger the opening area. Specifically, side surfaces 526b of opening 526 are inclined at an angle. For example, the cross-sectional shape of opening 526 is an inverted trapezoid, more specifically, an inverted isosceles trapezoid.

The tilt angle of side surface 526b with respect to bottom surface 526a is, for example, in the range of 20° or more to 80° or less. The tilt angle may be, for example, in the range of 30° or more to 45° or less. Since the tilt angle is 45° or less, side surfaces 526b approach the c surface. Thus, the film quality of electron transport layer 30 formed along side surfaces 526b by crystal re-growth, etc., can be increased. When the tilt angle is 30° or more, opening 526 is suppressed from becoming too large, and the miniaturization of nitride semiconductor device 510 is realized.

As illustrated in FIG. 15, each of opening 518 and opening 526 are long in one direction. In the present embodiment, each of opening 518 and opening 526 extends along the y axis. When viewed in plan view (that is, when viewed from the positive side of the z axis), opening 518 and opening 526 overlap with each other.

In the present embodiment, as illustrated in FIG. 15, opening width W1 of opening 518 is equal to opening width W2 of opening 526. In other words, in plan view, opening 518 and opening 526 have the same shape and the same size as illustrated in FIG. 16. Specifically, opening width W1 is the distance between the lower ends of shield layer 516, the lower ends being the ends exposed in opening 518. Opening width W2 is the distance between the lower ends of current block layer 522, the ends being the ends exposed in opening 526. Opening widths W1 and W2 are, for example, 5 µm. Note that each of the widths of current block layers 522 located on both sides of opening 526 is 6 µm. Note that these numerical values are merely examples.

In the present embodiment, electron transport layer 30 contacts base layer 520 in bottom surface 526a of opening 526. In other words, electron transport layer 30 does not contact drift layer 14. Electron transport layer 30 contacts the end surfaces of current block layers 522 in side surfaces 526b of opening 526. Further, electron transport layer 30 contacts the upper surfaces of current block layer 522.

Opening 538 is an opening for exposing a part of shield layer 516 at a position distant from opening 526. As illustrated in FIG. 14, in cross-sectional view, openings 538 are disposed on both sides of gate electrode 44, and outside of source electrodes 40 (specifically, on the opposite sides of gate electrode 44 and opening 526). Specifically, opening 538 penetrates electron supply layer 32, electron transport layer 30, current block layer 522, and base layer 520, and reaches up to shield layer 516. As illustrated in FIG. 14, bottom surface 538a of opening 538 is the upper surface of shield layer 516. Bottom surface 538a is located below the interface between base layer 520 and shield layer 516.

In the present embodiment, opening 538 is formed so as to have a substantially uniform opening area irrespective of the distance from substrate 12. Specifically, side surface 538b of opening 538 is substantially perpendicular to bottom surface 538a. For example, the cross-sectional shape of opening 538 is a rectangle. Note that side surface 538b may be inclined at an angle.

First fixed-potential electrode 546 is an electrode for fixing the potential of current block layer 522, and contacts current block layer 522. Specifically, as illustrated in FIG. 14, a part of the upper surface of current block layer 522 is exposed, since electron transport layer 30 and electron supply layer 32 are not disposed. First fixed-potential electrode 546 is disposed to contact the exposed portion of the upper surface of current block layer 522. First fixed-potential electrode 546 is disposed distant from source electrode 40, and does not contact electron transport layer 30. In cross-sectional view, first fixed-potential electrodes 546 are disposed on both sides of gate electrode 44, and outside source electrodes 40.

In the present embodiment, first fixed-potential electrode 546 is electrically connected to gate electrode 44. In other words, first fixed-potential electrode 546 fixes the potential of current block layer 522 to the gate potential. Note that, in FIG. 14, the electric connection between different layers is represented by a thick solid line. The same also applies to FIG. 19, FIG. 21, and FIG. 22, which will be described later.

For example, as illustrated in FIG. 17, in one end of nitride semiconductor device 510, electron transport layer 30, electron supply layer 32, and threshold adjustment layer 34 are removed, and the upper surface of current block layer 522 is exposed. Gate electrode 44 extends in the positive direction of the y axis, and contact plug 552 is disposed at its end. Contact plug 552 is a conductive portion that electrically connects gate electrode 44 to first fixed-potential electrode 546.

Similar to gate electrode 44, first fixed-potential electrodes 546 located on both sides of gate electrode 44 extend in the positive direction of the y axis, and are connected into one at their ends. Contact plug 552 is connected to this connecting portion.

A material that is ohmically connected to a p-type semiconductor can be used for first fixed-potential electrode 546. For example, the same material as gate electrode 44 can be used for first fixed-potential electrode 546. Specifically, first fixed-potential electrode 546 is formed by using a palladium (Pd)- or nickel (Ni)-based material.

Second fixed-potential electrode 548 is an electrode for fixing the potential of shield layer 516, and contacts shield layer 516. Specifically, as illustrated in FIG. 14, second fixed-potential electrode 548 is disposed in opening 538 for exposing shield layer 516. More specifically, second fixed-potential electrode 548 is disposed on and contacts bottom surface 538a of opening 538. Second fixed-potential electrode 548 does not contact base layer 520 and current block layer 522. In cross-sectional view, second fixed-potential electrodes 548 are disposed on both sides of gate electrode 44, and outside source electrodes 40 and the first fixed-potential electrodes 546.

In the present embodiment, second fixed-potential electrode 548 is electrically connected to source electrode 40. In other words, second fixed-potential electrode 548 fixes the potential of shield layer 516 to the source potential.

As illustrated in FIG. 18, in the other end of nitride semiconductor device 510, in addition to electron transport layer 30, electron supply layer 32, and threshold adjustment layer 34, current block layer 522 and base layer 520 are also further removed, and the upper surface of shield layer 516 is exposed. Source electrodes 40 located on both sides of gate electrode 44 extend in the negative direction of the y axis, and are connected into one at their ends. Contact plug 541 is disposed in this connecting portion. Contact plug 541 is a conductive portion that electrically connects source electrode 40 to second fixed-potential electrode 548.

Similar to source electrode 40, second fixed-potential electrodes 548 located on both sides of gate electrode 44 extend in the negative direction of the y axis, and are connected into one at their ends. Contact plug 541 is connected to this connecting portion.

A material that is ohmically connected to a p-type semiconductor can be used for second fixed-potential electrode 548. For example, the same material as gate electrode 44 can be used for second fixed-potential electrode 548. Specifically, second fixed-potential electrode 548 is formed by using a palladium (Pd)- or nickel (Ni)-based material.

Subsequently, a detailed description will be given of specific functions of shield layer 516, base layer 520, and current block layer 522.

In the present embodiment, current block layer 522 is disposed in order to suppress the leakage current that flows between drain electrode 50 and source electrode 40. Since p-type current block layer 522 contacts electron transport layer 30, a depletion layer spreads into electron transport layer 30 from side surfaces 526b of opening 526. When nitride semiconductor device 510 is in the turn-off state, i.e., when 0 V or a negative potential is applied to gate electrode 44, the channel (specifically, the two-dimensional electron gas) formed in electron transport layer 30 is narrowed by the depletion layer. Thus, the current that flows from drain electrode 50 to source electrode 40 via the channel is suppressed. In this manner, by disposing current block layer 522, nitride semiconductor device 510 can obtain good turn-off characteristics.

Here, if current block layer 522 is not fixed to the gate potential, even when nitride semiconductor device 510 is affected by the narrowing of the channel to be in the turn-on state, the current flowing via the channel will be decreased. On the other hand, in the present embodiment, when nitride semiconductor device 510 is in the turn-on state, i.e., when a positive potential is applied to gate electrode 44, current block layer 522 is fixed to the gate potential. Thus, a positive bias is applied between current block layer 522 and electron transport layer 30. Accordingly, since the depletion layer that has spread into electron transport layer 30 shrinks, the narrowing of the channel is eliminated. Therefore, when nitride semiconductor device 510 is in the turn-on state, a high current can be passed between drain electrode 50 and source electrode 40.

On the other hand, by fixing current block layer 522 to the gate potential, the capacity formed between current block layer 522 and drain electrode 50 is added to the gate-drain feedback capacity. The higher the feedback capacity is, the worse the switching response is. In other words, a high-speed operation of nitride semiconductor device 510 becomes difficult.

On the other hand, in the present embodiment, shield layer 516 fixed to the source potential is disposed between current block layer 522 and drain electrode 50. In other words, since shield layer 516 blocks (shields) current block layer 522 opposing to drain electrode 50, the capacity formed between current block layer 522 and drain electrode 50 can be made small.

In the present embodiment, as illustrated in FIG. 15, opening width W1 of opening 518 and opening width W2 of opening 526 are equal to each other. Additionally, as illustrated in FIG. 16, the shapes of opening 518 and opening 526 are equal in plan view. In other words, current block layer 522 is mostly blocked by shield layer 516. Therefore, the capacity formed between current block layer 522 and drain electrode 50 can be made further smaller.

In this manner, in the present embodiment, since the increase in the gate-drain feedback capacity can be suppressed, a high-speed operation of nitride semiconductor device 510 can be realized.

Additionally, since shield layer 516 is fixed to the source potential, the state is achieved where a reverse voltage is applied to the pn junction formed by p-type shield layer 516 and n-type drift layer 14. Therefore, a depletion layer extends into drift layer 14 from the interface between shield layer 516 and drift layer 14. Accordingly, a high breakdown voltage can be achieved in nitride semiconductor device 510.

Additionally in the present embodiment, p-type current block layer 522, n-type base layer 520, and p-type shield layer 516 form a pnp structure. When a reverse bias is applied between the gate and the source, there is a possibility that a punch-through current flows between current block layer 522 (details will be described later) fixed to the gate potential and shield layer 516 fixed to the source potential.

On the other hand, for example, the effective carrier concentration of base layer 520 is higher than the effective carrier concentration of drift layer 14. Specifically, the effective carrier concentration of base layer 520 is $1 \times 10^{17}$ $cm^{-3}$. Accordingly, the punch-through current can be suppressed, even when the thickness of base layer 520 is not increased.

Note that the punch-through current can be also suppressed by increasing the thickness of base layer 520. On the other hand, when the thickness of base layer 520 is too large, the on-resistance is increased. Therefore, when the increase in the on-resistance or the punch-through current is suppressed, the effective carrier concentration of base layer 520 may be equal to the effective carrier concentration of drift layer 14.

Embodiment 5

Subsequently, Embodiment 5 will be described. Hereinafter, a description will be mainly given of differences from Embodiments 1 to 4, and a description of common features will be omitted or simplified.

Figure 19:
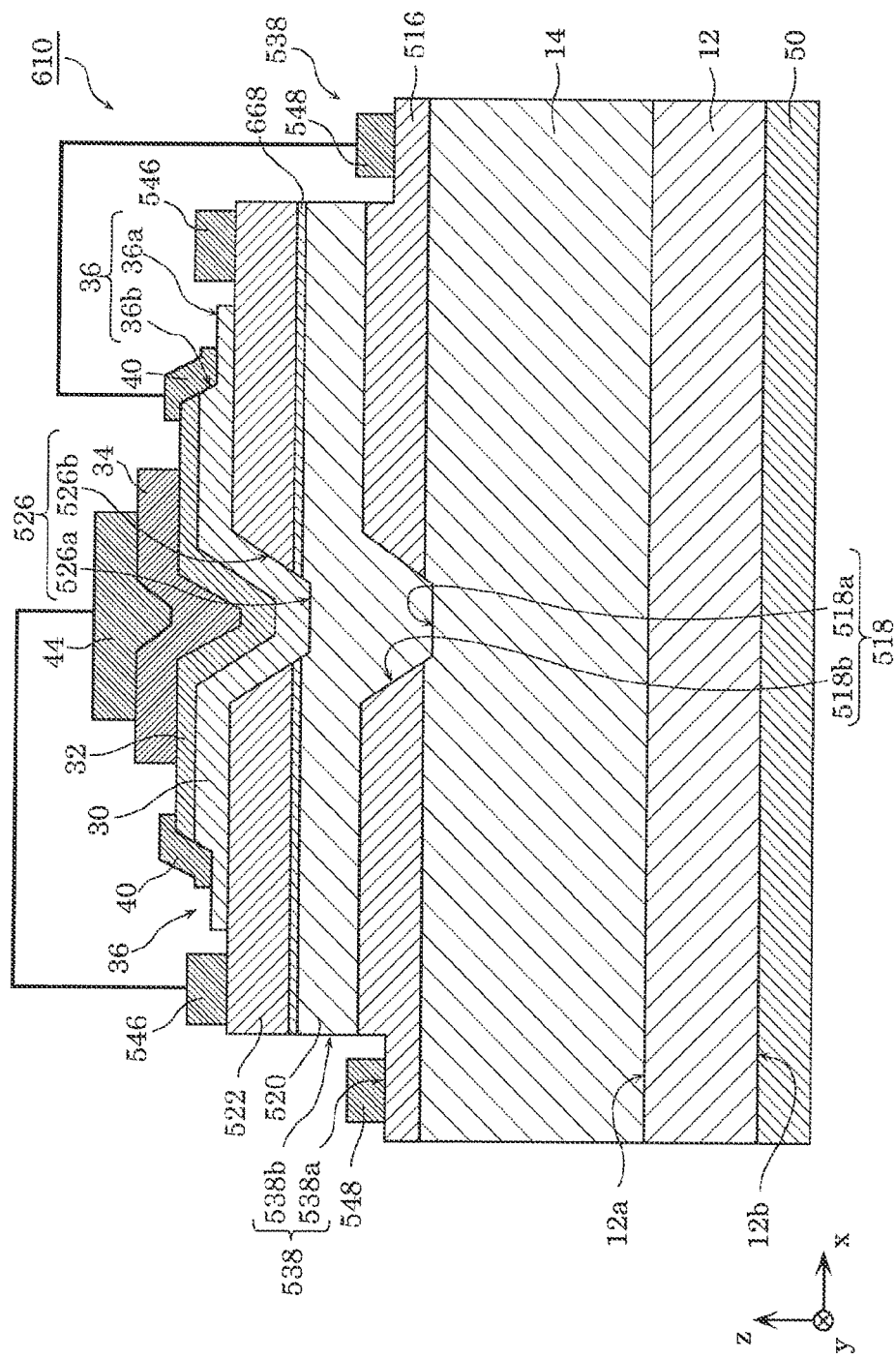
FIG. 19 is a cross-sectional view of a nitride semiconductor device according to Embodiment 5.

FIG. 19 is a cross-sectional view of nitride semiconductor device 610 according to the present embodiment. As illustrated in FIG. 19, nitride semiconductor device 610 is different in that high-resistance layer 668 is included, in addition to the configuration in nitride semiconductor device 510 according to Embodiment 4.

High-resistance layer 668 is an example of a high-resistance layer disposed between base layer 520 and current block layer 522, and having a higher resistance value than base layer 520 and current block layer 522. High-resistance layer 668 is disposed to contact each of base layer 520 and current block layer 522. High-resistance layer 668 is formed from an insulating or semi-insulating nitride semiconductor. High-resistance layer 668 is, for example, a film formed from GaN having a thickness of 200 nm.

For example, high-resistance layer 668 is doped with carbon (C). For example, the carbon concentration of high-resistance layer 668 is, for example, $3 \times 10^{17}$ $cm^{-3}$ or more, but may be $1 \times 10^{18}$ $cm^{-3}$ or more.

Additionally, silicon (Si) or oxygen (O) mixed at the time of deposition may be included in high-resistance layer 668. In this case, the carbon concentration of high-resistance layer 668 is higher than the silicon concentration or the oxygen concentration. The silicon concentration or oxygen concentration of high-resistance layer 668 is, for example, $5 \times 10^{16}$ $cm^{-3}$ or less, but may be $2 \times 10^{16}$ $cm^{-3}$ or less.

Note that high-resistance layer 668 may be formed by ion implantation of magnesium (Mg), iron (Fe), or boron (B), etc., in addition to carbon. Other ionic species may be used as long as the ionic species can realize a high resistance in GaN. By ion implantation, the crystal of a nitride semiconductor in the implanted area can be destroyed, and the resistance of the area can be easily increased.

If high-resistance layer 668 is not disposed, p-type current block layer 522 and base layer 520 form a pn junction. Therefore, when nitride semiconductor device 610 is in a turn-on state, i.e., when a positive potential is applied to gate electrode 44, the state is achieved where a forward bias is applied to current block layer 522 fixed to the gate potential and base layer 520. Therefore, since a current easily flows from current block layer 522 to base layer 520, there is a possibility that the leakage current flows from gate electrode 44 to drain electrode 50 via current block layer 522, base layer 520, drift layer 14, and substrate 12.

According to nitride semiconductor device 610 according to the present embodiment, since high-resistance layer 668 is disposed, the leakage current that flows from p-type current block layer 522 to base layer 520 can be suppressed. Accordingly, the leakage current that flows from gate electrode 44 to drain electrode 50 can be suppressed.

Embodiment 6

Subsequently, Embodiment 6 will be described. Hereinafter, a description will be mainly given of differences from Embodiments 1 to 5, and a description of common features will be omitted or simplified.

Figure 20:
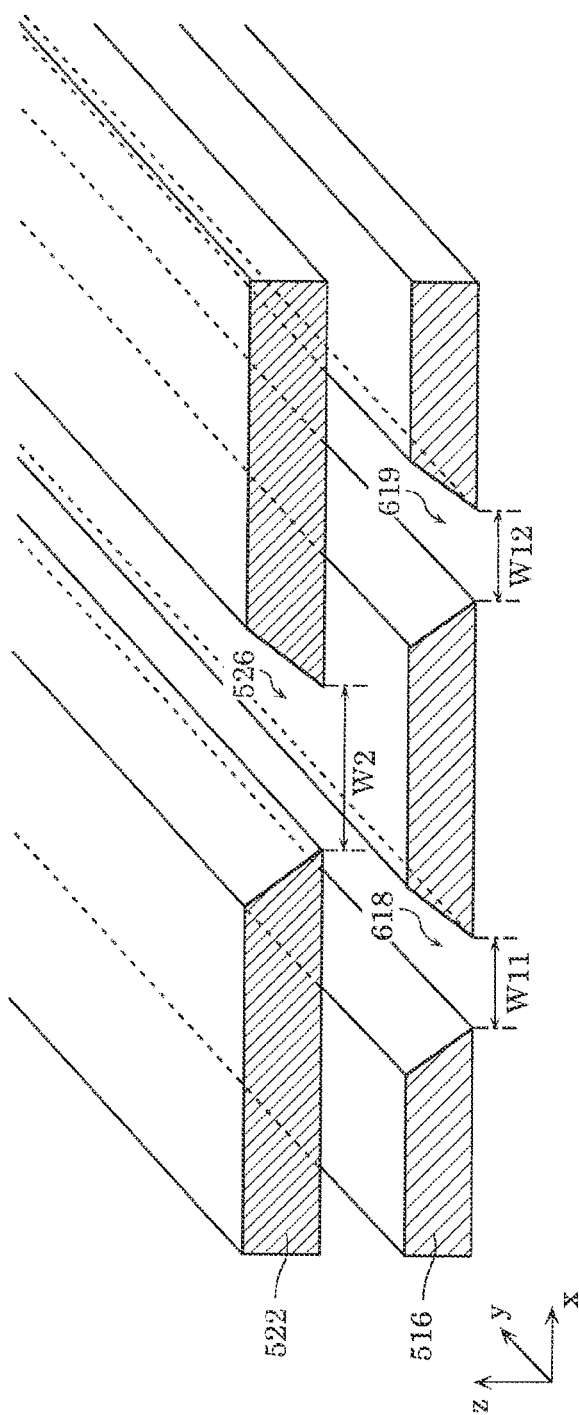
FIG. 20 is a cross-sectional perspective view illustrating a layout of two openings of a nitride semiconductor device according to Embodiment 6.

FIG. 20 is a cross-sectional perspective view illustrating the layout of openings 618 and 619, and opening 526 of a nitride semiconductor device according to the present embodiment. As illustrated in FIG. 20, in the nitride semiconductor device according to the present embodiment, shield layer 516 includes the plurality of openings 618 and 619. In FIG. 20, although two openings 618 and 619 are illustrated, shield layer 516 may include three or more openings.

Opening width W11 of opening 618 and opening width W12 of opening 619 are shorter than opening width W2 of opening 526. Opening width W11 and opening width W12 have, for example, the same length, but may be different. The plurality of openings 618 and 619 have the same shape and the same size as each other, but may have different shapes or different sizes.

Opening width W11 is defined such that a half of its length becomes, for example, shorter than the length of a depletion layer extending into base layer 520 from the side surfaces of opening 618 when a voltage is applied between drain electrode 50 and source electrode 40. In other words, opening width W11 is defined such that opening 618 is sealed by the depletion layer extending from each of both the side surfaces of opening 618. The same applies to opening width W12 of opening 619. Opening widths W11 and W12 are, for example, but not limited to, 2 μm.

Each of openings 618 and 619 is disposed at the position that does not overlap with opening 526 in plan view. In other words, opening 526 and shield layer 516 overlap with each other in plan view. Accordingly, it is possible to mitigate the electric field from being concentrated in the vicinity of opening 526. Therefore, the breakdown voltage between the gate and the drain can be increased.

Additionally, since the plurality of openings 618 and 619 are disposed, the current path between drain electrode 50 and source electrode 40 can be secured. In other words, the increase in the on-resistance of the nitride semiconductor device can be suppressed.

Embodiment 7

Subsequently, Embodiment 7 will be described. Hereinafter, a description will be mainly given of differences from Embodiments 1 to 6, and a description of common features will be omitted or simplified.

Figure 21:
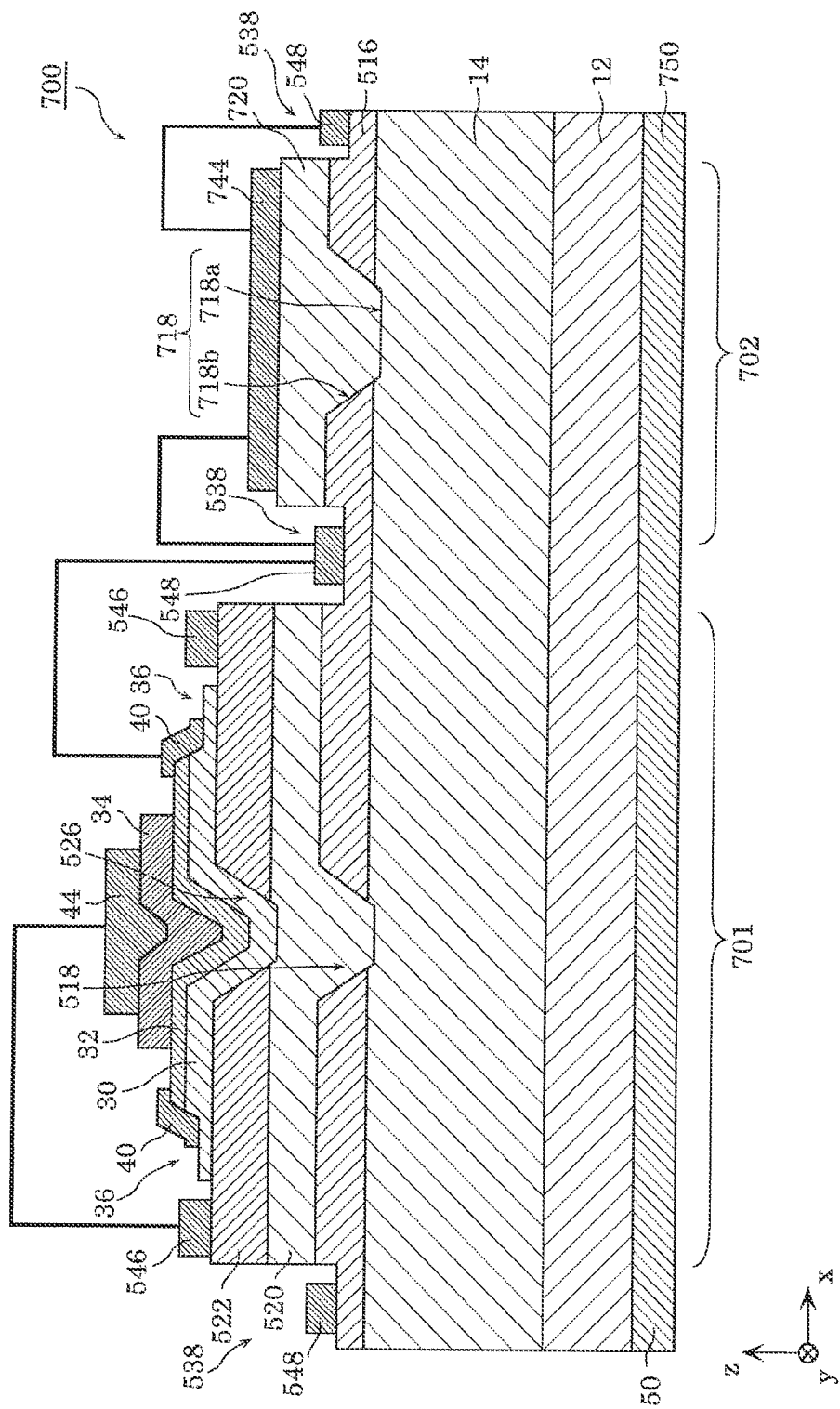
FIG. 21 is a cross-sectional view of a nitride semiconductor device according to Embodiment 7.

FIG. 21 is a cross-sectional view of nitride semiconductor device 700 according to the present embodiment. As illustrated in FIG. 21, nitride semiconductor device 700 is different in that a Schottky barrier diode is included, in addition to the configuration in nitride semiconductor device 510 according to Embodiment 4. Specifically, nitride semiconductor device 700 includes transistor 701 and diode 702. Transistor 701 and diode 702 are aligned and disposed in a plane when substrate 12 is viewed in plan view.

Transistor 701 has the same configuration as nitride semiconductor device 510 according to Embodiment 4. Note that transistor 701 may have the same configuration as nitride semiconductor device 610 according to Embodiment 5. Alternatively, transistor 701 may have the same configuration as the nitride semiconductor device according to Embodiment 6. Transistor 701 is the portion sandwiched by two second fixed-potential electrodes 548.

Diode 702 is a Schottky barrier diode disposed at a position distant from opening 526. Specifically, diode 702 is disposed at the position distant from two second fixed-potential electrodes 548. As illustrated in FIG. 21, anode electrode 744 disposed on base layer 720, and cathode electrode 750, which is a part of drain electrodes 50, are included.

Anode electrode 744 is disposed to contact the upper surface of base layer 720. Anode electrode 744 is formed by using a conductive material such as a metal. Anode electrode 744 is formed by using, for example, the same material as gate electrode 44. Specifically, a material that is Schottky-connected to an n-type semiconductor can be used for anode electrode 744, and for example, a palladium (Pd)- or nickel (Ni)-based material, tungsten silicide (WSi), gold (Au), etc., can be used. By Schottky-connecting anode electrode 744 to base layer 720, the Schottky barrier diode is formed.

Anode electrode 744 is electrically connected to source electrode 40. In other words, diode 702 operates as a reflux diode that is connected between source electrode 40 and drain electrode 50 of transistor 701. Diode 702 can pass a current from anode electrode 744 connected to source electrode 40 to cathode electrode 750 (drain electrode 50), when a reverse bias is applied between the source and the drain of transistor 701.

In the present embodiment, anode electrode 744 is electrically connected to shield layer 516. Specifically, anode electrode 744 is electrically connected to shield layer 516 by being electrically connected to second fixed-potential electrode 548 disposed to contact the upper surface of shield layer 516.

Accordingly, the electric field concentrated on the Schottky-connected portion, i.e., the interface between anode electrode 744 and base layer 720, can be mitigated. Therefore, the breakdown voltage of diode 702 can be increased.

In diode 702, in order to pass a current from anode electrode 744 to cathode electrode 750, shield layer 516 includes opening 718. Opening 718 is an example of a fifth opening that exposes a part of drift layer 14 between anode electrode 744 and cathode electrode 750. Opening 718 penetrates shield layer 516, and reaches up to drift layer 14. As illustrated in FIG. 21, bottom surface 718a of opening 718 is the upper surface of drift layer 14. Bottom surface 718a is, for example, parallel to first principal surface 12a of substrate 12, and is located below the interface between drift layer 14 and shield layer 516. In the present embodiment, opening 718 is formed such that further away from substrate 12, the larger the opening area. Specifically, side surfaces 718b of opening 718 are inclined at an angle. For example, the cross-sectional shape of opening 718 is an inverted trapezoid, more specifically, an inverted isosceles trapezoid. The tilt angle of side surface 718b with respect to bottom surface 718a is, for example, in the range of 20° or more to 80° or less. The tilt angle may be in the range of 30° or more to 45° or less.

Figure 22:
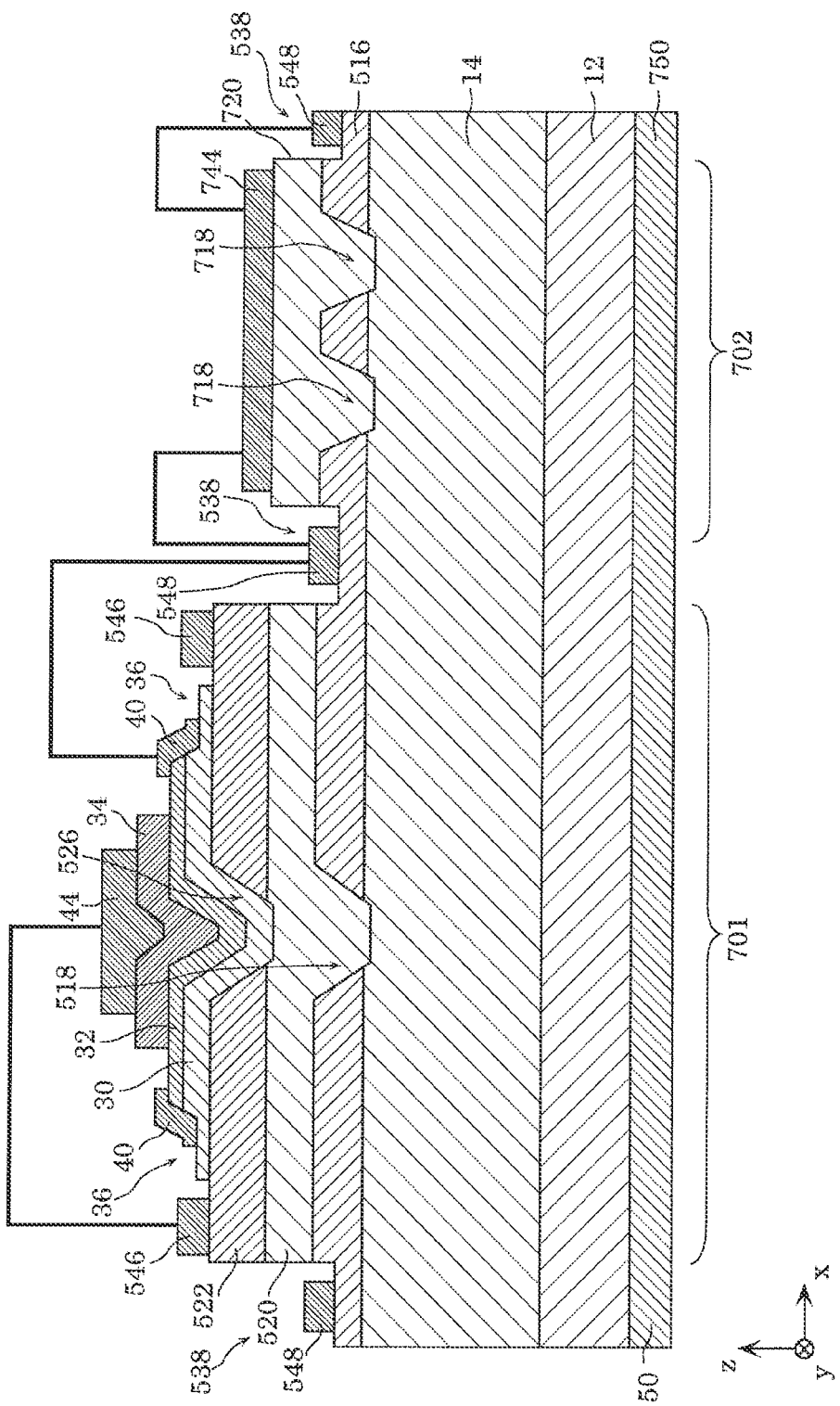
FIG. 22 is a cross-sectional view illustrating another configuration of the nitride semiconductor device according to Embodiment 7.

Note that, as illustrated in FIG. 22, shield layer 516 may include a plurality of openings 718. FIG. 22 is a cross-sectional view illustrating another configuration example of a nitride semiconductor device according to the present embodiment.

Subsequently, by using FIG. 23A to FIG. 23M, a description will be given of the manufacturing method of nitride semiconductor device 700 according to the present embodiment. FIG. 23A to FIG. 23M are cross-sectional views illustrating each process of the manufacturing method of nitride semiconductor device 700 according to the present embodiment.

Hereinafter, a case will be described where each nitride semiconductor layer constituting nitride semiconductor device 700 is deposited by the metal organic chemical vapor deposition (MOCVD) method. The metal organic chemical vapor deposition method is also called the MOVPE (Metal Organic Vapor Phase Epitaxy). Note that the deposition method of the nitride semiconductor layer is not limited to this, and the nitride semiconductor layer may be deposited by, for example, the molecular beam epitaxy (MBE) method.

Additionally, an n-type nitride semiconductor is formed by, for example, adding silicon (Si). A p-type nitride semiconductor is formed by adding magnesium (Mg). Note that an n-type impurity and a p-type impurity are not limited to these.

Figure 23A:
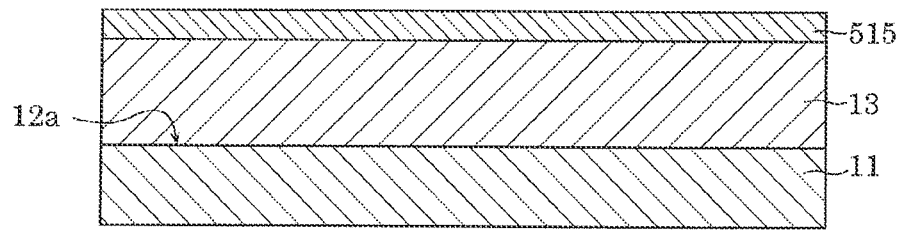
FIG. 23A is a cross-sectional view for describing a first deposition process in a manufacturing method of the nitride semiconductor device according to Embodiment 7.

First, substrate 11 formed from an n-type GaN whose first principal surface 12a is (0001) surface, i.e., the c surface, is prepared. As illustrated in FIG. 23A, n-type GaN film 13 to which Si is added as an n-type impurity and p-type GaN film 515 to which Mg is added as a p-type impurity are deposited on first principal surface 12a of substrate 11 in this order. Note that n-type GaN film 13 and p-type GaN film 515 are patterned into predetermined shapes to be drift layer 14 and shield layer 516, respectively, illustrated in FIG. 21.

Figure 23B:
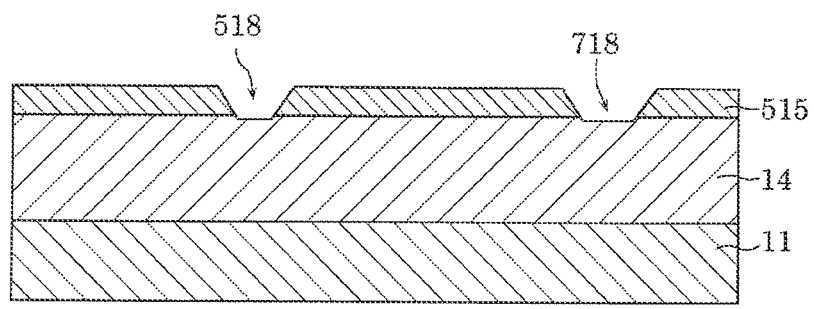
FIG. 23B is a cross-sectional view for describing a formation process of a fourth opening and a first opening in the manufacturing method of the nitride semiconductor device according to Embodiment 7.

Next, as illustrated in FIG. 23B, opening 518 and opening 718 are formed by forming and performing dry etching on a resist mask on p-type GaN film 515. Each of opening 518 and opening 718 penetrates p-type GaN film 515, and exposes a part of n-type GaN film 13. Dry etching is performed by using, for example, a chlorine-based gas. Note that the portion including opening 518 (the left side portion in the figure) corresponds to transistor 701, and the portion including opening 718 (the right side portion in the figure) corresponds to diode 702. Note that removal of the GaN film may be performed by wet etching. The gas used for dry etching and the liquid used for wet etching are not particularly limited. The resist mask is removed after the etching.

Figure 23C:
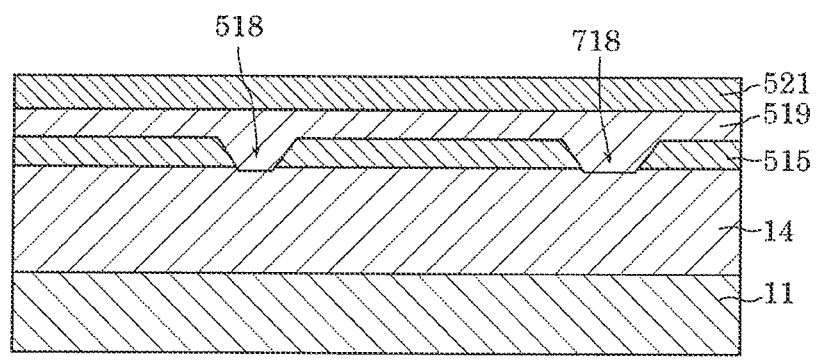
FIG. 23C is a cross-sectional view for describing a second deposition process in the manufacturing method of the nitride semiconductor device according to Embodiment 7.

Next, as illustrated in FIG. 23C, n-type GaN film 519 and p-type GaN film 521 are deposited in this order on the entire surfaces along the shapes of opening 518 and opening 718 by the MOCVD method. Here, although the example is illustrated in which the upper surface of n-type GaN film 519 is flat, the upper surface of n-type GaN film 519 may be concave along the internal surface shapes of opening 518 and opening 718. N-type GaN film 519 and p-type GaN film 521 are patterned into predetermined shapes to be base layers 520 and 720, and current block layer 522 illustrated in FIG. 21, respectively.

Figure 23D:
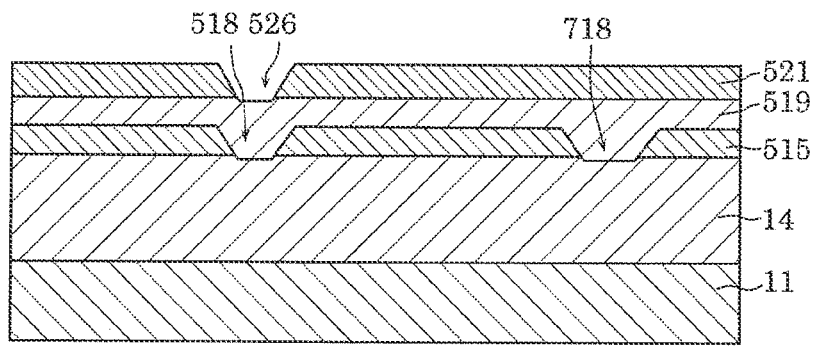
FIG. 23D is a cross-sectional view for describing a formation process of a second opening in the manufacturing method of the nitride semiconductor device according to Embodiment 7.

Next, as illustrated in FIG. 23D, opening 526 is formed by forming and performing etching on a resist mask on p-type GaN film 521. Opening 526 penetrates p-type GaN film 521, and exposes a part of n-type GaN film 519.

Figure 23E:
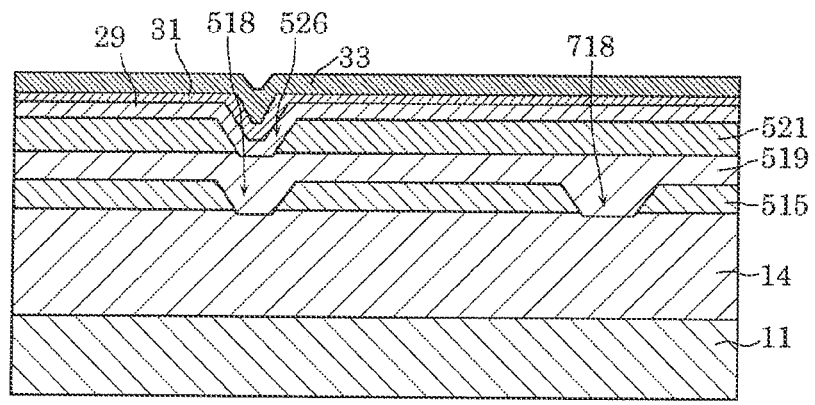
FIG. 23E is a cross-sectional view for describing a third deposition process in the manufacturing method of the nitride semiconductor device according to Embodiment 7.

Next, as illustrated in FIG. 23E, undoped GaN film 29, undoped AlN film (not illustrated), undoped AlGaN film 31, and p-type GaN film 33 are deposited in this order on the entire surfaces along the shape of opening 526 by the MOCVD method. Undoped GaN film 29, undoped AlGaN film 31, and p-type GaN film 33 are patterned into predetermined shapes to be electron transport layer 30, electron supply layer 32, and threshold adjustment layer 34 illustrated in FIG. 21, respectively.

In this manner, in the present embodiment, the crystal growth of the nitride semiconductor (that is, the deposition of the nitride semiconductor films) is performed in three steps. Subsequently, patterning of the deposited nitride semiconductor film is performed. Patterning is performed by formation of a resist mask in a predetermined shape by photolithography, and etching.

Figure 23F:
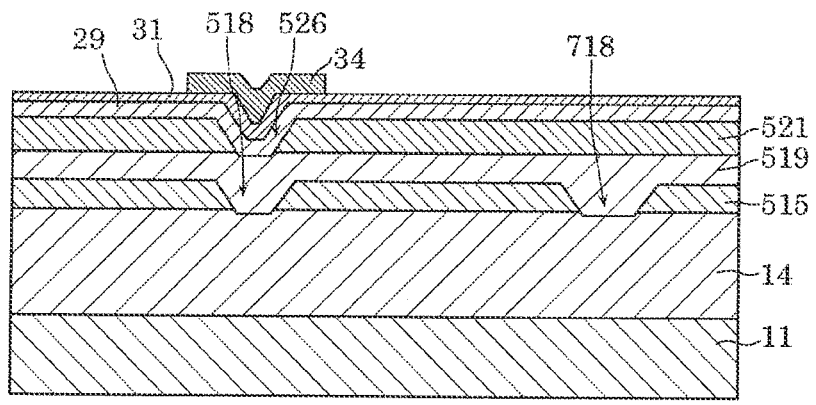
FIG. 23F is a cross-sectional view for describing a formation process of a threshold adjustment layer in the manufacturing method of the nitride semiconductor device according to Embodiment 7.

First, in order for p-type GaN film 33 to remain only in the range including the direction directly above opening 526, the other portion of p-type GaN film 33 is removed by etching. Accordingly, as illustrated in FIG. 23F, threshold adjustment layer 34, which is p-type GaN film 33 that remains, is formed.

Figure 23G:
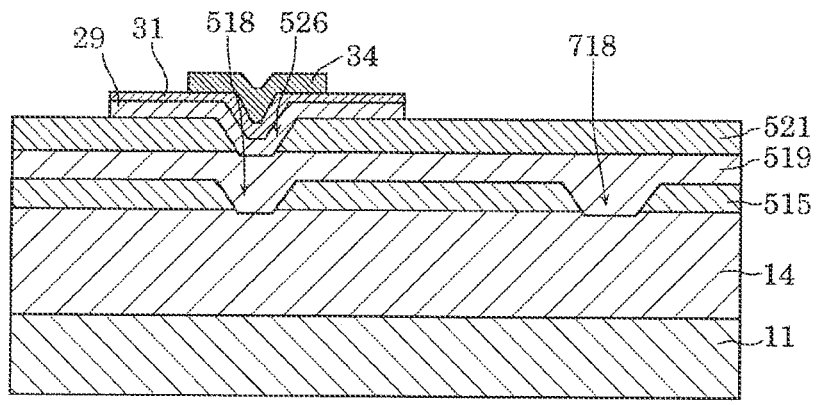
FIG. 23G is a cross-sectional view for describing a removal process of a part of an undoped AlGaN film and an undoped GaN film in the manufacturing method of the nitride semiconductor device according to Embodiment 7.

Next, as illustrated in FIG. 23G, in order for undoped AlGaN film 31 and undoped GaN film 29 to remain only in a predetermined range including threshold adjustment layer 34, the other portion of undoped AlGaN film 31 and undoped GaN film 29 are removed by etching.

Figure 23H:
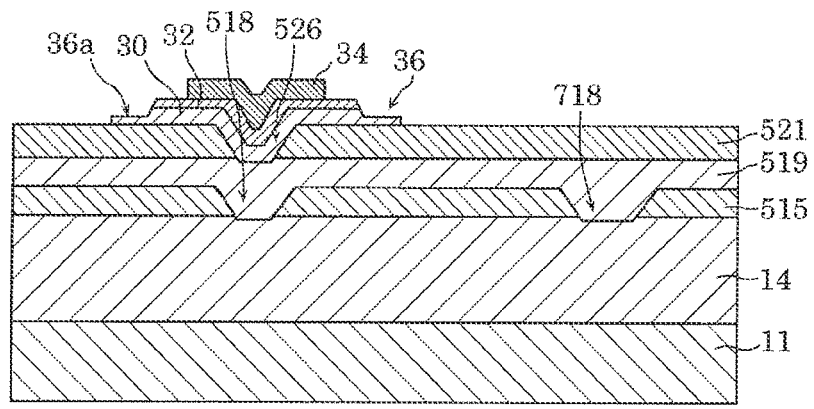
FIG. 23H is a cross-sectional view for describing a formation process of a source opening in the manufacturing method of the nitride semiconductor device according to Embodiment 7.

Next, as illustrated in FIG. 23H, source openings 36 are formed by removing a part of undoped AlGaN film 31 and a part of undoped GaN film 29 by etching. A part of undoped GaN film 29 remains, without being entirely removed in the thickness direction. In other words, bottom surfaces 36a of source openings 36 correspond to the exposed portions of undoped GaN film 29.

Figure 23I:
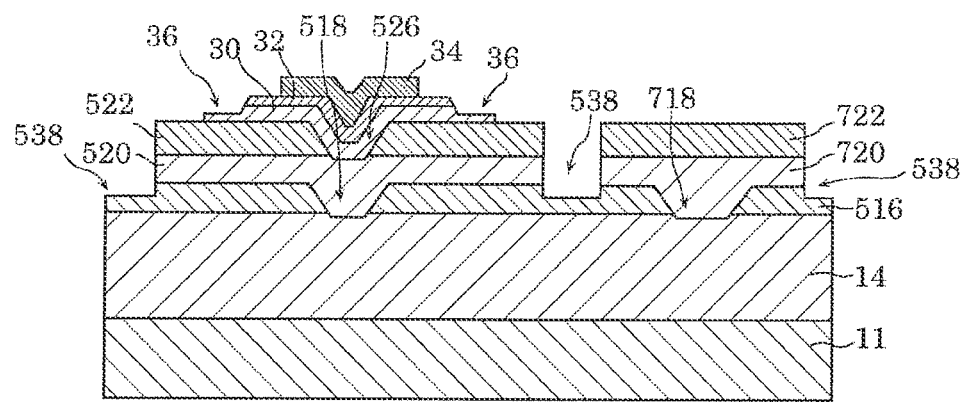
FIG. 23I is a cross-sectional view for describing a formation process of an opening for a fixed-potential electrode in the manufacturing method of the nitride semiconductor device according to Embodiment 7.

Next, as illustrated in FIG. 23I, openings 538 are formed at positions distant from both opening 526 and opening 518. Specifically p-type GaN film 515 is exposed by removing p-type GaN film 521 and n-type GaN film 519 by etching in the portions that are not included in transistor 701 and diode 702. Accordingly, patterned base layers 520 and 720, and current block layers 522 and 722 are formed.

Figure 23J:
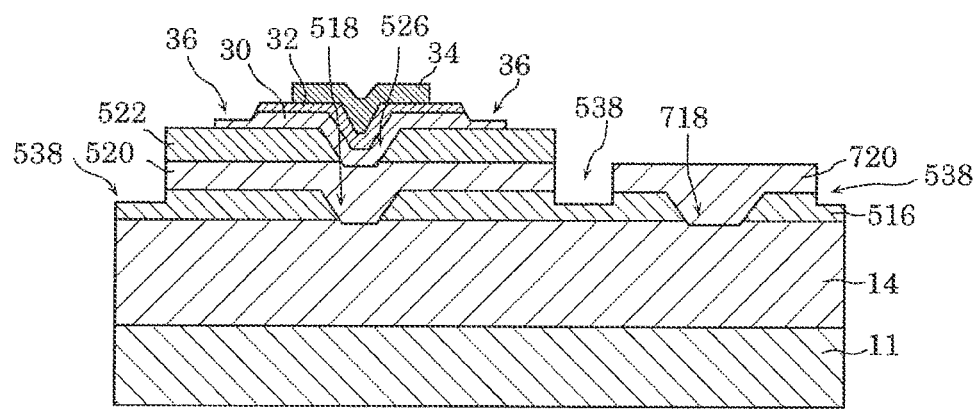
FIG. 23J is a cross-sectional view for describing a removal process of a p-type GaN film of a diode in the manufacturing method of the nitride semiconductor device according to Embodiment 7.
Figure 23:
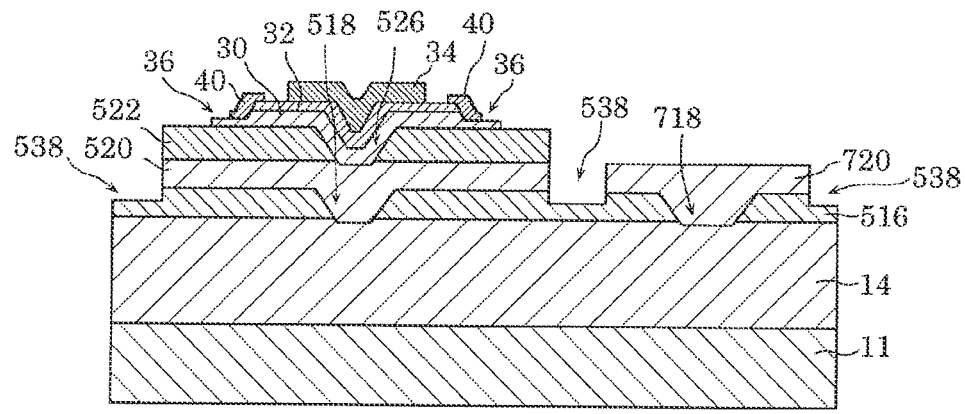
FIG. 23K is a cross-sectional view for describing a formation process of a source electrode in the manufacturing method of the nitride semiconductor device according to Embodiment 7.
FIG. 23L is a cross-sectional view for describing a formation process of a gate electrode, a first fixed-potential electrode, and a second fixed-potential electrode in the manufacturing method of the nitride semiconductor device according to Embodiment 7.
FIG. 23M is a cross-sectional view for describing a thinning process of a substrate in the manufacturing method of the nitride semiconductor device according to Embodiment 7.

Next, as illustrated in FIG. 23J, current block layer 722 is removed by etching. At this time, a part of the upper surface of base layer 720 may be removed. In other words, the upper surface of base layer 720 may be located below the interface between base layer 520 and current block layer 522.

Through each of the processes illustrated in FIG. 23E to FIG. 23J as described above, the patterning of the deposited nitride semiconductor films is performed. Subsequently, formation of each electrode is performed.

First, as illustrated in FIG. 23K, source electrodes 40 are formed. Specifically, after depositing metal materials, such as titanium (Ti) and aluminum (Al), on the entire surface by vapor deposition or sputtering, a resist mask is formed and patterned by etching. The etching of the metal film is, for example, dry etching, but may be wet etching. Additionally, the electrode formation may be performed by a method of adhering the metals only to a specific area (the liftoff process), by performing resist patterning on the surface of the semiconductor layer before depositing the metal materials.

Figure 23L:
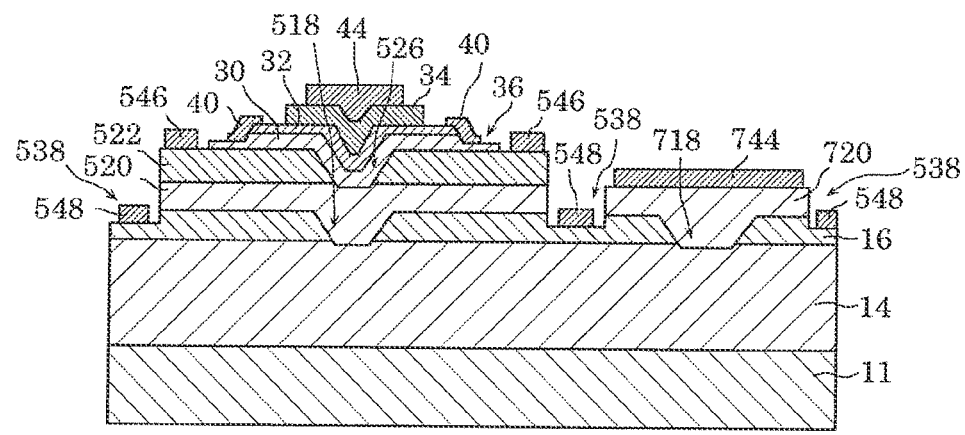

Next, as illustrated in FIG. 23L, gate electrode 44, anode electrode 744, first fixed-potential electrodes 546, and second fixed-potential electrodes 548 are formed. Specifically, after depositing a metal material, such as palladium (Pd), on the entire surface by vapor deposition or sputtering, a resist mask is formed and patterned by etching. Additionally, the liftoff process may be used.

Figure 23M:
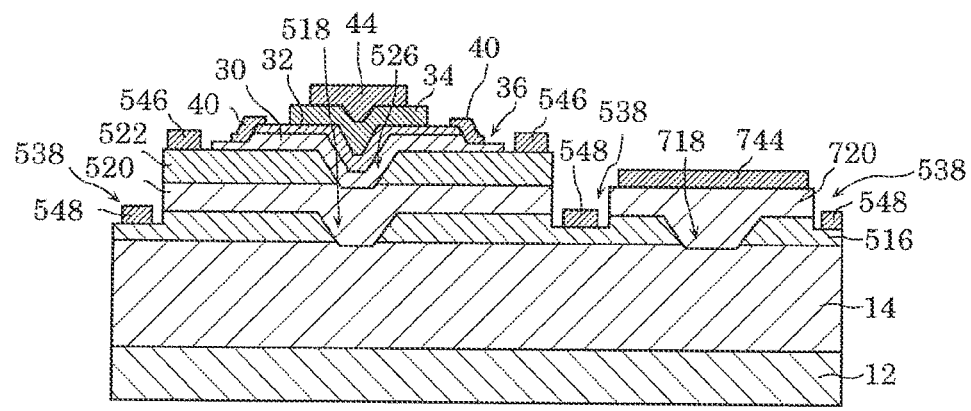

Next, the rear surface of substrate 11 is ground. Accordingly, as illustrated in FIG. 23M, thinned substrate 12 is formed. Since substrate 12 is thinned, the resistance of substrate 12 can be made small.

Further, drain electrode 50 is formed by depositing a drain metal film formed from Ti and Al on second principal surface 12b of substrate 12 by the vapor-deposition method or the spattering method, and patterning the drain metal film as necessary.

Through the above processes, nitride semiconductor device 700 illustrated in FIG. 21 is formed.

The above-described manufacturing method is merely an example, and the order of the processes may be appropriately interchanged. For example, the formation of source electrodes 40 may be performed after the formation of gate electrode 44. Additionally, for example, gate electrode 44, first fixed-potential electrodes 546, second fixed-potential electrodes 548, and anode electrode 744 are formed at the same time, but may be formed in different processes.

Note that nitride semiconductor device 510 according to Embodiment 4 can be formed through the same processes as nitride semiconductor device 700 according to the present embodiment. Specifically, nitride semiconductor device 510 is manufactured by sequentially performing the manufacturing processes of transistor 701 of nitride semiconductor device 700.

Additionally, nitride semiconductor device 610 according to Embodiment 5 can also be formed through the same processes as nitride semiconductor device 700 according to the present embodiment. Specifically, nitride semiconductor device 610 according to Embodiment 5 can be made by forming n-type GaN film 519, the high-resistance GaN film having an increased C concentration (high-resistance layer 668), and p-type GaN film 521 by a series of crystal growth in FIG. 23C. Additionally, high-resistance layer 668 may be formed by achieving a high resistance in an area in the vicinity of the interface between p-type GaN film 521 and n-type GaN film 519 by ion implantation. Further, after depositing n-type GaN film 519, an insulating film having a high resistance value, etc., may be deposited as high-resistance layer 668, and p-type GaN film 521 may be deposited on the deposited insulating film.

Additionally, the nitride semiconductor device according to Embodiment 6 can also be formed through the same processes as nitride semiconductor device 700 according to the present embodiment. Specifically, in FIG. 23B, the plurality of openings 618 and 619 can be formed by changing the mask pattern at the time of forming opening 518.

Additionally, in the present embodiment, although the example is illustrated in which diode 702 is connected in parallel with transistor 701, and functions as the reflux diode, but is not limited to this. Anode electrode 744 of diode 702 may not be connected to source electrodes 40. In addition, cathode electrode 750 may be physically separated and electrically insulated from drain electrode 50 in transistor 701. Accordingly, diode 702 may realize other functions.

Other Embodiments

In the above, although the nitride semiconductor device according to one or more aspects have been described based on the embodiments, the present disclosure is not limited to these embodiments. Unless deviated from the spirit of the present disclosure, matters obtained by applying various modifications conceivable by those skilled in the art to the present embodiments, and modes constructed by combining components in different embodiments are also included within the scope of the present disclosure.

For example, nitride semiconductor device 10 may not include opening 38 and fixed-potential electrodes 46. For example, block layer 22 may be fixed to the same potential as gate electrode 44, by electrically connecting the end surface of block layer 22 to gate electrode 44.

Additionally, for example, nitride semiconductor device 10 may not include threshold adjustment layer 34. Nitride semiconductor device 10 may be realized as an FET for normally-on operation.

Additionally, for example, the thickness of electron transport layer 30 may be equal irrespective of parts. For example, the thickness of bottom portion 30*a*, the thickness of sloped portion 30*b*, and the thickness of flat portion 30*c* may be equal to each other. In addition, length A and length B illustrated in FIG. 3 may be equal.

Additionally, for example, bottom surface 36*a* of source opening 36 may be the upper surface of high-resistance layer 24. Specifically, high-resistance layer 24 may be formed by removing electron supply layer 32, electron transport layer 30, and the surface portion of high-resistance layer 24.

Additionally, for example, nitride semiconductor device 10 may not include source opening 36. In this case, source electrodes 40 are disposed to contact the upper surface of electron supply layer 32. Source electrodes 40 may be connected to electron transport layer 30 via electron supply layer 32.

For example, in Embodiment 3, high-resistance layer 228 is formed by iron ion implantation to p-type GaN film 221 corresponding to first base layer 222, and undoped GaN film 223 corresponding to second base layer 224, but is not limited to this. For example, high-resistance layer 228 may be formed by performing the iron ion implantation after the deposition of p-type GaN film 221. In this case, high-resistance layer 228 is not formed in second base layer 224, and the upper surface of high-resistance layer 228 is flush with the upper surface of first base layer 222. Alternatively, high-resistance layer 228 may be formed by removing a predetermined area of p-type GaN film 221 by etching, and filling an insulating material in the removed area.

Additionally, for example, in each of the above-described embodiments, the examples are shown in which the first conductivity is the n-type, and the second conductivity is the p-type, but are not limit to this. The first conductivity may be the p-type, and the second conductivity may be the n-type.

For example, the direction in which opening 518 extends may not coincide with the direction in which opening 526 extends. For example, the direction in which opening 518 extends and the direction in which opening 526 extends may be diagonally intersected, or may be orthogonal to each other.

Additionally, for example, high-resistance layer 668 may not be a film formed from a nitride semiconductor. For example, high-resistance layer 668 may be a film formed by using an insulating material, such as a silicon oxide film.

Additionally, in each of the above-described embodiments, various changes, replacement, addition, omission, etc., can be made within the scope of the claims or their equivalents.

INDUSTRIAL APPLICABILITY

The present disclosure can be utilized for a nitride semiconductor device capable of achieving a high breakdown voltage and a high current operation, and can be utilized for a power transistor used in a power supply circuit of a consumer equipment, such as a television.

The invention claimed is:

1. A nitride semiconductor device, comprising:
   a substrate;
   a first nitride semiconductor layer of a first conductivity disposed above the substrate;
   a second nitride semiconductor layer of a second conductivity different from the first conductivity, disposed above the first nitride semiconductor layer;
   a first opening penetrating through the second nitride semiconductor layer;
   an electron transport layer and an electron supply layer disposed along inner surfaces of the first opening, the electron transport layer and electron supply layer being arranged in sequence from a substrate side such that the electron transport layer is closer to the substrate side and electron supply layer is further away from the substrate side;
   a gate electrode disposed above the electron supply layer to cover the first opening;
   a source electrode connected to the electron supply layer and the electron transport layer, at a position separated from the gate electrode; and a drain electrode disposed on a surface of the substrate which is opposite to a surface on which the first nitride semiconductor layer is disposed, wherein at least part of the second nitride semiconductor layer is fixed to a first potential that is different from a second potential applied to the source electrode.

2. The nitride semiconductor device according to claim 1, wherein at least part of the second nitride semiconductor layer is fixed to the first potential and a same potential is applied to the gate electrode.

3. The nitride semiconductor device according to claim 2, further comprising:
a first high-resistance layer disposed above the second nitride semiconductor layer;
a second opening penetrating through the electron supply layer, the electron transport layer, and the first high-resistance layer, and extending to the second nitride semiconductor layer; and
a fixed-potential electrode provided in a bottom surface of the second opening and contacting the second nitride semiconductor layer,
wherein the first opening penetrates through the first high-resistance layer and the second nitride semiconductor layer, and
the fixed-potential electrode is electrically connected to the gate electrode.

4. The nitride semiconductor device according to claim 3, further comprising:
a third opening penetrating through the electron supply layer and reaching up extending to the electron transport layer,
wherein the source electrode is provided along part of inner surfaces of the third opening, and
in a plan view of the substrate, the second opening is disposed at a position separated from the source electrode, inside the third opening.

5. The nitride semiconductor device according to claim 2, further comprising:
a third nitride semiconductor layer of the second conductivity disposed between the gate electrode and the electron supply layer.

6. The nitride semiconductor device according to claim 2, further comprising:
a second high-resistance layer disposed between the first nitride semiconductor layer and the second nitride semiconductor layer.

7. The nitride semiconductor device according to claim 2, wherein the electron transport layer includes:
a flat portion disposed on a top surface of the first high-resistance layer; and
a sloped portion disposed along a side surface of the first opening,
wherein the sloped portion has a length in a direction parallel to the substrate longer than a thickness of the flat portion in a normal direction to the substrate.

8. The nitride semiconductor device according to claim 1, further comprising:
a second opening at a position separated from the first opening, penetrating through the electron supply layer and the electron transport layer, and extending to the second nitride semiconductor layer; and
a high-resistance layer separating the second nitride semiconductor layer into a first portion near the first opening and a second portion near the second opening,
wherein the source electrode is disposed in the second opening, the second portion is fixed to a potential that is the same as the second potential applied to the source electrode, and the first portion is fixed to the potential that is different from the second potential applied to the source electrode.

9. The nitride semiconductor device according to claim 8, wherein the high-resistance layer is a nitride semiconductor layer containing iron.

10. The nitride semiconductor device according to claim 8,
wherein the first portion is fixed to a potential that is the same potential applied to the gate electrode.

11. The nitride semiconductor device according to claim 8, further comprising:
a third nitride semiconductor layer of the second conductivity disposed between the gate electrode and the electron supply layer.

12. The nitride semiconductor device according to claim 8, further comprising:
a third opening provided in a bottom surface of the second opening, penetrating through the second nitride semiconductor layer, and extending to the first nitride semiconductor layer,
wherein the source electrode is further disposed in the third opening and is connected to the first nitride semiconductor layer.

13. The nitride semiconductor device according to claim 12,
wherein the third opening comprises a plurality of third openings provided in the bottom surface of the second opening.

14. The nitride semiconductor device according to claim 1, comprising:
a fourth nitride semiconductor layer of the second conductivity disposed between the first nitride semiconductor layer and the second nitride semiconductor layer and including a fourth opening exposing at least part of the first nitride semiconductor layer; and
a fifth nitride semiconductor layer of the first conductivity disposed between the fourth nitride semiconductor layer and the second nitride semiconductor layer and along inner surfaces of the fourth opening,
wherein the first opening exposes a part of the fifth nitride semiconductor layer,
the fourth nitride semiconductor layer is fixed to a potential that is the same as the second potential applied to the source electrode, and
the second nitride semiconductor layer is fixed to the first potential which is the same potential applied to the gate electrode.

15. The nitride semiconductor device according to claim 14, further comprising:
a high-resistance layer disposed between the fifth nitride semiconductor layer and the second nitride semiconductor layer and having a resistance higher than a resistance of one of the fifth nitride semiconductor layer and the second nitride semiconductor layer.

16. The nitride semiconductor device according to claim 14,
wherein the fifth nitride semiconductor layer has an effective carrier concentration higher than an effective carrier concentration of the first nitride semiconductor layer.

17. The nitride semiconductor device according to claim 14,
wherein the fourth opening has an opening width shorter than an opening width of the first opening.

18. The nitride semiconductor device according to claim 17,
wherein the fourth opening includes a plurality of fourth openings in the fourth nitride semiconductor layer.

19. The nitride semiconductor device according to claim 14, further comprising:
a Schottky barrier diode disposed at a position separated from the first opening in a plan view,
wherein the Schottky barrier diode includes an anode electrode disposed on the fifth nitride semiconductor layer,
the Schottky barrier diode includes a cathode electrode that is a part of the drain electrode, and
the fourth nitride semiconductor layer further includes, between the anode electrode and the cathode electrode, a fifth opening exposing part of the first nitride semiconductor layer.

20. The nitride semiconductor device according to claim 19,
wherein the anode electrode is electrically connected to the fourth nitride semiconductor layer.

21. The nitride semiconductor device according to claim 19,
wherein the fifth opening includes a plurality of fifth openings in the fourth nitride semiconductor layer.

\* \* \* \* \*